United States Patent
Sharangpani et al.

(10) Patent No.: US 11,527,500 B2
(45) Date of Patent: Dec. 13, 2022

(54) SEMICONDUCTOR STRUCTURE CONTAINING MULTILAYER BONDING PADS AND METHODS OF FORMING THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Fei Zhou, San Jose, CA (US); Adarsh Rajashekhar, Santa Clara, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 21 days.

(21) Appl. No.: 17/118,036

(22) Filed: Dec. 10, 2020

(65) Prior Publication Data

US 2021/0296269 A1 Sep. 23, 2021

Related U.S. Application Data

(63) Continuation of application No. 16/825,304, filed on Mar. 20, 2020, now Pat. No. 11,201,139.

(51) Int. Cl.
*H01L 23/00* (2006.01)
*H01L 23/495* (2006.01)

(52) U.S. Cl.
CPC ........ *H01L 24/06* (2013.01); *H01L 23/49503* (2013.01); *H01L 24/03* (2013.01)

(58) Field of Classification Search
CPC .... H01L 23/49503; H01L 24/03; H01L 24/06
See application file for complete search history.

(56) References Cited

U.S. PATENT DOCUMENTS 5,915,167 A  6/1999 Leedy
10,115,681 B1  10/2018 Ariyoshi
(Continued)

FOREIGN PATENT DOCUMENTS

KR  10-20150005199 A  1/2015
WO  WO 2020/159604 A1  8/2020

OTHER PUBLICATIONS

Chiu, C.H. et al., "Copper silicide/silicon nanowire heterostructures: in situ TEM observation of growth behaviors and alectron transport properties," Nanoscale, vol. 5, No. 11, pp. 5086-5092 (2013) DOI: 10.1039/c3nr33302g.
(Continued)

*Primary Examiner* — Jasmine J Clark
(74) *Attorney, Agent, or Firm* — The Marbury Law Group PLLC

(57) ABSTRACT

A bonded assembly includes a first semiconductor die that includes first semiconductor devices, and a first pad-level dielectric layer and embedding first bonding pads; and a second semiconductor die that includes second semiconductor devices, and a second pad-level dielectric layer embedding second bonding pads that includes a respective second pad base portion. Each of the first bonding pads includes a respective first pad base portion and a respective first metal alloy material portion having a higher coefficient of thermal expansion (CTE) than the respective first pad base portion. Each of the second bonding pads is bonded to a respective one of the first bonding pads.

20 Claims, 68 Drawing Sheets

(56) References Cited

U.S. PATENT DOCUMENTS

| | | | |
|---|---|---|---|
| 10,283,493 B1 | 5/2019 | Nishida | |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 10,446,515 B2 | 10/2019 | Tsai et al. | |
| 10,510,738 B2 | 12/2019 | Kim et al. | |
| 10,573,627 B2 | 2/2020 | Fong et al. | |
| 10,665,581 B1 * | 5/2020 | Zhou | H01L 24/11 |
| 10,714,497 B1 * | 7/2020 | Nishida | H01L 23/5226 |
| 2008/0258309 A1 | 10/2008 | Chiou et al. | |
| 2013/0249085 A1 | 9/2013 | Ide | |
| 2016/0172296 A1 | 6/2016 | Lim et al. | |
| 2017/0011996 A1 | 1/2017 | Lee et al. | |
| 2019/0221557 A1 | 7/2019 | Kim et al. | |
| 2019/0252361 A1 | 8/2019 | Nishida | |
| 2021/0012840 A1 | 1/2021 | Shim et al. | |
| 2021/0028136 A1 | 1/2021 | Said et al. | |

OTHER PUBLICATIONS

Gannavaram, S. et al., "Low temperature (800/spl deg/C) recessed junction selective silicon-germanium source/drain technology for sub-70 nm CMOS," International Electron Devices Meeting 2000. Technical Digest. IEDM (Cat. No. 00CH37138), San Francisco, CA, USA, 2000, pp. 437-440, doi: 10.1109/IEDM.2000.904350.

Hidnert, P. et al., "Thermal Expansion of Some copper Alloys," U.S. Department of Commerce, National Bureau of Standards, Research Paper RP1838, vol. 39, pp. 1-6, (1947).

Istratov, A. A. et al., "Electrical and Recombination Properties of Copper-Silicide Precipitates in Silicon," Journal of The Electrochemical Society, vol. 145, No. 11, pp. 3889-3898, (1998) https://iopscience.iop.org/article/10.1149/1.1838889/pdf.

Shimoda, T. et al., "Solution-processed silicon films and transistors," Nature, vol. 440, No. 7085, pp. 783-786, (2006) DOI:10.1038/nature04613.

USPTO Office Communication, Notice of Allowance and Fee(s) Due for U.S. Appl. No. 16/825,397, dated Apr. 8, 2021, 1641 pages.

Derakhshandeh, J. et al., "Die to wafer 3D stacking for below 10um pitch microbumps," 2016 IEEE International 3D Systems Integration Conference (3DIC), San Francisco, CA, 2016, pp. 1-4, doi: 10.1109/3DIC.2016.7969993.

Derakhshandeh, J. et al., "10 and 7 μm Pitch Thermo-compression Solder Joint, Using a Novel Solder Pillar And Metal Spacer Process," 2020 IEEE 70th Electronic Components and Technology Conference (ECTC), Orlando, FL, USA, 2020, pp. 617-622, doi: 10.1109/ECTC32862.2020.00102.

Marques, V. MF, et al. "Nanomechanical Characterization of Sn—Ag—Cu/Cu Joints—Part 1: Young's Modulus, Hardness and Deformation Mechanisms as a Function of Temperature." Acta Materialia, vol. 61, No. 7, Acta Materialia, 2013, pp. 2460-2470.

U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/288,656, filed Feb. 28, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/722,745, filed Dec. 20, 2019, SanDisk Technologies LLC.
U.S. Appl. No. 16/722,824, filed Dec. 20, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.
U.S. Appl. No. 16/774,446, filed Jan. 28, 2020, SanDisk Technologies LLC.
U.S. Appl. No. 16/806,087, filed Mar. 2, 2020, SanDisk Technologies LLC.
U.S. Appl. No. 16/825,304, filed Mar. 20, 2020, SanDisk Technologies LLC.
U.S. Appl. No. 16/825,397, filed Mar. 20, 2020, SanDisk Technologies LLC.
U.S. Appl. No. 16/886,164, filed May 28, 2020, SanDisk Technologies LLC.
U.S. Appl. No. 16/886,221, filed May 28, 2020, SanDisk Technologies LLC.
U.S. Appl. No. 17/106,884, filed Nov. 30, 2020, SanDisk Technologies LLC.
USPTO Office Communication, Non-Final Office Action for U.S. Appl. No. 16/825,304, dated Apr. 21, 2021, 19 pages.

(56) References Cited

OTHER PUBLICATIONS

Notification of Transmittal of the International Search Report and Written Opinion of the International Search Authority for International Patent Application No. PCT/US2020/036948, dated Dec. 15, 2020, 11 pages.

* cited by examiner

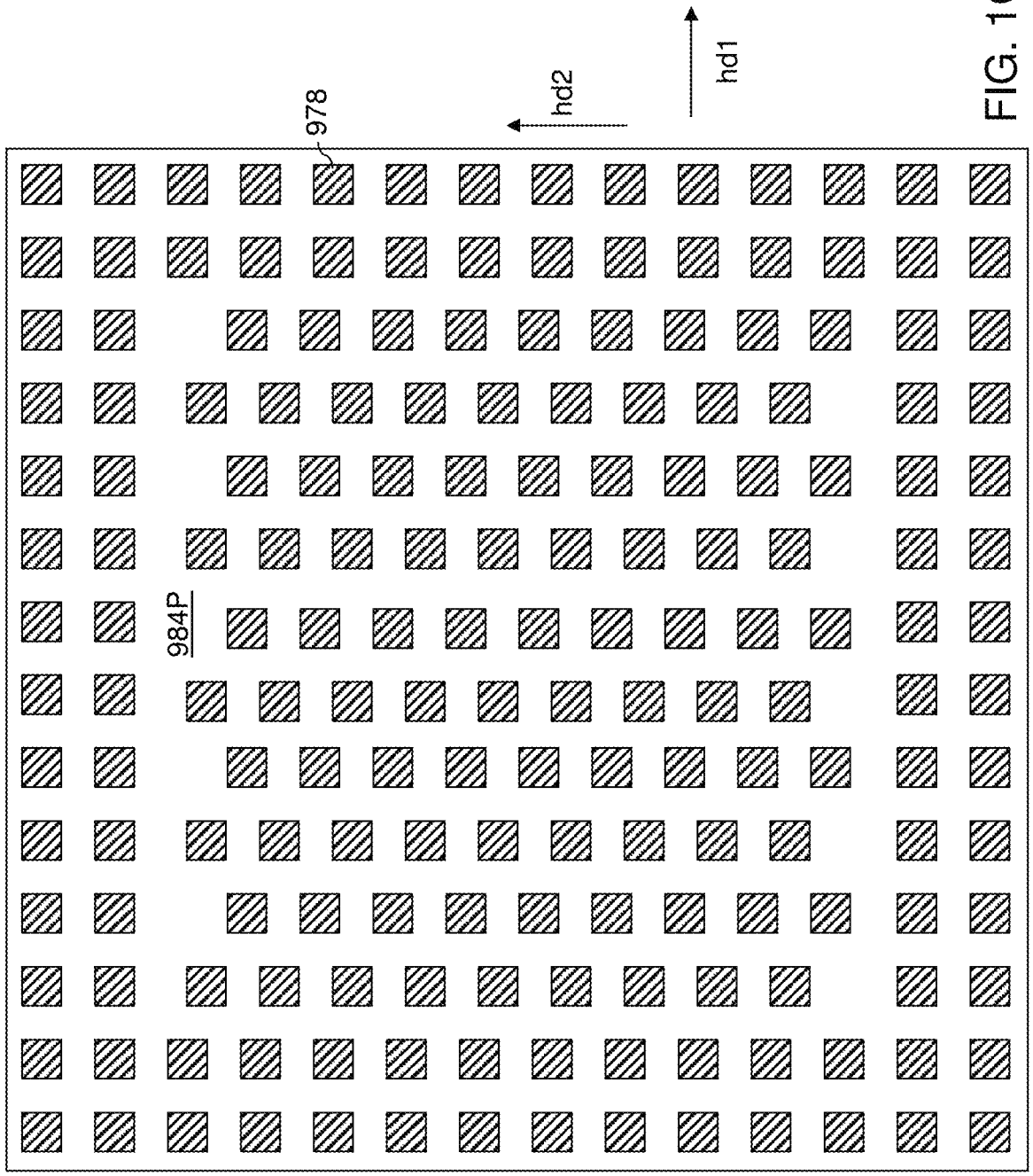

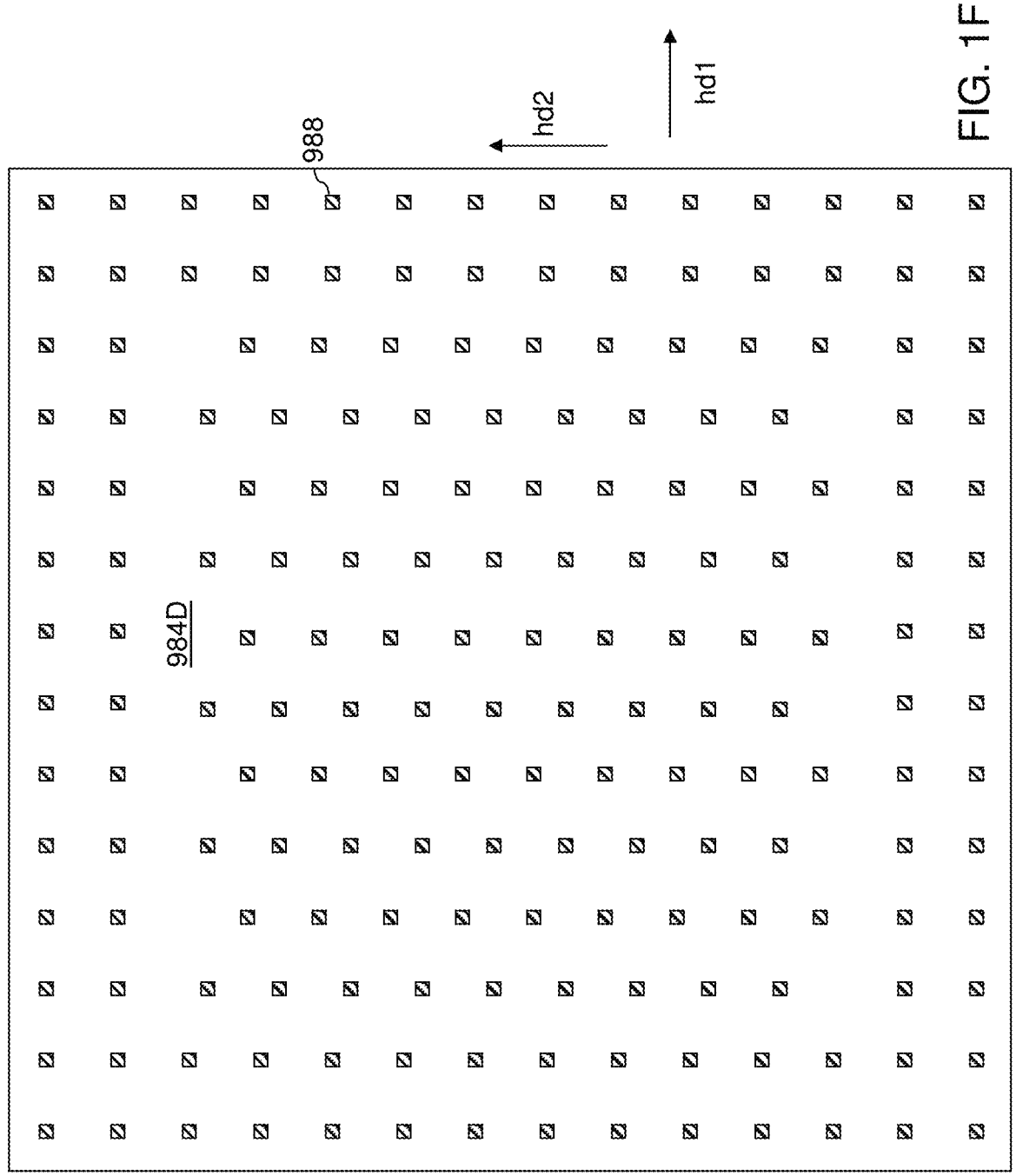

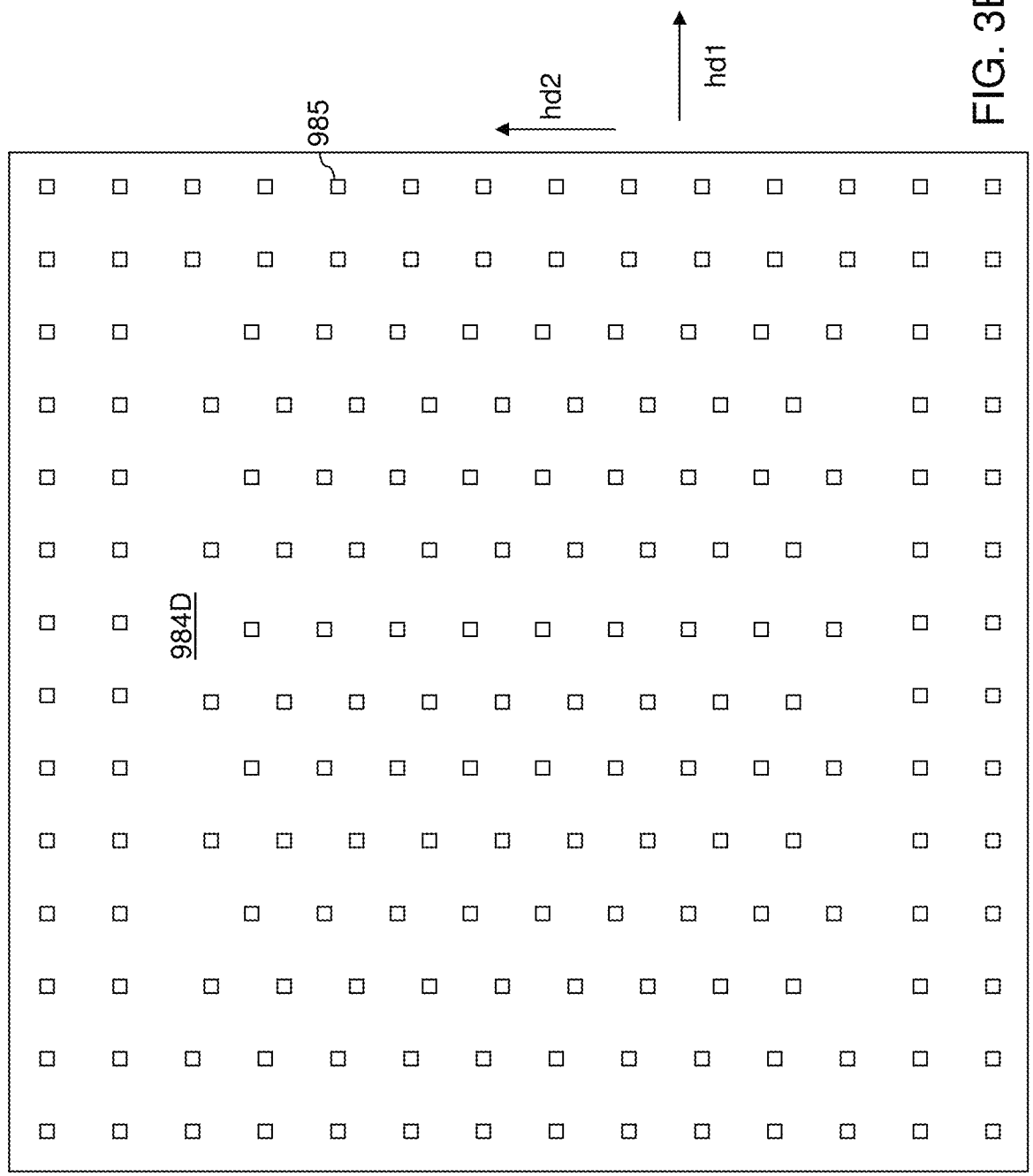

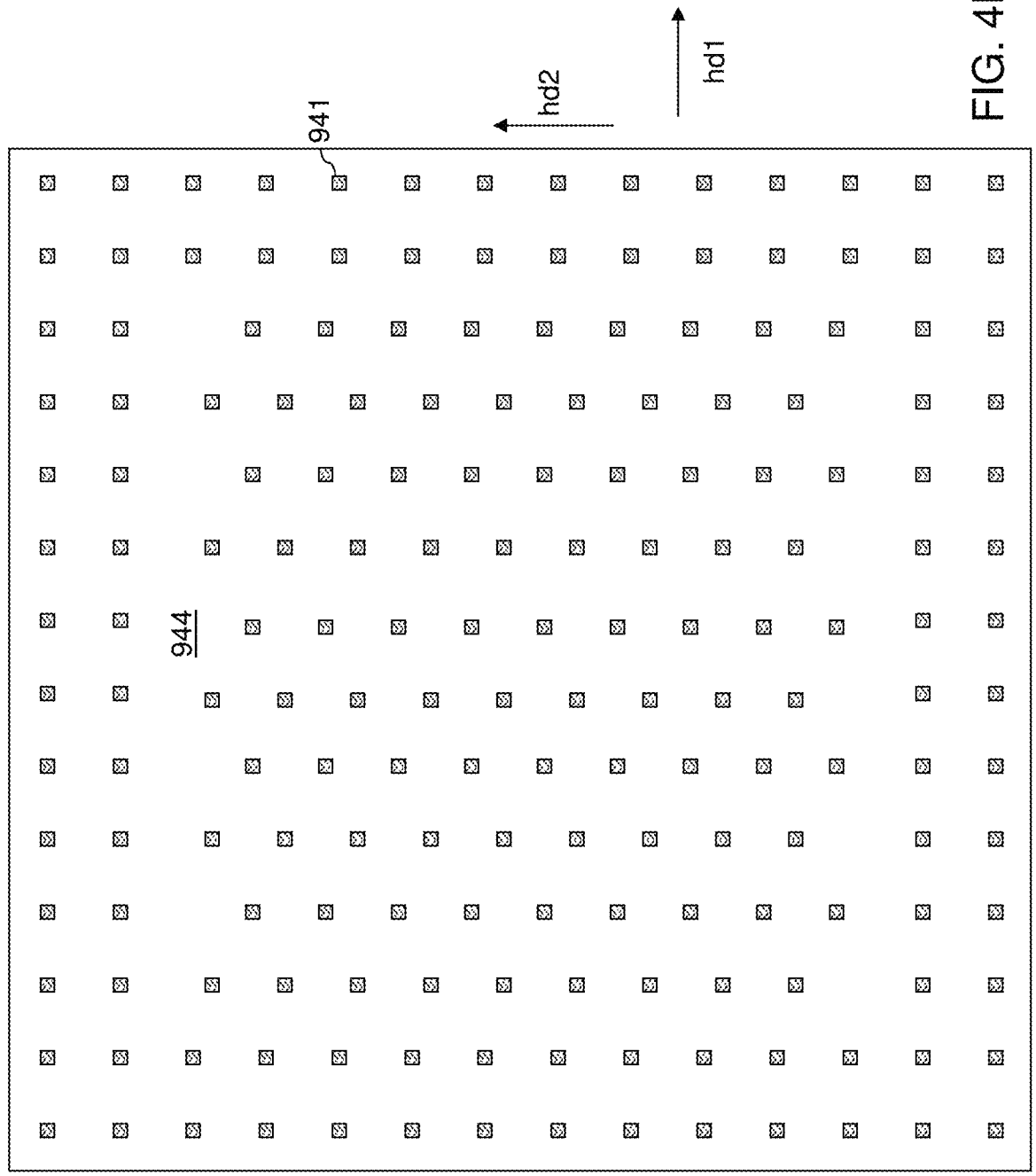

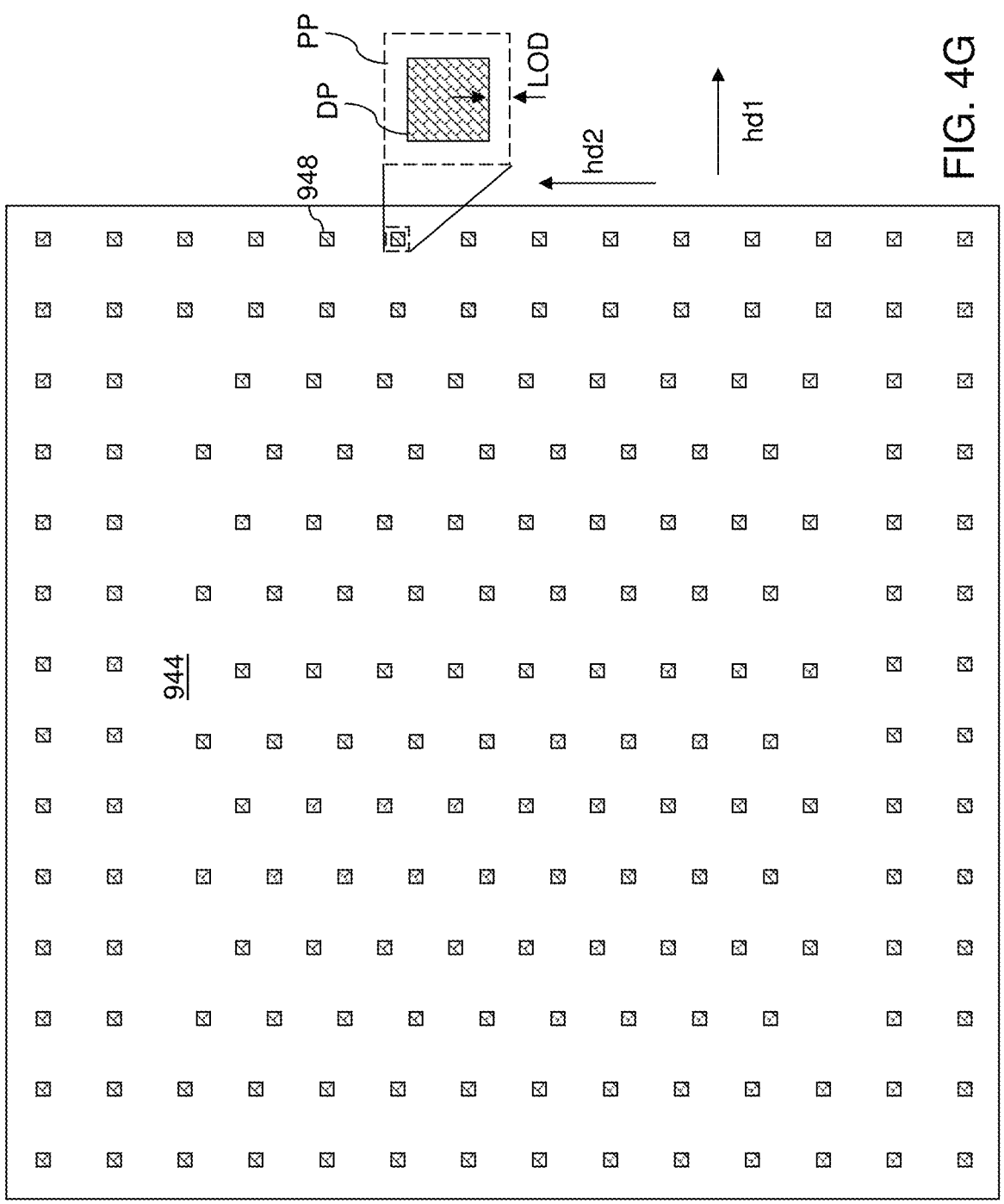

SEMICONDUCTOR STRUCTURE CONTAINING MULTILAYER BONDING PADS AND METHODS OF FORMING THE SAME

RELATED APPLICATIONS

This application is a continuation-in-part (CIP) application of U.S. patent application Ser. No. 16/825,304 filed on Mar. 20, 2020, now U.S. Pat. No. 11,201,139, the entire contents of which are incorporated herein by reference.

FIELD

The present disclosure relates generally to the field of semiconductor devices, and particularly to a semiconductor structure including multilayer bonding pads and methods for forming the same.

BACKGROUND

A semiconductor memory device may include a memory array and driver circuit located on the same substrate. However, the driver circuit takes up valuable space on the substrate, thus reducing the space available for the memory array.

SUMMARY

According to an aspect of the present disclosure, a bonded assembly is provided, which comprises: a first semiconductor die that comprises first semiconductor devices, and a first pad-level dielectric layer and embedding first bonding pads; and a second semiconductor die that comprises second semiconductor devices, and a second pad-level dielectric layer embedding second bonding pads that includes a respective second pad base portion, wherein each of the second bonding pads is bonded to a respective one of the first bonding pads. Each of the first bonding pads comprises a respective first pad base portion and a respective first material portion comprising a different material than the first pad base portion, such as a respective first metal alloy material portion having a higher coefficient of thermal expansion (CTE) than the respective first pad base portion.

According to another aspect of the present disclosure, a method of forming a bonded assembly is provided. The method comprises: providing a first semiconductor die that comprises first semiconductor devices located over a first substrate, and a first pad-level dielectric layer and embedding first bonding pads; providing a second semiconductor die that comprises second semiconductor devices located over a second substrate, and a second pad-level dielectric layer embedding second bonding pads that include a respective second pad base portion; and forming a bonded assembly by bonding the second bonding pads to a respective one of the first bonding pads, wherein each of the first bonding pads comprises a respective first pad base portion and a respective first metal alloy material portion having a higher coefficient of thermal expansion (CTE) than the respective first pad base portion.

According to an aspect of the present disclosure, a structure comprising a first semiconductor die is provided. The first semiconductor die comprises: first semiconductor devices located over a first substrate; first interconnect-level dielectric material layers embedding first metal interconnect structures and located on the first semiconductor devices; and a first pad-level dielectric layer located on the first interconnect-level dielectric material layers and embedding first bonding pads, wherein each of the first bonding pads comprises a first pad base portion and at least one first pad pillar portion that has a lesser area than the first pad base portion, and is more distal from the first substrate than the first pad base portion is from the first substrate.

According to another aspect of the present disclosure, a method of forming a structure is provided. The method comprises forming a first semiconductor die by performing processing steps of: forming first semiconductor devices over a first substrate; forming first interconnect-level dielectric material layers embedding first metal interconnect structures over the first semiconductor devices; and forming a pad-level dielectric layer embedding first bonding pads over the first interconnect-level dielectric material layers, wherein each of the first bonding pads comprises a first pad base portion and at least one first pad pillar portion that has a lesser area than the first pad base portion, and is more distal from the first substrate than the first pad base portion is from the first substrate.

According to yet another aspect of the present disclosure, a structure comprising a first semiconductor die is provided. The first semiconductor die comprises: first semiconductor devices located over a first substrate; first interconnect-level dielectric material layers embedding first metal interconnect structures and located on the first semiconductor devices; and a first pad-level dielectric layer located on the first interconnect-level dielectric material layers and embedding first bonding pads, wherein each of the first bonding pads comprises a first proximal horizontal surface and a first distal horizontal surface that is more distal from the first substrate than the first proximal horizontal surface is from the first substrate and has a lesser total area than a total area of the first proximal horizontal surface.

According to still another aspect of the present disclosure, a method of forming a structure is provided. The method comprising forming a first semiconductor die by performing processing steps of: forming first semiconductor devices over a first substrate; forming first interconnect-level dielectric material layers embedding first metal interconnect structures over the first semiconductor devices; forming a first pad-level dielectric layer over the first interconnect-level dielectric material layers; and forming first bonding pads in the first pad-level dielectric layer, wherein each of the first bonding pads comprises a first proximal horizontal surface and a first distal horizontal surface that is more distal from the first substrate than the first proximal horizontal surface is from the first substrate, and the first distal horizontal surface has a lesser total area than a total area of the first proximal horizontal surface.

According to an aspect of the present disclosure, a structure comprising a first semiconductor die is provided. The first semiconductor die comprises: first semiconductor devices located over a first substrate; first interconnect-level dielectric material layers embedding first metal interconnect structures and located on the first semiconductor devices; and a first pad-level dielectric layer located on the first interconnect-level dielectric material layers and embedding first bonding pads, wherein each of the first bonding pads comprises a first proximal horizontal surface and at least one first distal horizontal surface that is more distal from the first substrate than the first proximal horizontal surface is from the first substrate and has a lesser total area than a total area of the first proximal horizontal surface.

According to another aspect of the present disclosure, a method of forming a structure is provided. The method comprises forming a first semiconductor die by performing processing steps of: forming first semiconductor devices over a first substrate; forming first interconnect-level dielectric material layers embedding first metal interconnect structures over the first semiconductor devices; forming a first pad-level dielectric layer over the first interconnect-level dielectric material layers; and forming first bonding pads in the first pad-level dielectric layer such that the each of the first bonding pads comprises a first proximal horizontal surface and at least one first distal horizontal surface that is more distal from the first substrate than the first proximal horizontal surface is from the first substrate and has a lesser total area than a total area of the first proximal horizontal surface.

BRIEF DESCRIPTION OF THE DRAWINGS

FIG. 1C is a top-down view of the first configuration of the first semiconductor die of FIG. 1B.

FIG. 1F is a top-down view of the first semiconductor die of FIG. 1E.

FIG. 3B is a top-down view of the second configuration of the first semiconductor die of FIG. 3A.

FIG. 4D is a top-down view of the third configuration of the first semiconductor die of FIG. 4C.

FIG. 4G is a top-down view of the third configuration of the first semiconductor die of FIG. 4F.

DETAILED DESCRIPTION

Figure 1A:
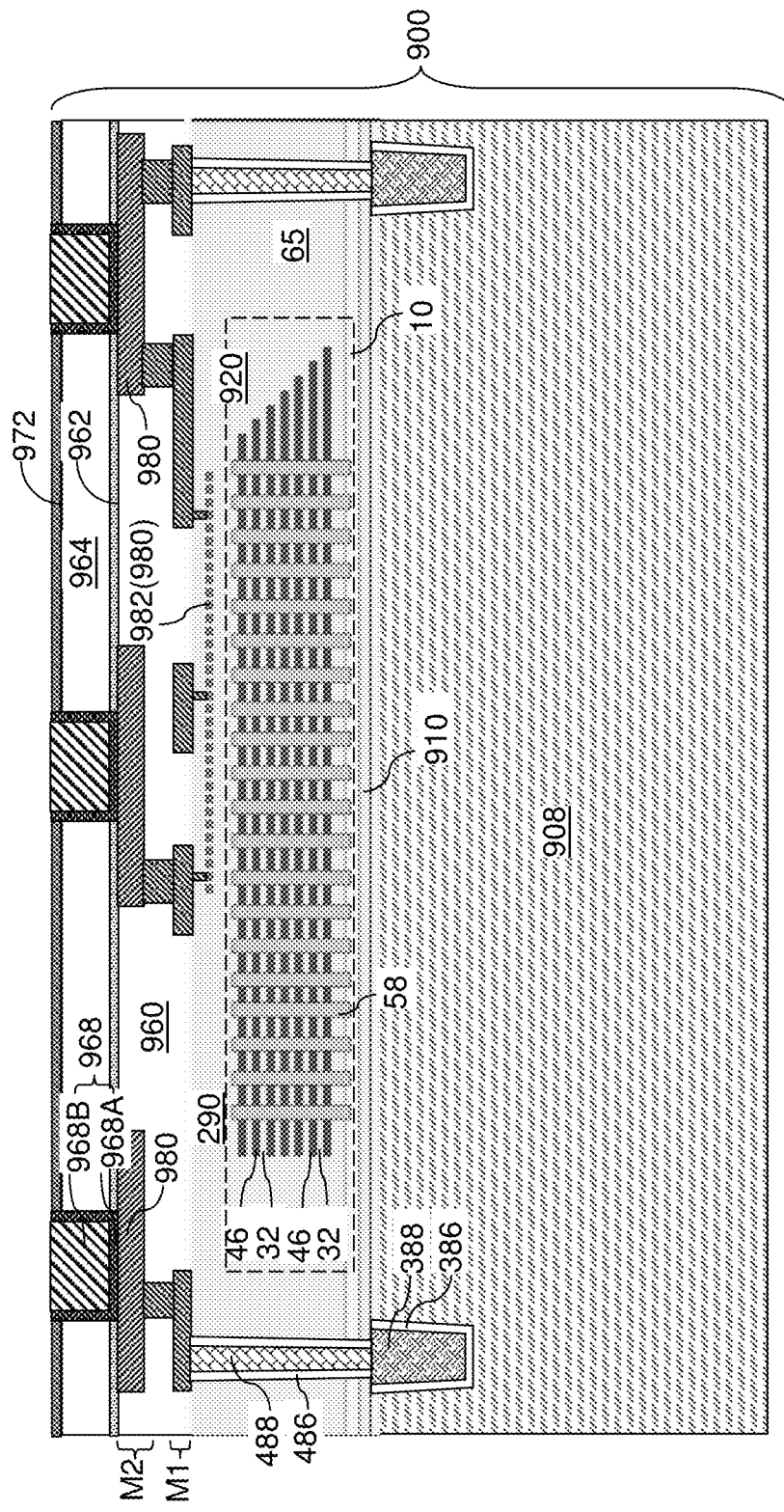
FIG. 1A is a schematic vertical cross-sectional view of a first configuration of a first semiconductor die after formation of a first pad-connection-level dielectric layer and pad-connection via structures according to a first embodiment of the present disclosure.

A first semiconductor die can be bonded to a second semiconductor die via metal-to-metal bonding between opposing sets of metal bonding pads. Dielectric-to-dielectric bonding between facing pairs of pad-level dielectric layers is desired to enhance the bonding strength between the first semiconductor die and the second semiconductor die. The metallic surfaces of the bonding pads are vertically recessed prior to bonding because the bonding pads thermally expand during the bonding process. Precise recess depth control is desired to ensure that the thermally expanded metallic surfaces and the surfaces of the pad-level dielectric layers line up at a horizontal bonding interface. If the recess depth of the bonding pads is too great, bonding between the bonding pads is hampered because the facing pairs of bonding pads do not contact each other (i.e., a void is formed between the bonding pads) while the pad-level dielectric layers are bonded to each other. If the recess depth of the bonding pad is too small, facing pairs of bonding pads protrude above the physically exposed surfaces of the pad-level dielectric layers and degrade bonding between the pad-level dielectric layers (i.e., a void is formed between the dielectric layers). Thus, simultaneously providing metal-to-metal bonding and dielectric-to-dielectric bonding between a pair of semiconductor dies poses a challenge in semiconductor manufacturing. The embodiments of the present disclosure are directed to a semiconductor structure containing reentrant shaped bonding pads (e.g., bonding pads which "point" toward the bonding interface and have a smaller distal area at the bonding interface than a proximal area away from the bonding interface) and methods for forming the same. A semiconductor die including reduced contact area bonding pads may be employed to form a bonded assembly of at least two semiconductor dies. The area of the bonding surface can be reduced employing pillar portions or a mesa-shaped vertical profile in the bonding pads, and can be advantageously employed to more effectively accommodate height variations in the bonding surfaces of the bonding pads. The various aspects of embodiments of the present disclosure are described in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1A, a first configuration of a first semiconductor die 900 is illustrated. The first semiconductor die 900 includes a first substrate 908, first semiconductor devices 920 overlying the first substrate 908, first interconnect-level dielectric material layers (290, 960) located on the first semiconductor devices, and first metal interconnect structures 980 embedded in the first interconnect-level dielectric material layers (290, 960). In one embodiment, the first substrate 908 may be a first substrate such as a commercially available silicon wafer having a thickness in a range from 500 microns to 1 mm.

Discrete substrate recess cavities can be formed in an upper portion of the first substrate 908 by applying a photoresist layer over the top surface of the first substrate 908, lithographically patterning the photoresist layer to form an array of discrete openings, and transferring the pattern of the array of discrete openings into the upper portion of the first substrate by performing an anisotropic etch process. The photoresist layer can be subsequently removed, for example, by ashing. The depth of each discrete substrate recess cavity can be in a range from 500 nm to 10,000, although lesser and greater depths can also be employed. A through-substrate liner 386 and a through-substrate via structure 388 can be formed within each discrete substrate recess cavity.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation between neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 can be formed directly on a respective one of the through-substrate via structure 388.

The first interconnect-level dielectric material layers (290, 960) may include first proximal interconnect-level dielectric material layers 290 embedding contact via structures and bit lines 982 and first distal interconnect-level dielectric material layers 960 that embed a subset of the first metal interconnect structures 980 located above the first proximal interconnect-level dielectric material layers 290. As used herein, a "proximal" surface refers to a surface that is close to a substrate, and a "distal" surface refers to a surface that is distal from the substrate. In the first semiconductor die 900, a proximal surface refers to a surface that is close to the first substrate 908, and a distal surface refers to a surface that is distal from the first substrate 908.

The bit lines 982 are a subset of the first metal interconnect structures 980 and may electrically contact drain regions located above the semiconductor channel at the top of the memory opening fill structures 58. The contact via structures contact various nodes of the first semiconductor devices. Generally, the first metal interconnect structures 980 can be electrically connected to the first semiconductor devices 920. A proximal subset of the first metal interconnect structures 980 can be located within the first distal interconnect-level dielectric material layers 960. Interconnect metal lines and interconnect metal via structures, which are subsets of the first metal interconnect structures 980, can be embedded in the first distal interconnect-level dielectric material layers 960. In an illustrative example, the first metal interconnect structures 980 may include a first memory-side metal level M1 including memory-side first-level metal lines, and a second memory-side metal level M2 including memory-side second-level metal lines.

Each of the first proximal interconnect-level dielectric material layers 290 and the first distal interconnect-level dielectric material layers 960 may include a dielectric material such as undoped silicate glass, a doped silicate glass, organosilicate glass, silicon nitride, a dielectric metal oxide, or a combination thereof. The first distal interconnect-level dielectric material layers 960 may include one or more dielectric diffusion barrier layers (not expressly shown). In this case, each dielectric diffusion barrier layer embedded in the first distal interconnect-level dielectric material layers 960 may include silicon carbon nitride (i.e., silicon carbonitride "SiCN", which is also referred to silicon carbide nitride), silicon nitride (Si$_3$N$_4$), silicon oxynitride, or any other dielectric material that is effective in blocking diffusion of copper. In one embodiment, each dielectric diffusion barrier layer embedded in the first distal interconnect-level dielectric material layers 960 may include a dielectric material having a dielectric constant less than 5, such as SiCN having a dielectric constant of about 3.8, to reduce RC delay of the first metal interconnect structures 980. Each dielectric diffusion barrier layer may have a thickness in a range from 10 nm to 30 nm.

A layer stack including an optional first interconnect-capping dielectric diffusion barrier layer 962, a first pad-connection-level dielectric layer 964, and an optional first pad-level diffusion barrier layer 972 can be formed. The first interconnect-capping dielectric diffusion barrier layer 962 can include a dielectric material that blocks copper diffusion. In one embodiment, the first interconnect-capping dielectric diffusion barrier layer 962 can include silicon nitride, silicon carbon nitride, silicon oxynitride, or a stack thereof. The thickness of the first interconnect-capping dielectric diffusion barrier layer 962 can be in a range from 5 nm to 50 nm, although lesser and greater thicknesses can also be employed.

The first pad-connection-level dielectric layer 964 may include, and/or consist essentially of, undoped silicate glass (e.g., silicon oxide), a doped silicate glass, organosilicate glass, silicon nitride, or a dielectric metal oxide. The thickness of the first pad-connection-level dielectric layer 964 may be in a range from 100 nm to 3,000 nm, although lesser and greater thicknesses may also be employed. The first pad-connection-level dielectric layer 964 may have a planar top surface.

The optional first pad-level diffusion barrier layer 972 can include a dielectric material that blocks diffusion of moisture and impurities. In one embodiment, the first pad-level diffusion barrier layer 972 can include silicon nitride, silicon carbon nitride, silicon oxynitride, or a stack thereof. The thickness of the first pad-level diffusion barrier layer 972 can be in a range from 5 nm to 50 nm, although lesser and greater thicknesses can also be employed.

A photoresist layer can be applied over the first pad-level diffusion barrier layer 972, and can be lithographically patterned to form discrete openings in areas that overlie topmost metal interconnect structures of the first metal interconnect structures 980. An anisotropic etch process can be performed to transfer the pattern of the openings in the photoresist layer through first pad-level diffusion barrier layer 972, the first pad-connection-level dielectric layer 964, and first interconnect-capping dielectric diffusion barrier layer 962. First pad-connection via cavities are formed through first pad-level diffusion barrier layer 972, the first pad-connection-level dielectric layer 964, and the first interconnect-capping dielectric diffusion barrier layer 962 in areas that overlie metal interconnect structures 980. A top surface of a topmost metal interconnect structure 980 can be physically exposed at the bottom of each first pad-connection via cavity. In one embodiment, each first pad-connection via cavity can be formed within the area of a respective one of the topmost metal interconnect structures.

A pad-connection-level metallic barrier layer and a pad-connection-level metallic fill material can be sequentially deposited in the first pad-connection via cavities. The pad-connection-level metallic barrier layer includes a conductive metallic barrier material such as TiN, TaN, and/or WN. The conductive metallic barrier material can block diffusion of copper. The thickness of the pad-connection-level metallic barrier layer may be in a range from 4 nm to 80 nm, such as from 8 nm to 40 nm, although lesser and greater thicknesses can also be employed. The pad-connection-level metallic fill material can include copper, tungsten, molybdenum, ruthenium, cobalt, or a combination thereof. For example, if the pad-connection-level metallic fill material includes copper, copper may be deposited by a combination of a copper seed layer deposition process employing physical vapor deposition and a copper electroplating process that fills remaining volumes of the first pad-connection via cavities.

Excess portions of the pad-connection-level metallic fill material and the pad-connection-level metallic barrier layer overlying the horizontal plane including the top surface of first pad-connection-level dielectric layer 964 can be removed by a planarization process such as chemical mechanical planarization. Remaining portions of the pad-connection-level metallic fill material and the pad-connection-level metallic barrier layer that fill the first pad-connection via cavities constitute first pad-connection via structures 968. Each first pad-connection via structure 968 can include a pad-connection-level metallic barrier liner 968A and a pad-connection-level metallic fill material portion 968B. The pad-connection-level metallic barrier liner 968A is a patterned remaining portion of the pad-connection-level metallic barrier layer, and the pad-connection-level metallic fill material portion 968B is a patterned remaining portion of the pad-connection-level metallic fill material. Top surfaces of the first pad-connection via structures 968 can be within a same horizontal plane as the top surface of the first pad-connection-level dielectric layer 964 or the top surface of the first pad-level diffusion barrier layer 972 (if present).

Figure 1B:
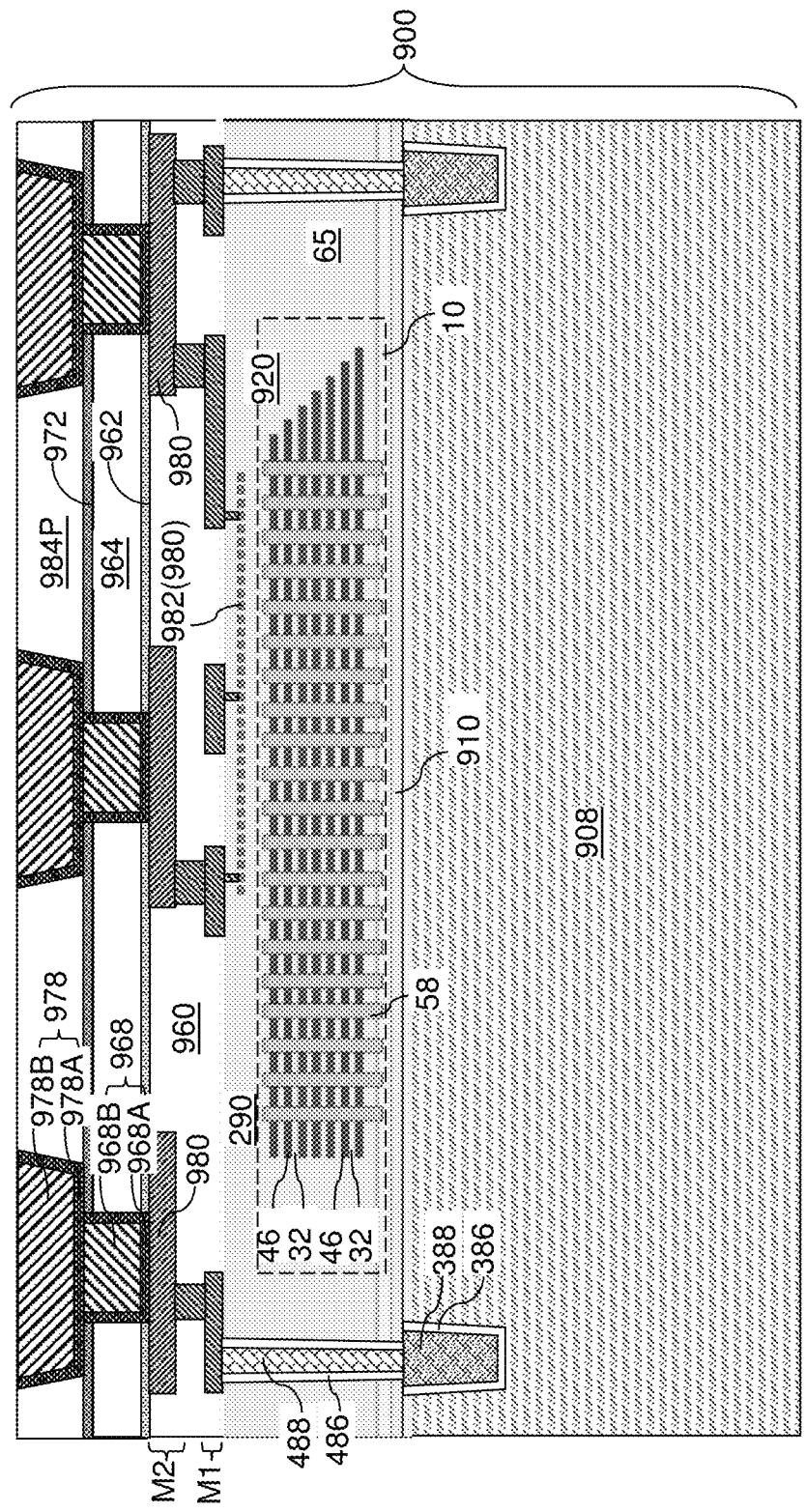
FIG. 1B is a schematic vertical cross-sectional view of the first configuration of the first semiconductor die after formation of a first proximal pad-level dielectric layer and first pad base portions according to the first embodiment of the present disclosure.

Referring to FIGS. 1B and 1C, a first proximal pad-level dielectric layer 984P can be formed over the first pad-connection-level dielectric layer 964. The first proximal pad-level dielectric layer 984P may include, and/or consist essentially of, undoped silicate glass, a doped silicate glass, organosilicate glass, silicon nitride, or a dielectric metal oxide. The thickness of the first proximal pad-level dielectric layer 984P may be in a range from 300 nm to 3,000 nm, although lesser and greater thicknesses may also be employed. The first proximal pad-level dielectric layer 984P may have a planar top surface.

A photoresist layer (not shown) can be applied over the first proximal pad-level dielectric layer 984P, and can be lithographically patterned to form discrete openings in each area of the first pad-connection via structures 968. In other words, each discrete opening in the photoresist layer overlies a respective one of first pad-connection via structures 968. Each discrete opening in the photoresist layer can have a greater area than the area of an underlying first pad-connection via structure 968. Each discrete opening in the photoresist layer can have a shape of a bonding pad to be subsequently formed. For example, each discrete opening in the photoresist layer can have a rectangular shape or a rounded rectangular shape having sides that are parallel to a first horizontal direction hd1 and a second horizontal direction hd2. The dimension of each opening along the first horizontal direction hd1 and the dimension of each opening along the second horizontal direction hd2 are in a range from 2 microns to 60 microns.

An anisotropic etch process can be performed to transfer the pattern of the openings in the photoresist layer through the first proximal pad-level dielectric layer 984P. First pad base cavities are formed through the first proximal pad-level dielectric layer 984P underneath discrete openings in the photoresist layer. A top surfaces of a single pad-connection via structure 968 can be physically exposed at the bottom of each first pad base cavity. Each first pad base cavity can have a horizontal cross-sectional shape of a rectangle or a rounded rectangle such that the dimension of each first pad base cavity along the first horizontal direction hd1 is in a range from 2 micron to 60 microns and the dimension of each first pad base cavity along the second horizontal direction hd2 is in a range from 2 micron to 60 microns. In one embodiment, each first pad base cavity can have a horizontal cross-sectional shape of a square or a rounded square such that the dimension of the each first pad base cavity along the first horizontal direction hd1 and the dimension of each first pad base cavity along the second horizontal direction hd2 are the same. In this case, the dimension of each first pad base cavity along the first horizontal direction hd1 and along the second horizontal direction hd2 can be in a range from 2 microns to 60 microns, such as from 4 microns to 30 microns. Sidewalls of the first pad base cavities may be vertical, or may have a taper angle greater than 0 degree and less than 30 degrees (such as a taper angle in a range from 3 degrees to 10 degrees) with respect to the vertical direction.

A first metallic liner layer and a first metallic pad fill material can be sequentially deposited in the first pad base cavities. The first metallic liner layer includes a metallic barrier material. The metallic barrier material may include a metallic nitride material such as TiN, TaN, and/or WN, and/or may include an elemental metal or an intermetallic alloy that can function as a barrier for diffusion of a metallic material. The conductive metallic barrier material can block diffusion of copper. The first metallic liner layer is formed on top surfaces of the first pad-connection via structures 968. The thickness of the first metallic liner layer may be in a range from 4 nm to 80 nm, such as from 8 nm to 40 nm, although lesser and greater thicknesses can also be employed. The first metallic pad fill material can include copper, tungsten, molybdenum, cobalt, ruthenium, or a combination thereof. In an illustrative example, if the first metallic pad fill material includes copper, the first metallic pad fill material may be deposited by a combination of a copper seed layer deposition process employing physical vapor deposition and a copper electroplating process that fills remaining volumes of the first pad base cavities.

Excess portions of the first metallic pad fill material and the first metallic liner layer overlying the horizontal plane including the top surface of the first proximal pad-level dielectric layer 984P can be removed by a planarization process such as chemical mechanical planarization. Remaining portions of the first metallic pad fill material and the first metallic liner layer that fill the first pad base cavities constitute first pad base portions 978.

Each first pad base portion 978 can include a first metallic liner 978A and a first pad base plate portion 978B. The first metallic liner 978A is a patterned remaining portion of the first metallic liner layer, and the first pad base plate portion 978B is a patterned remaining portion of the first metallic pad fill material. Top surfaces of the first pad base portions 978 can be within a same horizontal plane as the top surface of the first proximal pad-level dielectric layer 984P.

Generally, the first pad base portions 978 are formed in the first pad base cavities directly on the top surfaces of the first pad-connection via structures 968. Each of the first pad base portions 978 comprises, and/or consists of, a first metallic liner 978A comprising a metallic barrier material, and a first metallic fill material portion 978B embedded in the metallic liner 978A. The first pad-connection-level dielectric layer 964 can be located between the first interconnect-level dielectric material layers (290, 960) and the first pad-level dielectric layer 984P, and can embed first pad-connection via structures 968 having a respective distal surface that is in contact with a respective one of the first pad base portions 978 and having a lesser area than an area of a proximal horizontal surface of the respective one of the first pad base portions 978.

Figure 1D:
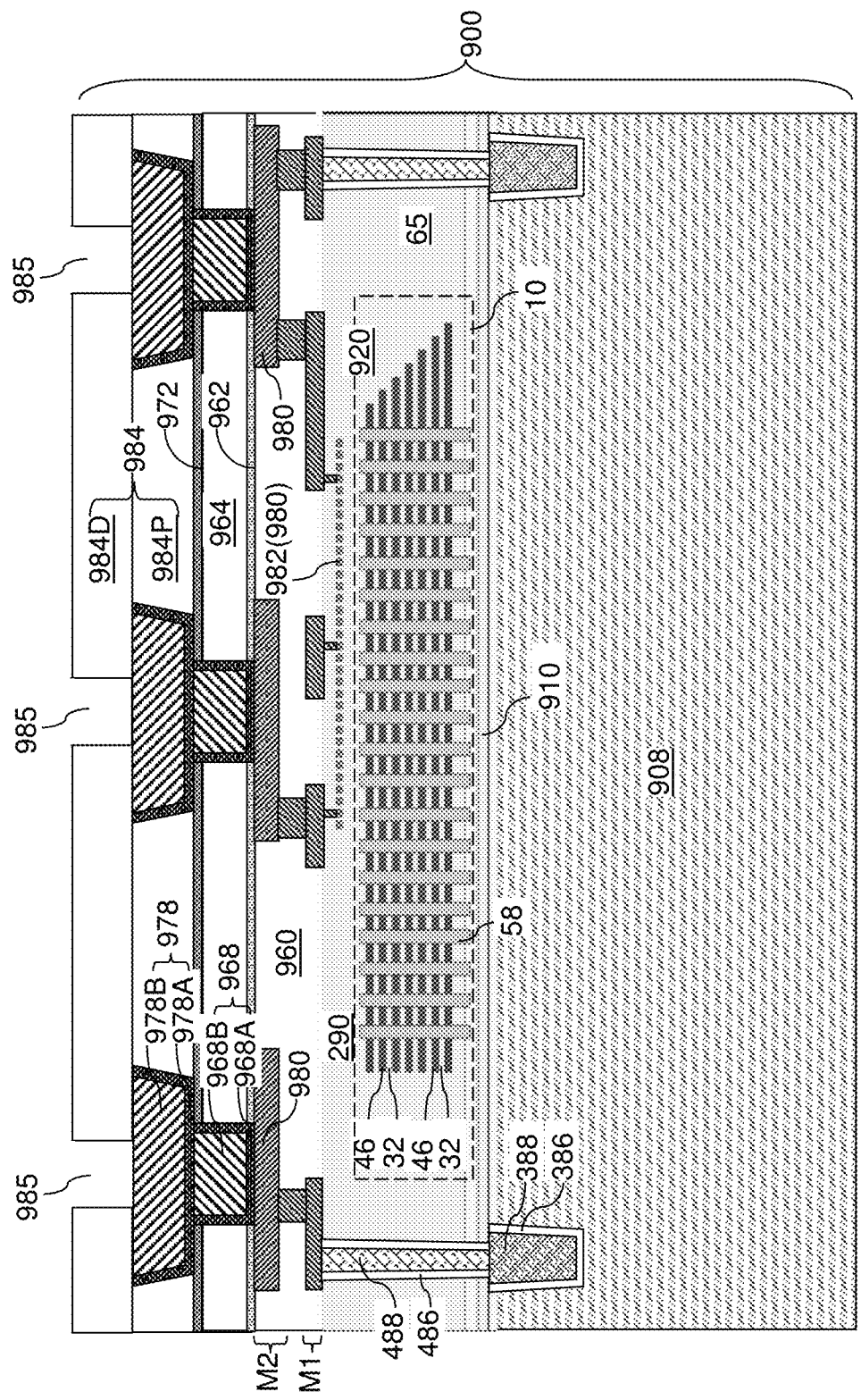
FIG. 1D is a schematic vertical cross-sectional view of the first configuration of the first semiconductor die after formation of a first distal pad-level dielectric layer and first pillar cavities according to the first embodiment of the present disclosure.

Referring to FIG. 1D, a first distal pad-level dielectric layer 984D can be formed over the first proximal pad-level dielectric layer 984P. The first distal pad-level dielectric layer 984D may include, and/or consist essentially of, undoped silicate glass, a doped silicate glass, organosilicate glass, silicon nitride, or a dielectric metal oxide. The thickness of the first distal pad-level dielectric layer 984D may be in a range from 300 nm to 3,000 nm, although lesser and greater thicknesses may also be employed. The first distal pad-level dielectric layer 984D may have a planar top surface.

A photoresist layer (not shown) can be applied over the first distal pad-level dielectric layer 984D, and can be lithographically patterned to form discrete openings in each area of the first pad base portions 978. In other words, each discrete opening in the photoresist layer overlies a respective one of first pad base portions 978. Each discrete opening in the photoresist layer can have a lesser area than the area of an underlying first pad base portion 978. Each discrete opening can have a periphery that is located entirely within the area of an underlying pad base portion 978, and is laterally offset inward from the periphery of the underlying pad base portion 978. For example, each discrete opening in the photoresist layer can have a circular shape or an elliptical shape. The maximum lateral dimension of each opening in the photoresist layer may be in a range from 200 nm to 40 microns.

An anisotropic etch process can be performed to transfer the pattern of the openings in the photoresist layer through the first distal pad-level dielectric layer 984D. First pillar cavities 985 are formed through the first distal pad-level dielectric layer 984D underneath the discrete openings in the photoresist layer. A top surface of a first pad base portion 978 can be physically exposed at the bottom of each first pillar cavity 985. Each first pillar cavity 985 can have a horizontal cross-sectional shape of a polygon, a circle, an ellipse, or another curvilinear two-dimensional shape having a closed periphery. The maximum lateral dimension of each first pillar cavity 985 may be in a range from 200 nm to 40 microns.

Figure 1E:
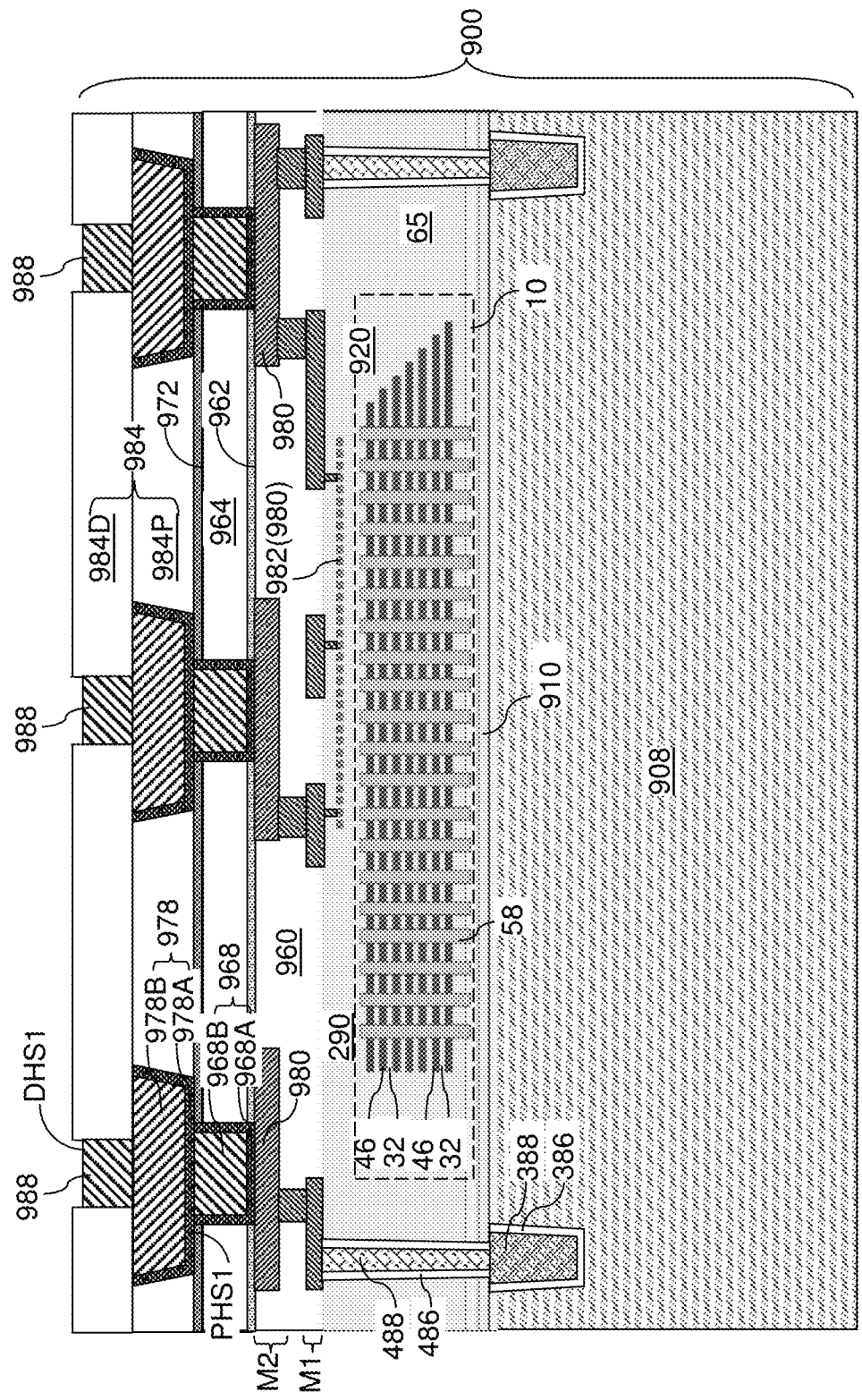
FIG. 1E is a schematic vertical cross-sectional view of the first configuration of the first semiconductor die after formation of first pad pillar portions according to the first embodiment of the present disclosure.

Referring to FIGS. 1E and 1F, a first metallic pillar fill material can be deposited in the first pillar cavities 985. The first metallic pillar fill material may be the same as, or may be different from, the first metallic pad fill material of the first pad base plate portion 978B. The first metallic pillar fill material can include copper, tungsten, molybdenum, cobalt, ruthenium, or a combination thereof. In an illustrative example, if the first metallic pillar fill material includes copper, the first metallic pillar fill material may be deposited by a combination of a copper seed layer deposition process employing physical vapor deposition and a copper electroplating process that fills remaining volumes of the first pad base cavities.

Excess portions of the first metallic pillar fill material overlying the horizontal plane including the distal horizontal surface (i.e., the top surface) of the first distal pad-level dielectric layer 984D can be removed by a planarization process such as chemical mechanical planarization. Remaining portions of the first metallic pillar fill material that fill the first pillar cavities 985 constitute first pad pillar portions 988. Top surfaces of the first pad pillar portions 988 can be vertically recessed, for example, by overpolishing and/or a recess etch, to be located below the horizontal plane including the distal horizontal surface (i.e., the top surface) of the first distal pad-level dielectric layer 984D. The vertical recess distance is selected so that volume expansion of the materials of the first pad base portions 978 and the first pad pillar portions 988 causes the top surface of the first pad pillar portions 988 to be flush with the distal horizontal surface of the first distal pad-level dielectric layer 984D at the elevated temperature of a bonding process to be subsequently employed. For example, the vertical recess distance of the top surfaces of the first pad pillar portion 988 relative to the horizontal plane including the distal horizontal surface of the first distal pad-level dielectric layer 984D can be in a range from 10 nm to 100 nm, such as from 20 nm to 60 nm, although lesser and greater vertical recess distances may also be employed. Each first pad pillar portion 988 can be formed in a respective first pillar cavity directly on the top surface of a respective first pad base portion 978.

Each contiguous combination of a first pad base portion 978 and a first pad pillar portion 988 constitutes a first bonding pad (978, 988). The combination of the first proximal pad-level dielectric layer 984P and the first distal pad-level dielectric layer 984D constitutes a first pad-level dielectric layer 984 that laterally surrounds, and embeds, the first bonding pads (978, 988). The first pad-level dielectric layer 984 is a composite layer including a layer stack of the first proximal pad-level dielectric layer 984P and the first distal pad-level dielectric layer 984D.

Generally, the first bonding pads (978, 988) in the first pad-level dielectric layer 984 can be formed such that the each of the first bonding pads (978, 988) comprises a first proximal horizontal surface PHS1 and a first distal horizontal surface DHS1 that is more distal from the first substrate 908 than the first proximal horizontal surface PHS1 is from the first substrate 908 and has a lesser total area than a total area of the first proximal horizontal surface PHS1. The first pad-level dielectric layer 984 overlies the first interconnect-level dielectric material layers (290, 960) and embeds the first bonding pads (978, 988).

Each of the first bonding pads (978, 988) comprises a first pad base portion 978 embedded in the first proximal pad-level dielectric layer 984P and a first pad pillar portion 988 contacting the first distal pad-level dielectric layer 984D. The first pad base portions 978 are formed within the first proximal pad-level dielectric layer 984P prior to formation of the first distal pad-level dielectric layer 984D.

In one embodiment, planar distal surfaces of each first pad base portion 978 contact portions of a proximal horizontal surface of the first distal pad-level dielectric layer 984D. In one embodiment, each first pad base portion 978 comprises a stack of a first metallic liner 978A and a pad base plate portion 978B. Each first pad pillar portion 988 contacts a sidewall of the first distal pad-level dielectric layer 984D. In one embodiment, each of the first bonding pads (978, 988) consists of a first pad base portion 978 and a single first pad pillar portion 988. In one embodiment, each first pad base portion 978 comprises a straight sidewall that vertically extends from a proximal horizontal surface of the first proximal pad-level dielectric layer 984P to a distal horizontal surface of the first proximal pad-level dielectric layer 984P at a taper angle of zero to 20 degrees with respect to a line normal to the top surface of the first substrate 908.

Figure 2A:
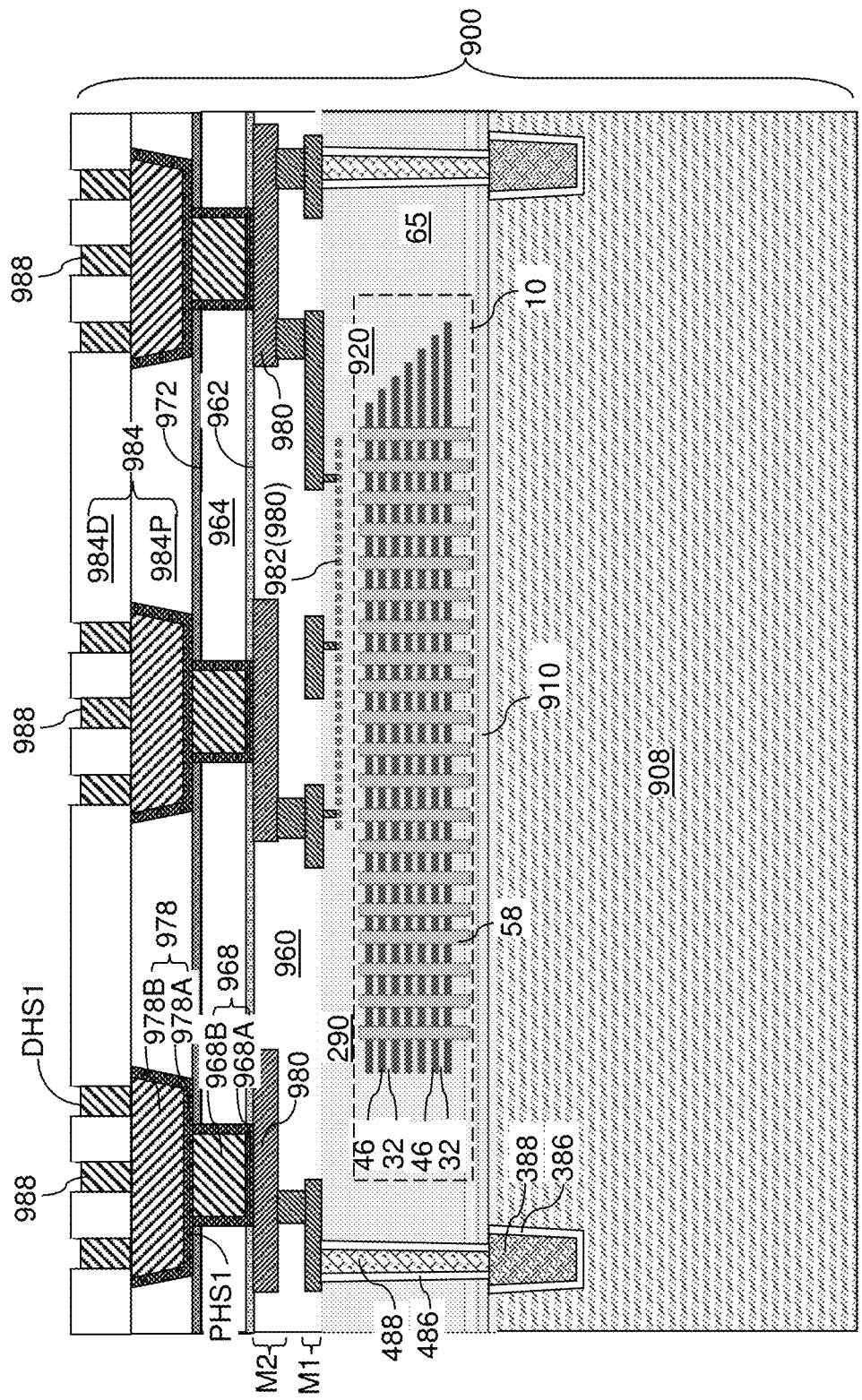
FIG. 2A is a schematic vertical cross-sectional view of a variant of the first configuration of the first semiconductor die after formation of first pad pillar portions according to the first embodiment of the present disclosure.
Figure 2B:
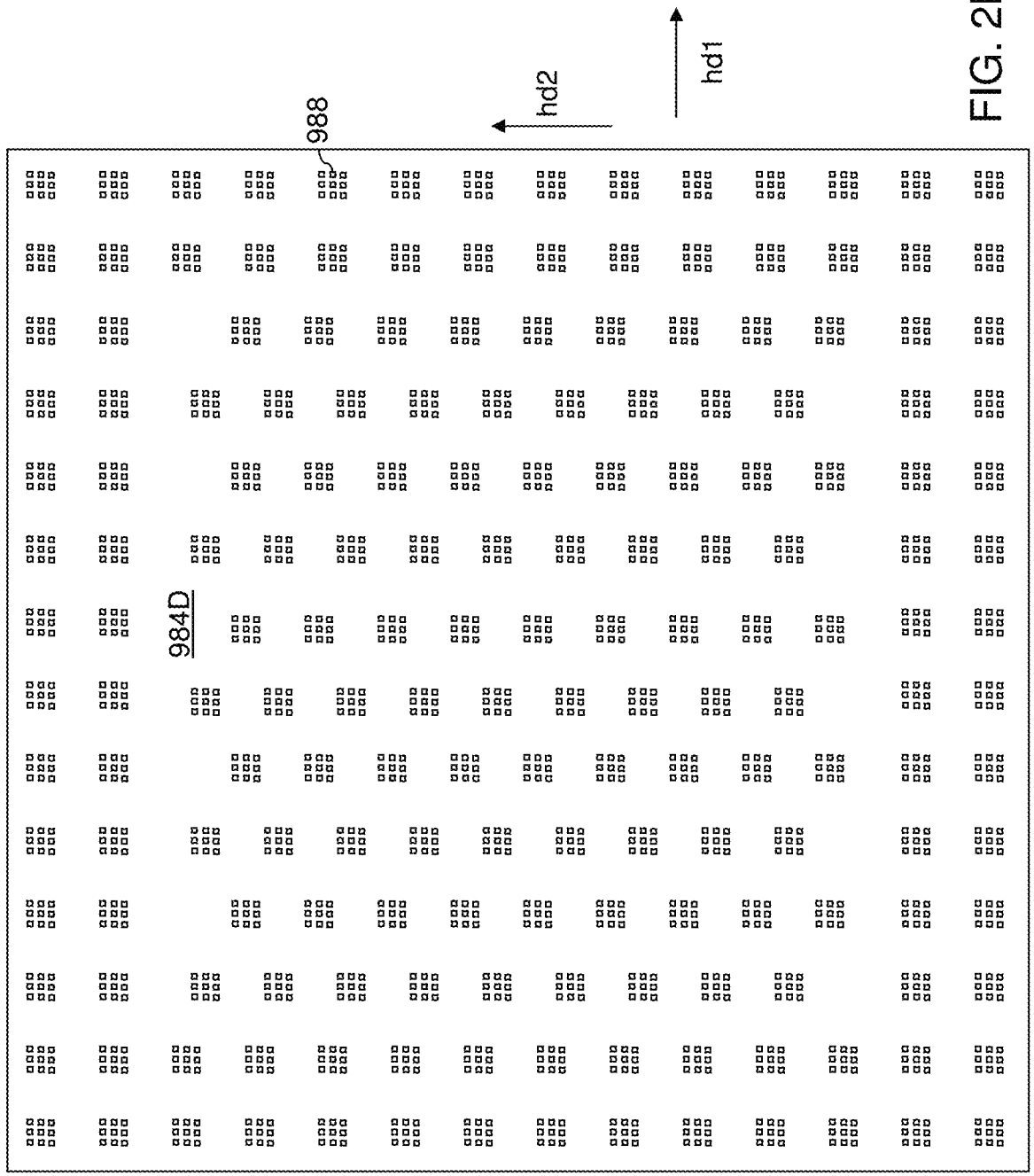
FIG. 2B is a top-down view of the variant of the configuration of the first semiconductor die of FIG. 2A.

Referring to FIGS. 2A and 2B, a variant of the first configuration of the first semiconductor die 900 is illustrated, which can be derived from the first semiconductor die 900 of FIGS. 1E and 1F by forming a plurality of first pad pillar portions 988 on each first pad base portion 978. At least two pad pillar portions 988 can be formed directly on each first pad base portion 978. In one embodiment, a one-dimensional array of pad pillar portions 988 or a two-dimensional array of pad pillar portions 988 can be formed directly on a top surface of each first pad base portion 978. Generally, a first bonding pad (978, 988) can include a first pad base portion 978 and at least one first pad pillar portion 988. The at least one first pad pillar portion 988 may include a single pad pillar portion 988, or a plurality of first pad pillar portions 988 that are laterally spaced apart from each other. In one embodiment, the plurality of first pad pillar portions 988 may include an M×N rectangular periodic array of first pad pillar portions 988, in which M and N are independent integers in a range from 2 to 10.

Figure 3A:
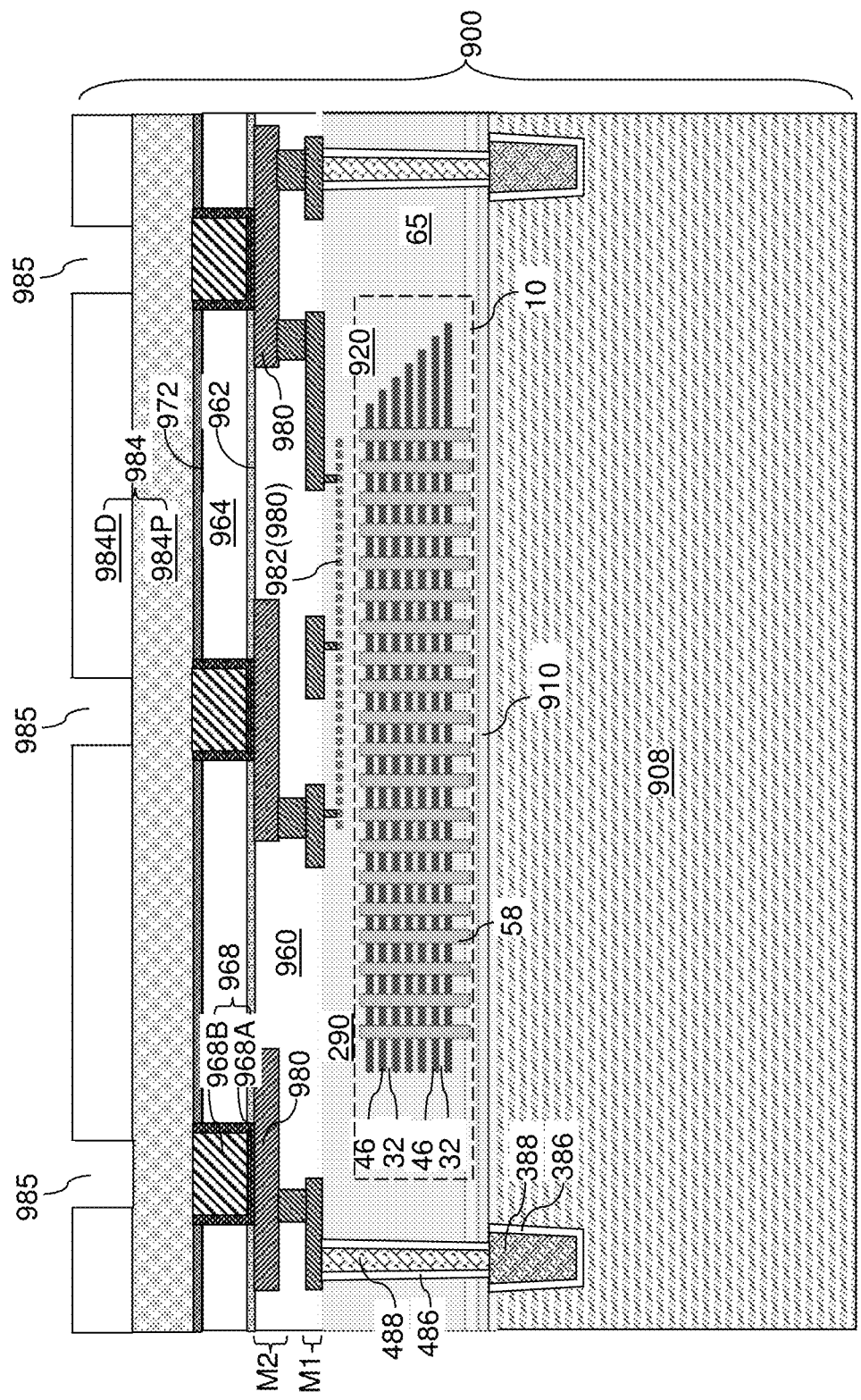
FIG. 3A is a schematic vertical cross-sectional view of a second configuration of the first semiconductor die after formation of a first distal pad-level dielectric layer and first pillar cavities according to the second embodiment of the present disclosure.

Referring to FIGS. 3A and 3B, a second configuration of the first semiconductor die 900 is illustrated, which can be derived from the first semiconductor die 900 of FIG. 1A by forming a first distal pad-level dielectric layer 984 and first pillar cavities 985 in an upper portion of the first pad-level dielectric layer 984. Specifically, the first pad-level dielectric layer 984 can be formed as a composite layer including a layer stack of a first proximal pad-level dielectric layer 984P and a first distal pad-level dielectric layer 984D. The first proximal pad-level dielectric layer 984P includes a first dielectric material and the first distal pad-level dielectric layer 984D includes a second dielectric material that is different from the first dielectric material. For example, the first dielectric material may include silicon nitride and the second dielectric material may include silicon oxide. Alternatively, the first dielectric material can include borosilicate glass or organosilicate glass, and the second dielectric material can include undoped silicate glass. In this case, the ratio of the etch rate of the first dielectric material in 100:1 dilute hydrofluoric acid to the etch rate of the second dielectric material in 100:1 dilute hydrofluoric acid may be in a range from 10 to 1,000. The thickness of the first proximal pad-level dielectric layer 984P may be in a range from 300 nm to 3,000 nm, although lesser and greater thicknesses may also be employed. The thickness of the first distal pad-level dielectric layer 984D may be in a range from 300 nm to 3,000 nm, although lesser and greater thicknesses may also be employed.

A photoresist layer (not shown) can be applied over the first distal pad-level dielectric layer 984D, and can be lithographically patterned to form discrete openings in areas that overlie the first pad-connection via structures 968. The discrete openings in the photoresist layer may overlie the first pad-connection via structures 968, or may be formed in the vicinity of the first pad-connection via structures 968. Each discrete opening in the photoresist layer can be formed within the areas of a first pad base portion to be subsequently formed in the first proximal pad-level dielectric layer 984P. For example, each discrete opening in the photoresist layer can have a circular shape or an elliptical shape. The maximum lateral dimension of each opening in the photoresist layer may be in a range from 200 nm to 40 microns.

An anisotropic etch process can be performed to transfer the pattern of the openings in the photoresist layer through the first distal pad-level dielectric layer 984D. First pillar cavities 985 are formed through the first distal pad-level dielectric layer 984D underneath the discrete openings in the photoresist layer. A top surface of the first proximal pad-level dielectric layer 984P can be used as an etch stop and is physically exposed at the bottom of each first pillar cavity 985. Each first pillar cavity 985 can have a horizontal cross-sectional shape of a polygon, a circle, an ellipse, or another curvilinear two-dimensional shape having a closed periphery. The maximum lateral dimension of each first pillar cavity 985 may be in a range from 200 nm to 40 microns.

Figure 3C:
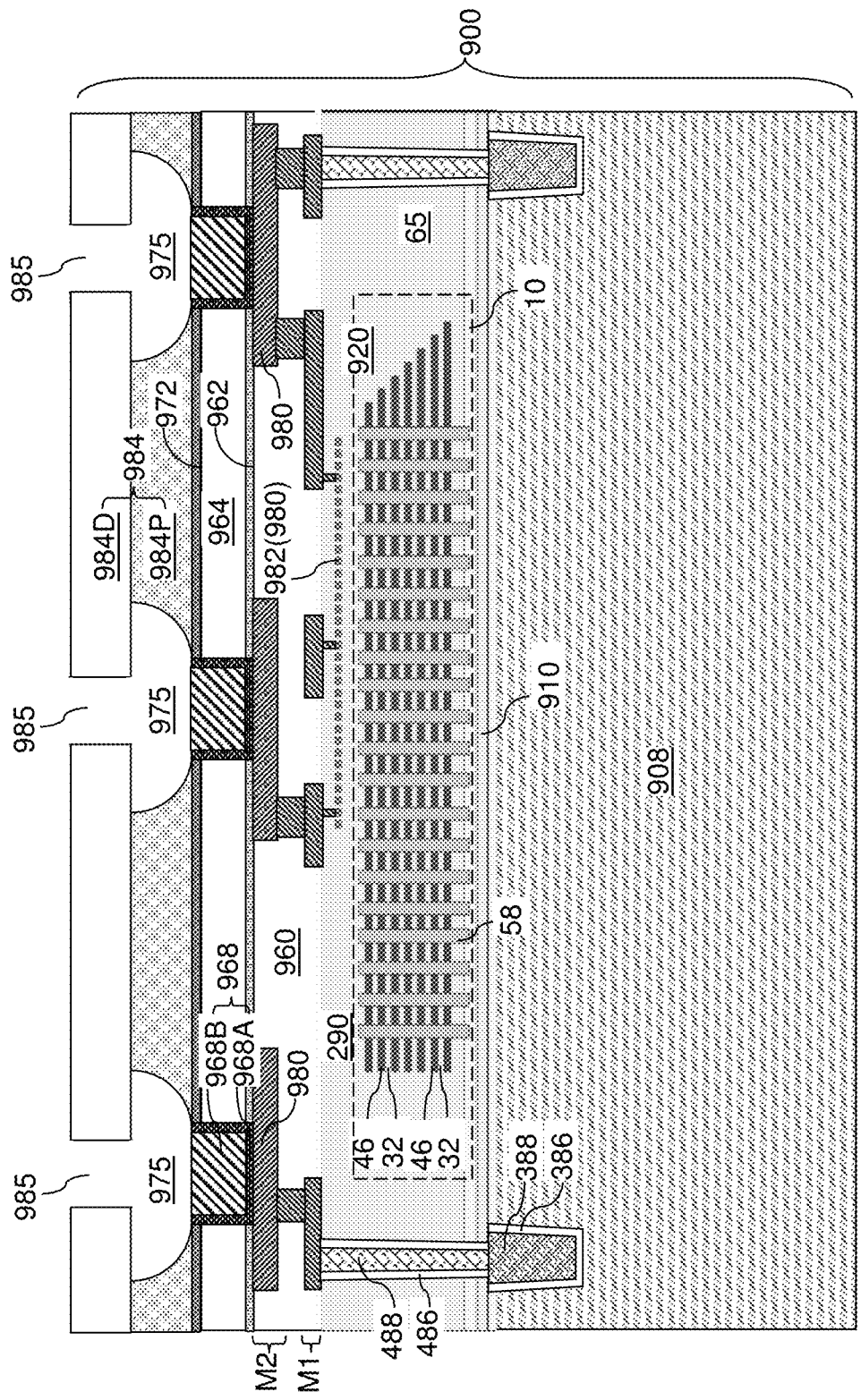
FIG. 3C is a schematic vertical cross-sectional view of the second configuration of the first semiconductor die after formation of first proximal pad cavities according to the second embodiment of the present disclosure.

Referring to FIG. 3C, an isotropic etch process that selectively etches the first dielectric material of the first proximal pad-level dielectric layer 984P relative to the first distal pad-level dielectric layer 984D can be performed to isotropically recess physically exposed portions of the first proximal pad-level dielectric layer 984P underneath the first pillar cavities 985. As used herein, a first material is removed "selective" to a second material if the removal rate (such as an etch rate) of the first material is at least three times the removal rate of the second material. The first dielectric material of the first proximal pad-level dielectric layer 984P is isotropically recessed by the isotropic etch process to form pad base cavities 975 underneath the pillar cavities 985. For example, if the first proximal pad-level dielectric layer 984P includes silicon nitride and if the first distal pad-level dielectric layer 984D includes silicon oxide, a wet etch process employing hot phosphoric acid can be performed to isotropically recess physically exposed portions of the first proximal pad-level dielectric layer 984P selective to the first distal pad-level dielectric layer 984D.

Each pad base cavity 975 can be formed underneath, and can be adjoined to, and overlying pillar cavity 985. A top surface of a first pad-connection via structure 968 can be physically exposed at the bottom of each pad base cavity 975. Each pad base cavity 975 can be laterally bounded by at least one concave sidewall of the first proximal pad-level dielectric layer 984P that vertically extends from the horizontal plane including the bottom surface of the first proximal pad-level dielectric layer 984P to the horizontal plane including the top surface of the first proximal pad-level dielectric layer 984P. Generally, the first pad base cavities 975 can be formed in the first proximal pad-level dielectric layer 984P after formation of the first distal pad-level dielectric layer 984D by isotropically etching portions of the first proximal pad-level dielectric layer 984P from underneath the pillar cavities 985. Each first pad base cavity 975 can have an upper outer periphery that is laterally offset outward from the bottom periphery of an overlying pillar cavity 985. Further, each first pad base cavity 975 may have a lower periphery at a horizontal plane including the top surfaces of the first pad-connection via structures 968. The lower periphery may be laterally offset outward from the bottom periphery of the overlying pillar cavity 985 in a plan view.

Figure 3D:
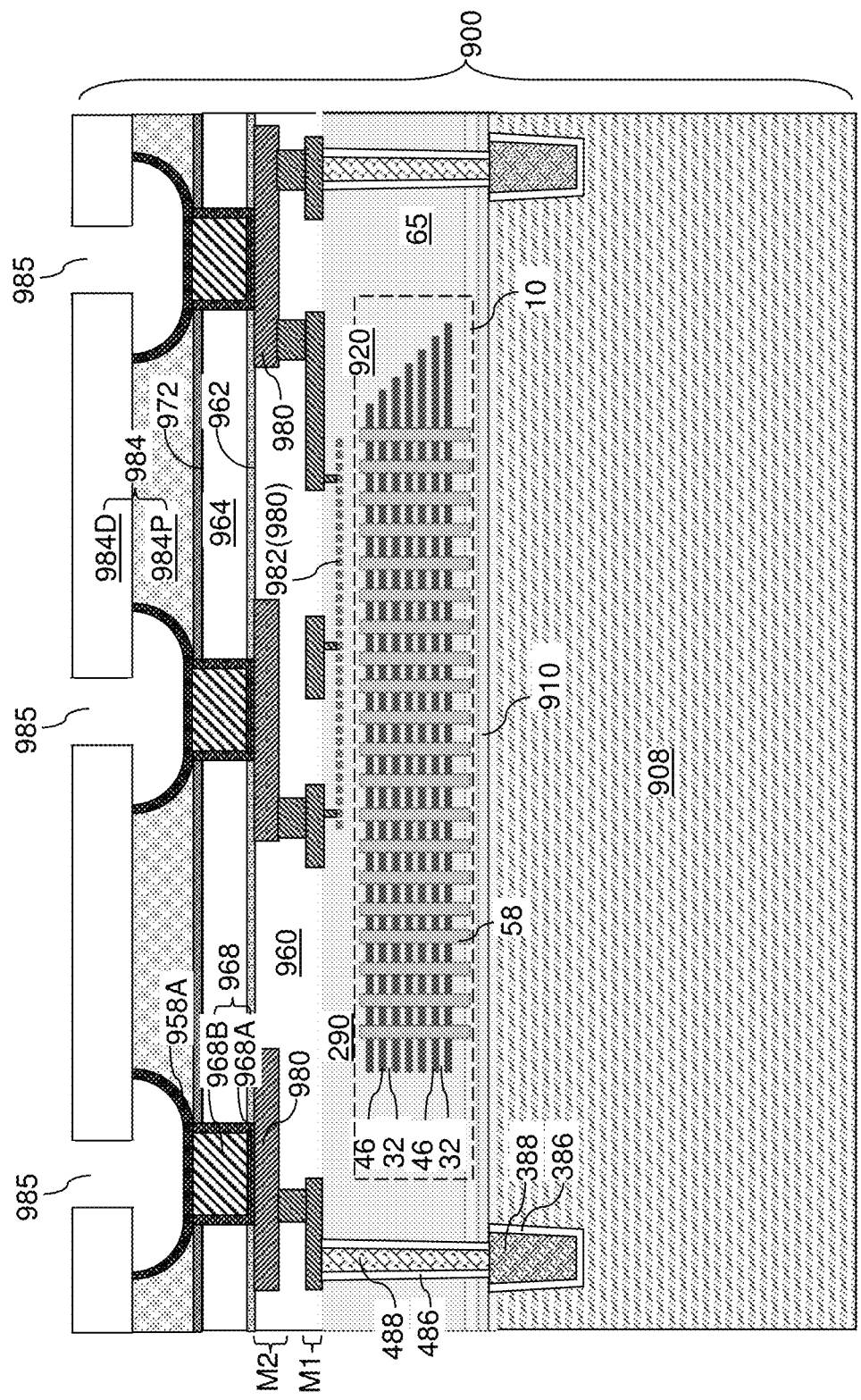
FIG. 3D is a schematic vertical cross-sectional view of the second configuration of the first semiconductor die after selective growth of a metallic liner according to the second embodiment of the present disclosure.

Referring to FIG. 3D, a metallic material is selectively deposited on the physically exposed surfaces of the first pad-level dielectric layer 984P and the first pad-connection via structures 968 without deposition on the surfaces of the second pad-level dielectric layer 984D. As used herein, a material is "selectively" deposited, or "selectively" nucleates, on a first surface relative to a second surface if the material is deposited on, or nucleates on, the first surface and is not deposited on, or does not nucleate on, the second surface. For example, if the first dielectric material of the first proximal pad-level dielectric layer 984P includes silicon nitride and if the second dielectric material of the first distal pad-level dielectric layer 984D includes silicon oxide, the metallic material can include a material that nucleates on silicon nitride surfaces and does not nucleate on silicon oxide surfaces. For example, the metallic material can include ruthenium or molybdenum. A first metallic liner 958A is formed on each contiguous set of a physically exposed surface of a first pad-connection via structure 968 and at least one sidewall of the first proximal pad-level dielectric layer 984P that laterally surrounds a first pad base cavity 975. The thickness of each first metallic liner 958A can be in a range from 1 nm to 30 nm, such as from 2 nm to 15 nm, although lesser and greater thicknesses can also be employed.

Figure 3E:
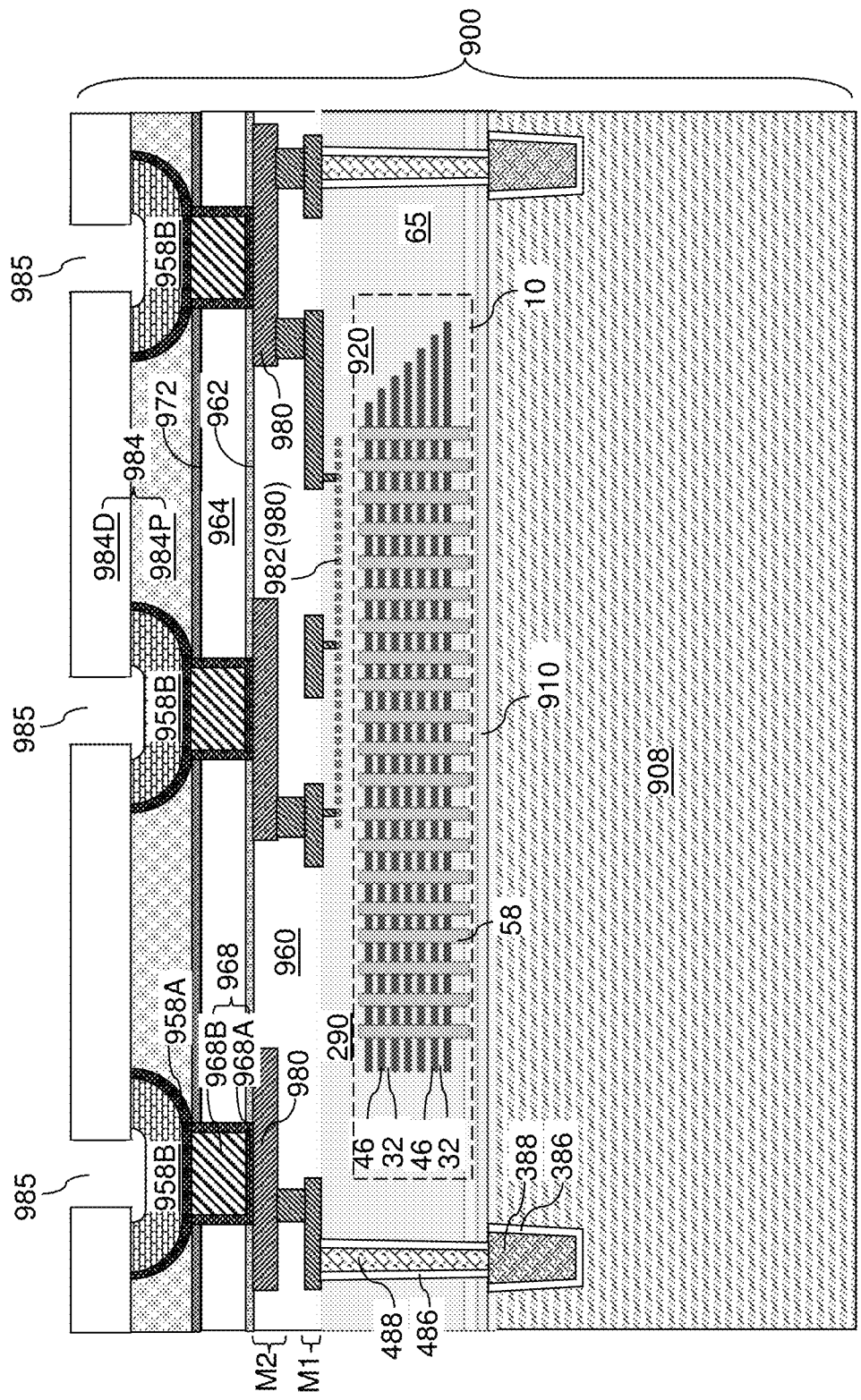
FIG. 3E is a schematic vertical cross-sectional view of the second configuration of the first semiconductor die after formation of first pad base portions according to the second embodiment of the present disclosure.

Referring to FIG. 3E, a metallic material that deposits selectively on metallic surfaces and does not deposit on dielectric surfaces can be deposited within volumes of the first pad base cavities 975 to form first pad base plate portions 958B. The first pad base plate portions 958B can include a metal such as copper, tungsten, molybdenum, ruthenium, cobalt, or a combination thereof. The first pad base plate portions 958B may include the same material as, or may include a different material from, the material of the first metallic liners 958A. The first pad base plate portions 958B can be deposited by electroplating, electroless plating or by chemical vapor deposition. In one embodiment, the first pad base cavities 975 may be completely filled with the first metallic liners 958A and the first pad base plate portions 958B. In another embodiment, the first pad base cavities 975 may be partially filled with the first metallic liners 958A and the first pad base plate portions 958B. Each contiguous combination of first metallic liner 958A and a first pad base plate portion 958B constitutes a first pad base portion (958A, 958B). Each first pad base portion (958A, 958B) is embedded in the first proximal pad-level dielectric layer 984P.

Figure 3F:
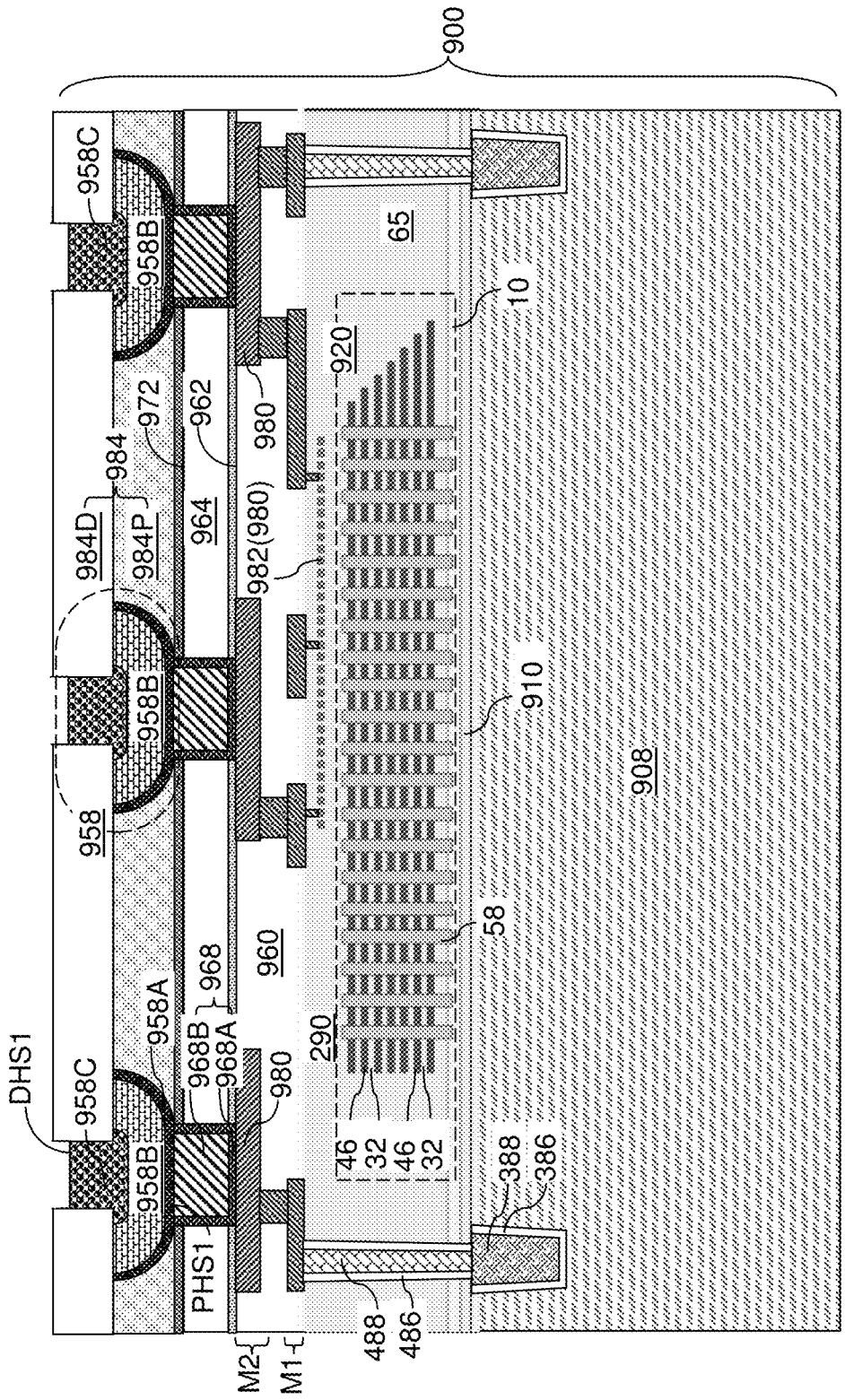
FIG. 3F is a schematic vertical cross-sectional view of the second configuration of the first semiconductor die after formation of first pad pillar portions according to the second embodiment of the present disclosure.

Referring to FIG. 3F, a first metallic pillar fill material can be deposited in the first pillar cavities 985. The first metallic pillar fill material may be the same as, or may be different from, the first metallic pad fill material of the first pad base plate portion 978B. The first metallic pillar fill material can include copper, tungsten, molybdenum, cobalt, ruthenium, or a combination thereof. In an illustrative example, if the first metallic pillar fill material includes copper, the first metallic pillar fill material may be deposited by a combination of a copper seed layer deposition process employing physical vapor deposition and a copper electroplating process that fills remaining volumes of the first pad base cavities.

Excess portions of the first metallic pillar fill material overlying the horizontal plane including the distal horizontal surface (i.e., the top surface) of the first distal pad-level dielectric layer 984D can be removed by a planarization process such as chemical mechanical planarization. Remaining portions of the first metallic pillar fill material that fill the first pillar cavities 985 constitute first pad pillar portions 958C. Top surfaces of the first pad pillar portions 958C can be vertically recessed, for example, by overpolishing and/or a recess etch, to be located below the horizontal plane including the distal horizontal surface (i.e., the top surface) of the first distal pad-level dielectric layer 984D. The vertical recess distance is selected so that volume expansion of the materials of the first pad base portions (958A, 958B) and the first pad pillar portions 958C causes the top surface of the first pad pillar portions 958C to be flush with the distal horizontal surface of the first distal pad-level dielectric layer 984D at the elevated temperature of a bonding process to be subsequently employed. For example, the vertical recess distance of the top surfaces of the first pad pillar portion 958C relative to the horizontal plane including the distal horizontal surface of the first distal pad-level dielectric layer 984D can be in a range from 10 nm to 100 nm, such as from 20 nm to 60 nm, although lesser and greater vertical recess distances may also be employed. Each first pad pillar portion 958C can be formed in a respective first pillar cavity 985 directly on the top surface of a respective first pad base portion (958A, 958B).

Each contiguous combination of a first pad base portion (958A, 958B) and a first pad pillar portion 958C constitutes a first bonding pad 958. The combination of the first proximal pad-level dielectric layer 984P and the first distal pad-level dielectric layer 984D constitutes a first pad-level dielectric layer 984 that laterally surrounds, and embeds, the first bonding pads 958. The first pad-level dielectric layer 984 is a composite layer including a layer stack of the first proximal pad-level dielectric layer 984P and the first distal pad-level dielectric layer 984D.

Generally, the first bonding pads 958 in the first pad-level dielectric layer 984 can be formed such that the each of the first bonding pads 958 comprises a first proximal horizontal surface PHS1 and a first distal horizontal surface DHS1 that is more distal from the first substrate 908 than the first proximal horizontal surface PHS1 is from the first substrate 908 and has a lesser total area than a total area of the first proximal horizontal surface PHS1. The first pad-level dielectric layer 984 overlies the first interconnect-level dielectric material layers (290, 960) and embeds the first bonding pads 958.

Each of the first bonding pads 958 comprises a first pad base portion (958A, 958B) embedded in the first proximal pad-level dielectric layer 984P and a first pad pillar portion 958C contacting the first distal pad-level dielectric layer 984D. The first pad base portions (958A, 958B) are formed within the first proximal pad-level dielectric layer 984P after formation of the first distal pad-level dielectric layer 984D.

In one embodiment, planar distal surfaces of each first pad base portion (958A, 958B) contacts portions of a proximal horizontal surface of the first distal pad-level dielectric layer 984D. In one embodiment, each first pad base portion (958A, 958B) comprises a stack of a first metallic liner 958A and a pad base plate portion 958B. Each first pad pillar portion 958C contacts a sidewall of the first distal pad-level dielectric layer 984D. In one embodiment, each of the first bonding pads 58 consists of a first pad base portion (958A, 958B) and a single first pad pillar portion 958C. In on embodiment, each first pad base portion (958A, 958B) comprises a convex sidewall that vertically extends from a proximal horizontal surface of the first proximal pad-level dielectric layer 984P to a distal horizontal surface of the first proximal pad-level dielectric layer 984P.

Figure 3G:
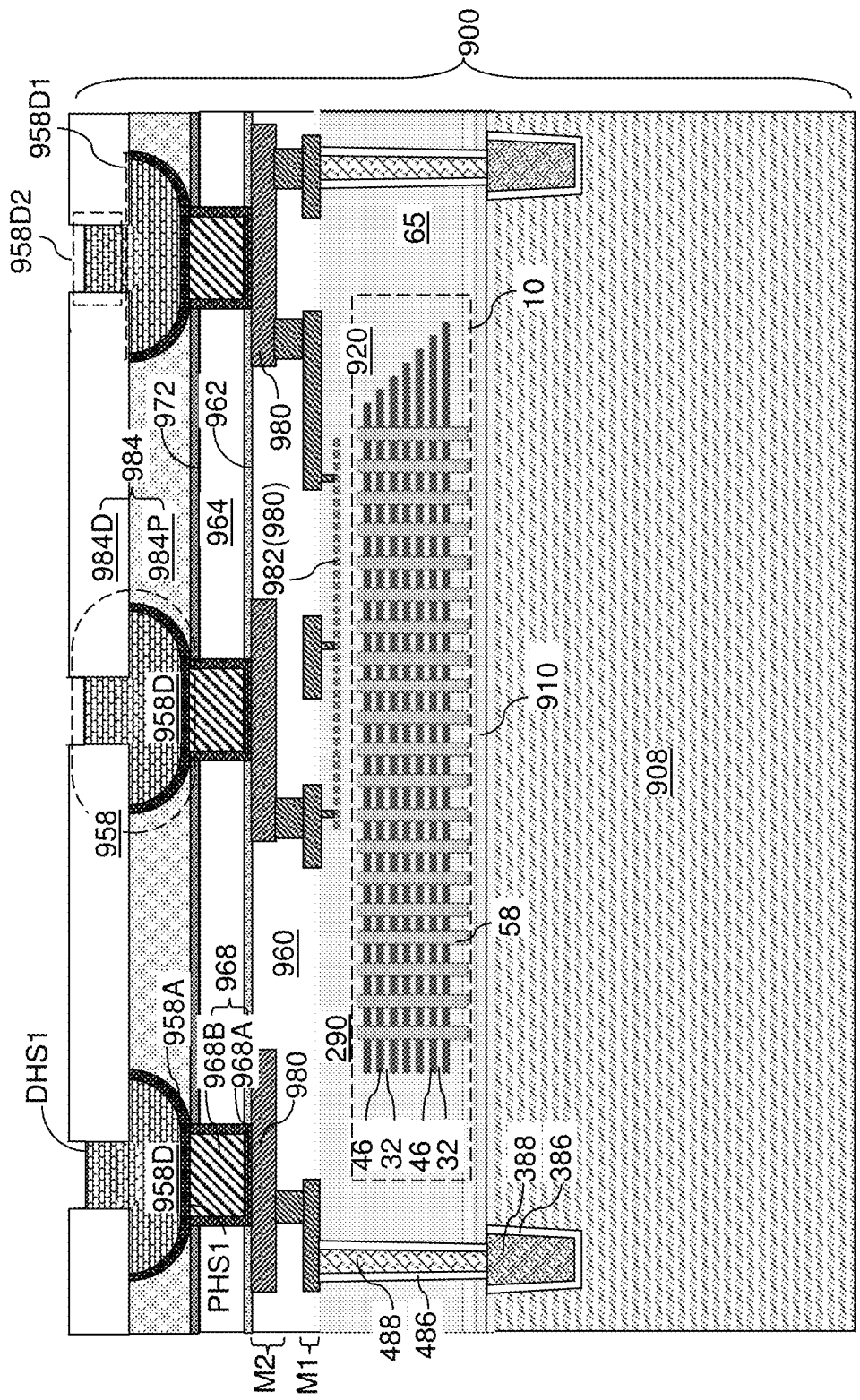
FIG. 3G is a schematic vertical cross-sectional view of a variant of the second configuration of the first semiconductor die according to the second embodiment of the present disclosure.

Referring to FIG. 3G, a variant of the second configuration of the first semiconductor die 900 can be derived from the second configuration of the first semiconductor die 900 illustrated in FIG. 3E by continuing the deposition process of the bonding pads 958 until the metallic material of the first pad base plate portions 958B fills the volumes of the first pillar cavities 585 to form the first pad pillar portions 958C described above. In this case, a first integrated pad base and pillar fill material portion 958D is formed in lieu of a combination of a first pad base plate portions 958B and a first pad pillar portion 958C. A planarization process and/or a recess etch process may be optionally performed to form top surfaces of the first integrated pad base and pillar fill material portions 958D. Each first bonding pad 958 can include a first metallic liner 958A and a first integrated pad base and pillar fill material portion 958D. A contiguous combination of a first metallic liner 958A and a lower portion of each first integrated pad base and pillar fill material portion 958D comprises a first pad base portion 958D1, and an upper portion of each first integrated pad base and pillar fill material portion 958D comprises a first pad pillar portion 958D2.

Figure 3H:
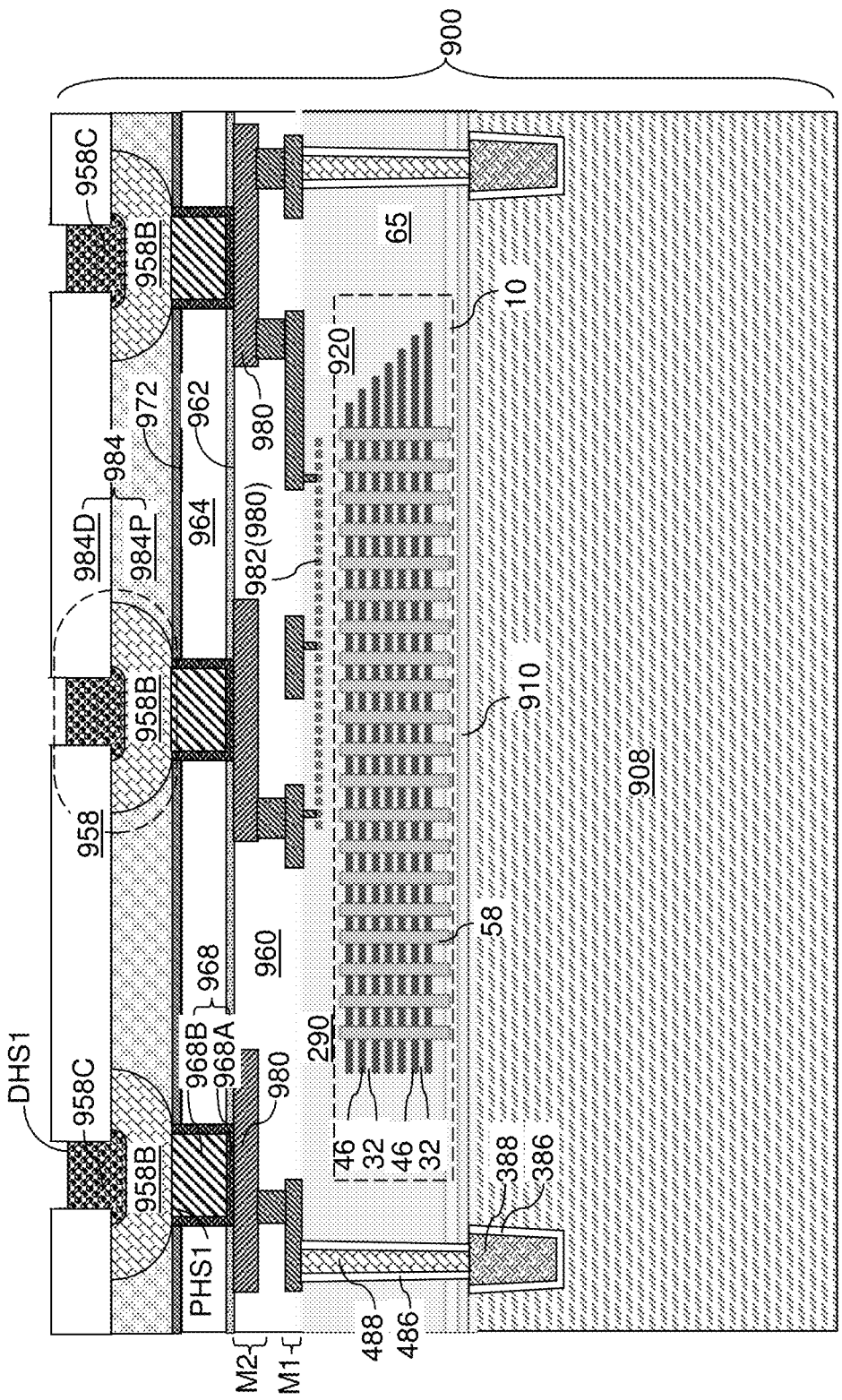
FIG. 3H is a schematic vertical cross-sectional view of another variant of the second configuration of the first semiconductor die according to the second embodiment of the present disclosure.

Referring to FIG. 3H, another variant of the second configuration of the first semiconductor die 900 can be derived from the second configuration of the first semiconductor die of FIG. 3F by omitting formation of the first metallic liners 958A. In this case, the first pad base plate portions 958B can include a metallic material that selectively nucleates on the first dielectric material of the first proximal pad-level dielectric layer 984P and on the surfaces of the first pad-connection via structures 968 without deposition on the physically exposed surfaces of the first distal pad-level dielectric layer 984D. For example, the first pad base plate portions 958B can include ruthenium or molybdenum.

Referring to variants of the second configuration shown in FIGS. 3F-3H, a first pad-level dielectric layer 984 can overlie the first interconnect-level dielectric material layers (290, 960), and can embed first bonding pads 958. Each of the first bonding pads 958 can comprise a first proximal horizontal surface PHS1 and a first distal horizontal surface DHS1, which is more distal from the first substrate 908 than the first proximal horizontal surface PHS1 is from the first substrate 908 and has a lesser total area than a total area of the first proximal horizontal surface PHS1. In one embodiment, each of the first bonding pads 958 consists of the first pad base portion {(958A, 958B), (958A, 958D1), 958B} and a single first pad pillar portion (958C, 958D2). In another embodiment, a plurality of first pad pillar portions (958C, 958D2) may be formed on a same first pad base portion {(958A, 958B), (958A, 958D1), 958B}. In this case, a plurality of first pillar cavities 985 can be formed in proximity to each other, and a first pad base cavity 975 can underlie, and can be connected to, the plurality of first pillar cavities 985. The first pad base cavity 975 and the plurality of first pillar cavities 985 can be filled with at least one conductive material to form the first bonding pads 958.

In one embodiment, the first pad-level dielectric layer 984 comprises a stack of a proximal pad-level dielectric layer 984P and a distal pad-level dielectric layer 984D, and each of the first bonding pads 958 comprises a first pad base portion {(958A, 958B), (958A, 958D1), 958B} embedded in the first proximal pad-level dielectric layer 984P and at least one first pad pillar portion (958C, 958D2) contacting the first distal pad-level dielectric layer 984D.

In one embodiment, a planar distal surface of the first pad base portion {(958A, 958B), (958A, 958D1), 958B} contacts portions of a proximal horizontal surface of the first distal pad-level dielectric layer 984D. In one embodiment, the first pad base portion {(958A, 958B), (958A, 958D1)} comprises a stack of a first metallic liner 958 and a pad base plate portion (958B or a lower portion of 958D), and each first pad pillar portion (958C, 958D2) contacts a sidewall of the first distal pad-level dielectric layer 984D.

In one embodiment, the first pad base portion {(958A, 958B), (958A, 958D1), 958B} comprises a convex sidewall that vertically extends from a proximal horizontal surface of the first proximal pad-level dielectric layer 984P to a distal horizontal surface of the first proximal pad-level dielectric layer 984P. In one embodiment, an interface between the first pad base portion {(958A, 958B), 958B} and the at least one first pad pillar portion 958C is located underneath a horizontal plane including a horizontal interface between the first proximal pad-level dielectric layer 984P and the first distal pad-level dielectric layer 984D. Generally, the growth rate of the material of the 958B from the concave sidewalls of the first proximal pad-level dielectric layer 984P can be isotropic. In this case, an interface between the first pad base portion {(958A, 958B), 958B} and the at least one first pad pillar portion 958C (i.e., an interface between a first pad base plate portion 958B and a first pad pillar portion 958C) may be located within a curved surface that is equidistant from the convex sidewall of a respective first bonding pad 958.

Figure 4A:
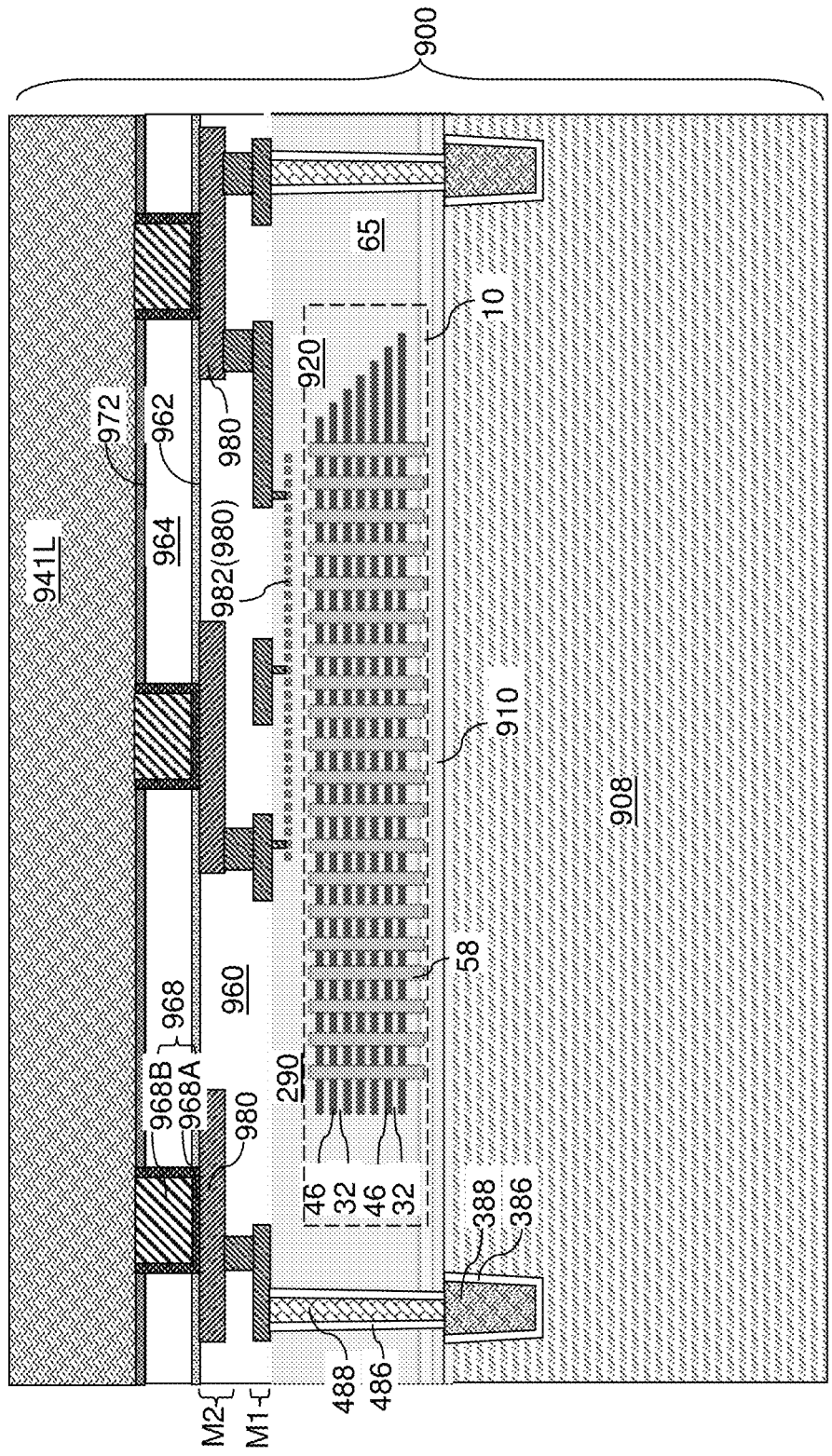
FIG. 4A is a schematic vertical cross-sectional view of a third configuration of the first semiconductor die after formation of a sacrificial material layer according to a third embodiment of the present disclosure.

Referring to FIG. 4A, a third configuration of the first semiconductor die 900 can be derived from the first semiconductor die 900 of FIG. 1A by depositing a sacrificial material layer 941L on a top surface of the first pad-level diffusion barrier layer 972 and on the physically exposed top surfaces of first pad-connection via structures 968. The sacrificial material layer 941L includes a material that can be removed selective to the materials of the first pad-level diffusion barrier layer 972 (or selective to the material of the first pad-connection-level dielectric layer 964 in case the first pad-level diffusion barrier layer 972 is omitted). For example, the sacrificial material layer 941L can include amorphous silicon, silicon nitride, borosilicate glass, organosilicate glass, organic polymer, or inorganic polymer. The thickness of the sacrificial material layer 941L may be in a range from 600 nm to 6,000 nm, although lesser and greater thicknesses may also be employed.

Figure 4B:
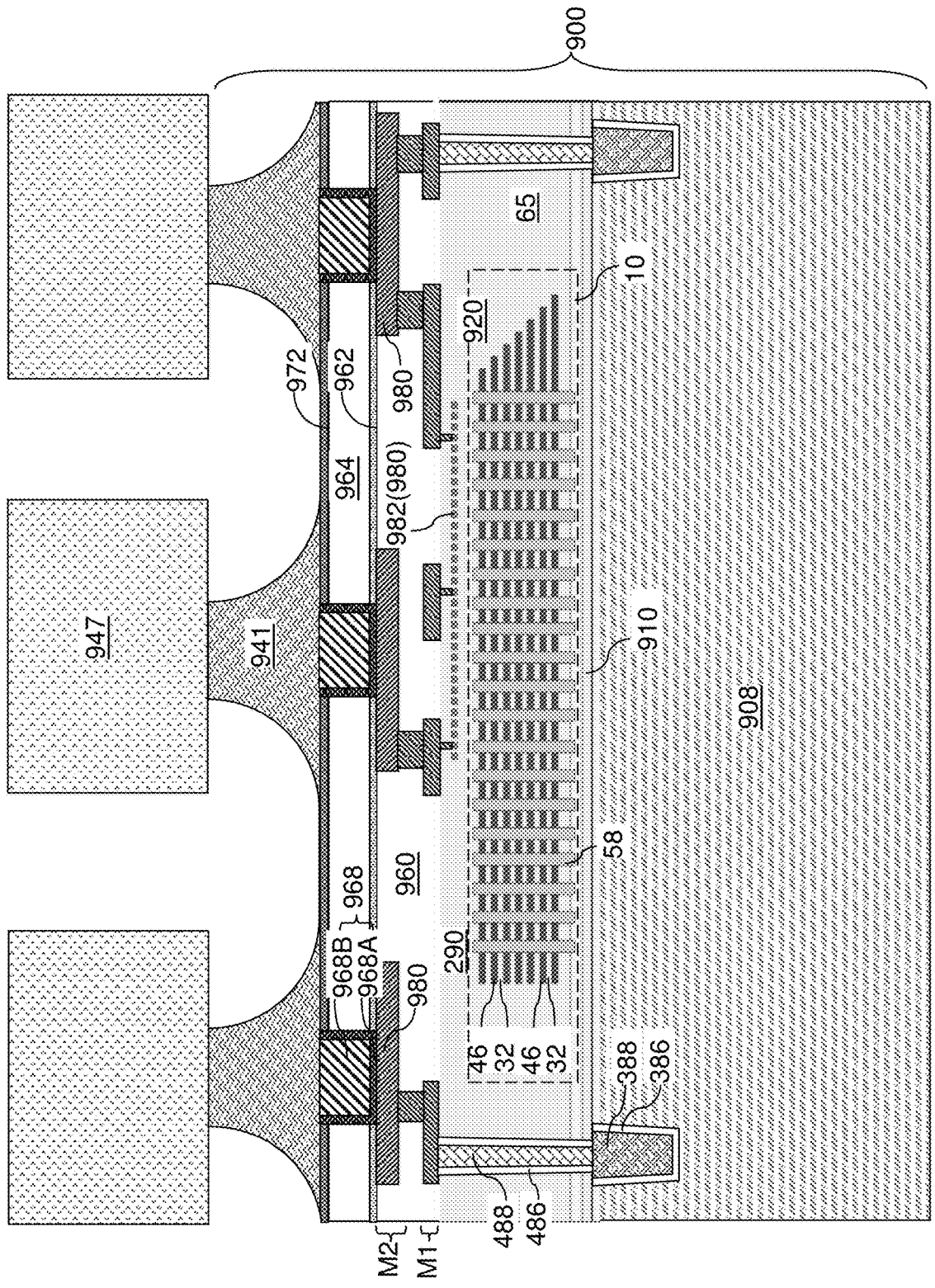
FIG. 4B is a schematic vertical cross-sectional view of the third configuration of the first semiconductor die after patterning the sacrificial material layer into sacrificial mesa structures according to the third embodiment of the present disclosure.

Referring to FIG. 4B, discrete etch mask material portions 947 can be formed over the sacrificial material layer 941L such that each area of the first pad-connection via structures 968 is covered by a respective one of the discrete etch mask material portions 947. In one embodiment, the etch mask material portions 947 may include patterned discrete portions of a photoresist material formed by application and lithographic patterning of a photoresist material layer. Alternatively, a hard mask material layer can be deposited and lithographically patterned to form the discrete etch mask material portions 947. The discrete etch mask material portions 947 can have horizontal cross-sectional shapes of first bonding pads to be subsequently formed with an optional offset outward from a periphery of a respective first bonding pad in a plan view.

An isotropic etch process can be subsequently performed to isotropically etch unmasked portions of the sacrificial material layer 941L selective to the material of the first pad-level diffusion barrier layer 972 (or selective to the material of the first pad-connection-level dielectric layer 964 in case the first pad-level diffusion barrier layer 972 is omitted). Unmasked portions of the sacrificial material layer 941L are isotropically etched employing the discrete etch mask material portions 947 as an etch mask. Patterned remaining portions of the sacrificial material layer 941L comprise sacrificial mesa structures 941. Each sacrificial mesa structure 941 can be formed on a top surface of a respective one of the first pad-connection via structures 968. Each sacrificial mesa structure 941 has a proximal horizontal surface (a bottom surface) that is proximal to the first substrate 908, a distal horizontal surface (a top surface) that is distal from the first substrate 908, and a set of at least one concave sidewall that continuously extends from a periphery of the proximal horizontal surface to a periphery of the distal horizontal surface. The distal horizontal surface of each sacrificial mesa structure 941 has a lesser area than the proximal horizontal surface of the sacrificial mesa structure 941. The periphery of the distal horizontal surface of each sacrificial mesa structure 941 is laterally offset inward from the periphery of the proximal horizontal surface of the sacrificial mesa structure 941 by a uniform lateral offset distance in a plan view, i.e., a view along a direction perpendicular to the top surface of the first substrate 908. The discrete etch mask material portions 947 can be subsequently removed, for example, by ashing.

Figure 4C:
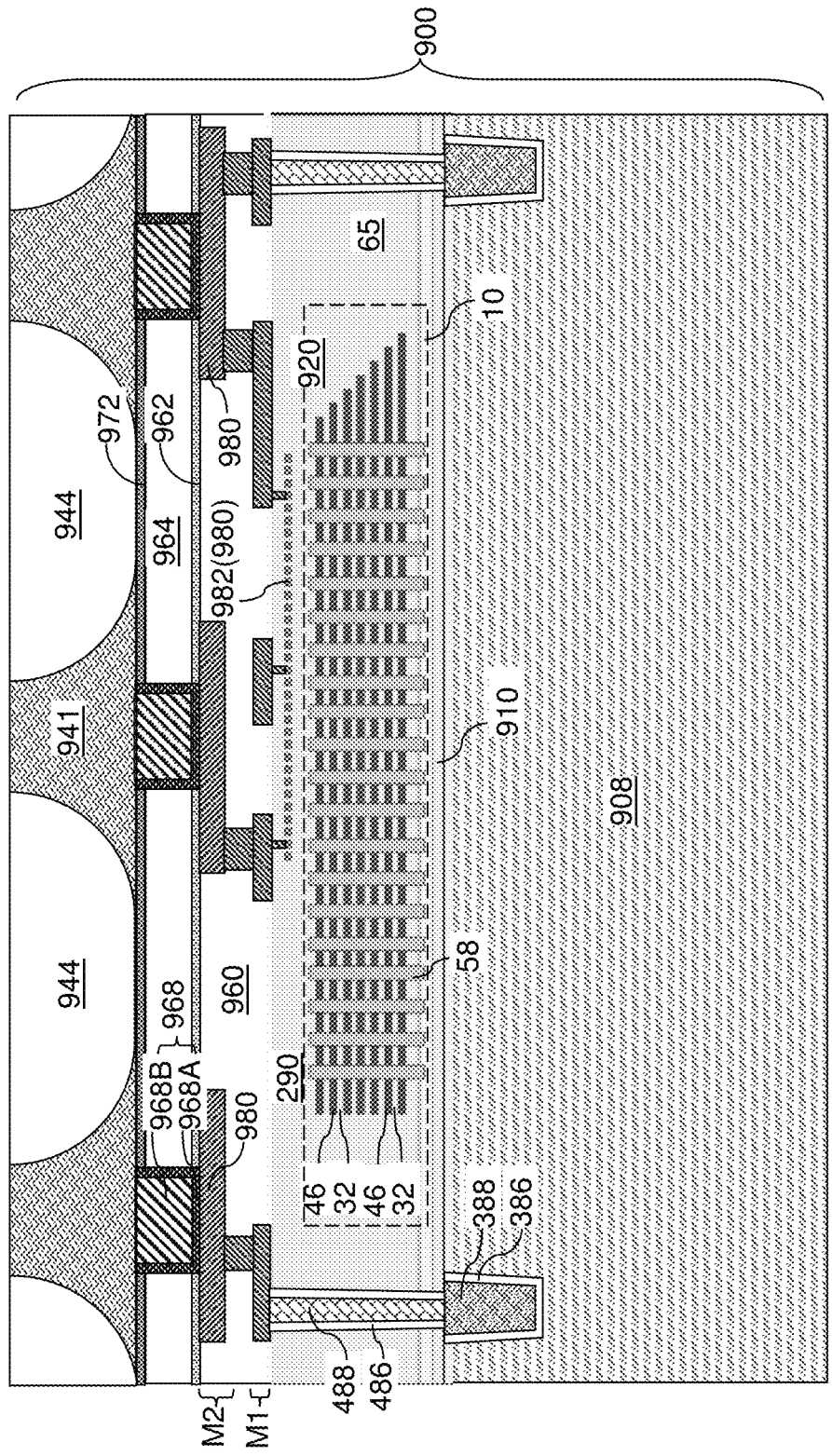
FIG. 4C is a schematic vertical cross-sectional view of the third configuration of the first semiconductor die after formation of a first pad-level dielectric layer according to the third embodiment of the present disclosure.

Referring to FIGS. 4C and 4D, a dielectric material that is different from the material of the sacrificial mesa structures 941 can be deposited in gaps in the array of sacrificial mesa structures 941 and over the array of sacrificial mesa structures 941. The deposited dielectric material can be subsequently planarized, for example, employing chemical mechanical planarization and/or a recess etch. Portions of the deposited dielectric material overlying the horizontal plane including the top surface of the sacrificial mesa structures 941 can be removed by the planarization process. A remaining continuous portions of the deposited dielectric material forms a first pad-level dielectric layer 944.

Figure 4E:
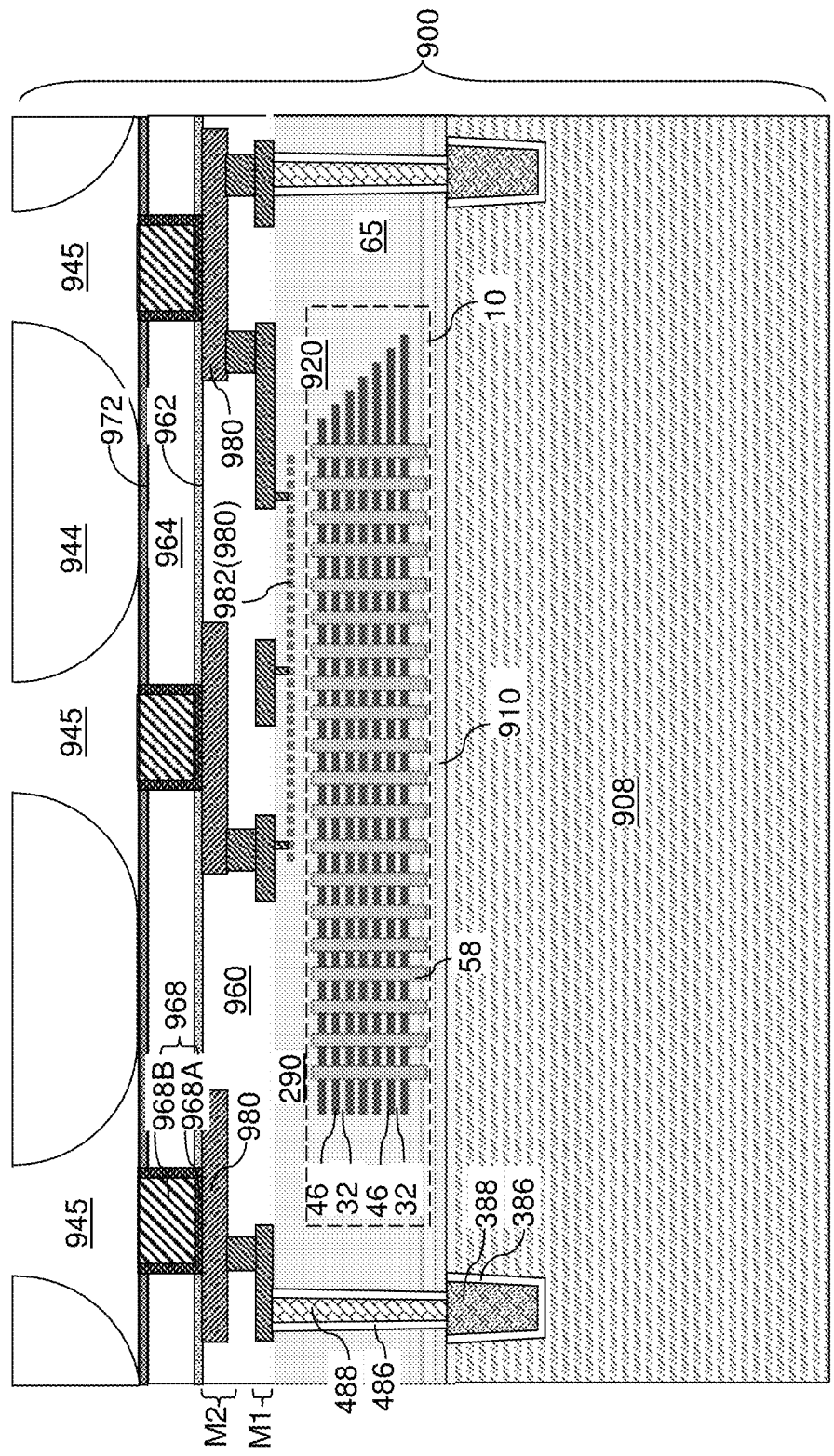
FIG. 4E is a schematic vertical cross-sectional view of the third configuration of the first semiconductor die after formation of a first cavities according to the third embodiment of the present disclosure.

Referring to FIG. 4E, a selective etch process that etches the material of the sacrificial mesa structures 941 selective to the material of the first pad-level dielectric layer 944 can be performed. For example, if the sacrificial mesa structures 941 comprise amorphous silicon, a wet etch process using hot trimethyl-2 hydroxyethyl ammonium hydroxide ("hot TMY") or tetramethyl ammonium hydroxide (TMAH) may be performed to remove the sacrificial mesa structures 941 selective to the first pad-level dielectric layer 944. If the sacrificial mesa structures 941 include silicon nitride, a wet etch process employing hot phosphoric acid can be performed to remove the sacrificial mesa structures 941 selective to the first pad-level dielectric layer 944. A pad cavity 945 can be formed in each volume from which a sacrificial mesa structure 941 is removed.

Figure 4F:
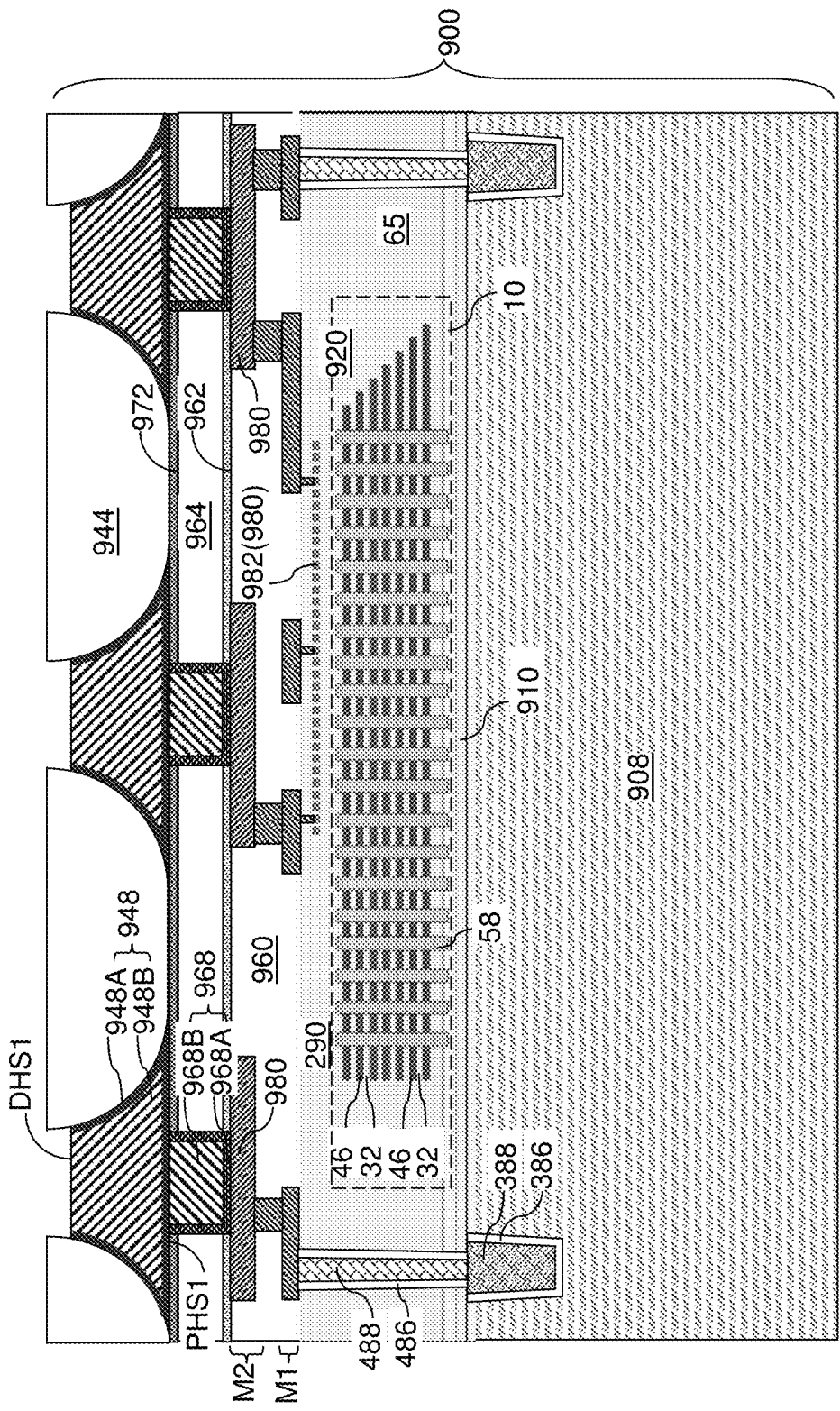
FIG. 4F is a schematic vertical cross-sectional view of the third configuration of the first semiconductor die after formation of a first bonding pads according to the third embodiment of the present disclosure.

Referring to FIGS. 4F and 4G, at least one conductive material can be deposited in the first pad cavities 945. For example, a first metallic liner layer and a first metallic pad fill material can be sequentially deposited in the first pad cavities 945. The first metallic liner layer includes a metallic barrier material. The metallic barrier material may include a metallic nitride material such as TiN, TaN, and/or WN, and/or may include an elemental metal or an intermetallic alloy that can function as a barrier for diffusion of a metallic material. The conductive metallic barrier material can block diffusion of copper. The first metallic liner layer can be deposited by a conformal deposition process such as chemical vapor deposition. The first metallic liner may be deposited directly on physically exposed surfaces of the is formed on top surfaces of the first pad-connection via structures 968, and directly on physically exposed surfaces of the first pad-level dielectric layer 944 and on physically exposed surfaces of the optional first pad-level diffusion barrier layer 972 (or on physically exposed surfaces of the first pad-connection-level dielectric layer 964). The thickness of the first metallic liner layer may be in a range from 4 nm to 80 nm, such as from 8 nm to 40 nm, although lesser and greater thicknesses can also be employed. The first metallic pad fill material can include copper, tungsten, molybdenum, cobalt, ruthenium, or a combination thereof. In an illustrative example, if the first metallic pad fill material includes copper, the first metallic pad fill material may be deposited by electroplating process. In some embodiment, a combination of at least two deposition processes interlaced with at least one etch back process may be employed to fill the volumes of the pad cavities 945 with the first metallic pad fill material.

Excess portions of the at least one conductive material can be removed from above the horizontal plane including the top surface of the first pad-level dielectric layer 944 by a planarization process such as chemical mechanical planarization. Remaining portions of the first metallic pad fill material and the first metallic liner layer that fill the first pad cavities 945 constitute first bonding pads 948. Each first bonding pad 948 can include a first metallic liner 948A and a first metallic fill material portion 948B. The first metallic liner 948A is a patterned remaining portion of the first metallic liner layer, and the first metallic fill material portion 948B is a patterned remaining portion of the first metallic pad fill material.

Top surfaces of the first bonding pads 948 can be vertically recessed, for example, by overpolishing and/or a recess etch, to be located below the horizontal plane including the distal horizontal surface (i.e., the top surface) of the first pad-level dielectric layer 944. The vertical recess distance is selected so that volume expansion of the materials of the first bonding pads 948 causes the top surface of the first bonding pads 948 to be flush with the horizontal surface of the first pad-level dielectric layer 944 at the elevated temperature of a bonding process to be subsequently employed. For example, the vertical recess distance of the top surfaces of the first bonding pads 948 relative to the horizontal plane including the distal horizontal surface of the first pad-level dielectric layer 944 can be in a range from 10 nm to 100 nm, such as from 20 nm to 60 nm, although lesser and greater vertical recess distances may also be employed.

The first bonding pads 948 are formed in the first pad cavities 945 directly on the top surfaces of the first pad-connection via structures 968. Each of the first bonding pads 948 comprises, and/or consists of, a first metallic liner 948A comprising a metallic barrier material, and a first metallic fill material portion 948B embedded in the metallic liner 948A. The first pad-connection-level dielectric layer 964 can be located between the first interconnect-level dielectric material layers (290, 960) and the first pad-level dielectric layer 944, and can embed first pad-connection via structures 968 having a respective distal surface that is in contact with a respective one of the first bonding pads 948 and having a lesser area than an area of a horizontal surface of the respective one of the first bonding pads 948.

Generally, the sacrificial mesa structures 941 are replaced with the first bonding pads 948 by removing the sacrificial mesa structures 941 selective to the first pad-level dielectric layer 944. The first bonding pads 948 comprise concave sidewalls that contact convex sidewalls of the first pad-level dielectric layer 944.

Each of the first bonding pads 948 comprises a first proximal horizontal surface PHS1 and a first distal horizontal surface DHS1 that is more distal from the first substrate 908 than the first proximal horizontal surface PHS1 is from the first substrate 908. The first distal horizontal surface DHS1 has a lesser total area than a total area of the first proximal horizontal surface PHS1. In one embodiment, each of the first bonding pads 948 comprises: a first metallic liner 948A including a horizontally-extending portion and a sidewall portion that contacts the first pad-level dielectric layer 944, and a first metallic fill material portion 948B that is embedded in the first metallic liner 948A, is not in direct contact with the first pad-level dielectric layer 944, and is laterally spaced from the first pad-level dielectric layer 944. Each of the first metallic liners 948A extends from a first proximal horizontal surface PHS1 of a respective one of the first bonding pads 948 to a first distal horizontal surface DHS1 of the respective one of the first bonding pads 948.

The first distal horizontal surface DHS1 is connected to the first proximal horizontal surface PHS1 by a continuous sidewall that contacts the first pad-level dielectric layer 944. In one embodiment, the continuous sidewall comprises a concave sidewall that contacts a convex sidewall of the first pad-level dielectric layer 944, as shown in FIG. 4G. A periphery DP of the first distal horizontal surface DHS1 is located entirely within a periphery PP of the first proximal horizontal surface PHS1 in a plan view along a direction that is perpendicular to a top surface of the first substrate 908. In one embodiment, the periphery PP of the first proximal horizontal surface PHS1 is laterally offset outward from the periphery DP of the first distal horizontal surface DHS1 by a uniform lateral offset distance LOD.

Figure 5A:
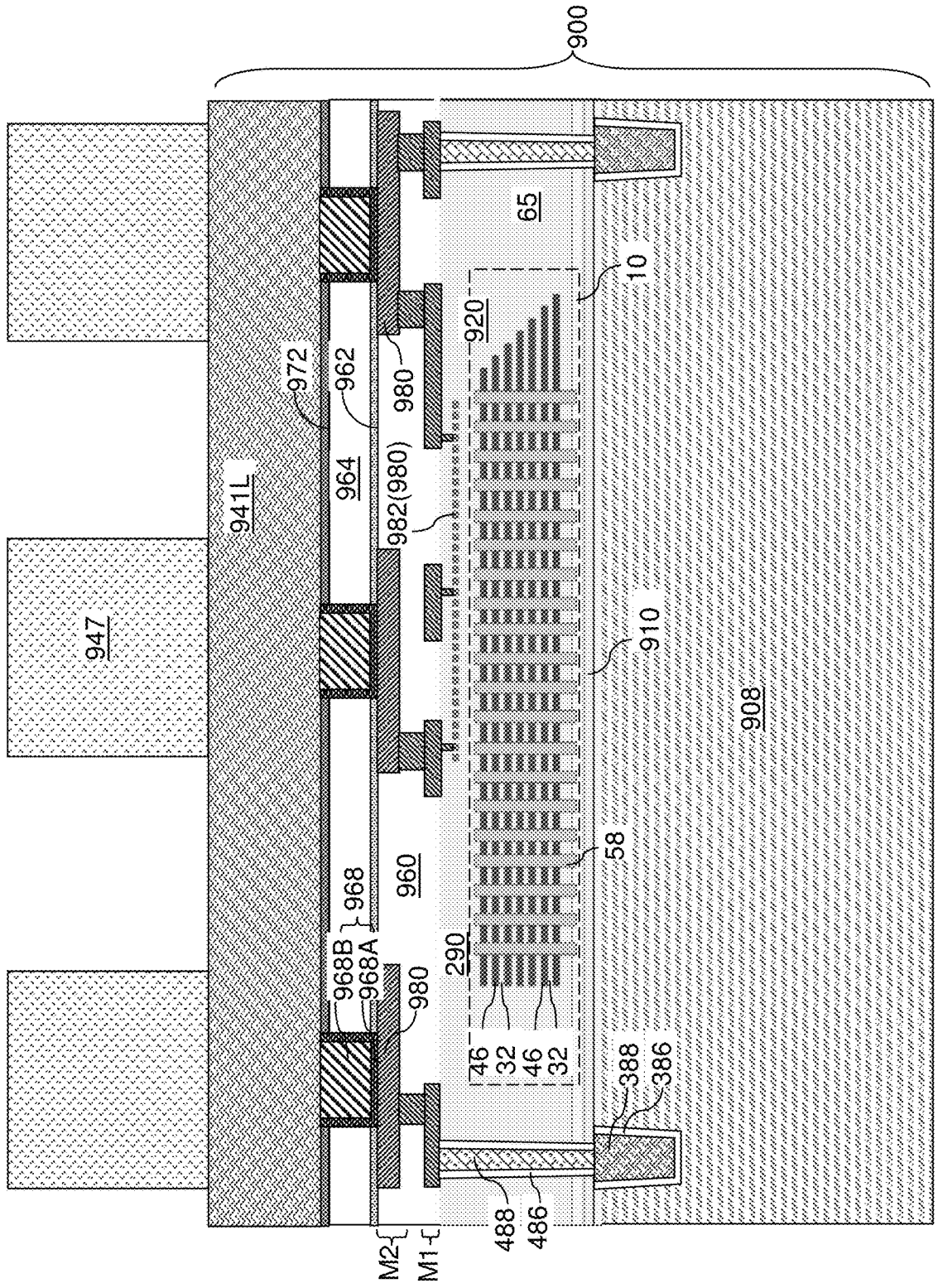
FIG. 5A is a schematic vertical cross-sectional view of a fourth configuration of the first semiconductor die after formation of a sacrificial material layer according to a fourth embodiment of the present disclosure.

Referring to FIG. 5A, a fourth configuration of the first semiconductor die 900 can be derived from the third configuration of the first semiconductor die 900 illustrated in FIG. 4A by forming discrete etch mask material portions 947 over the sacrificial material layer 941L. The sacrificial material layer 941L includes a material that can be anisotropically etched by a dry etch process such as a reactive ion etch process and/or a chemical dry etch (CDE) process. For example, the sacrificial material layer 941L in the structure of FIG. 5A may include any of the materials that can be employed for the sacrificial material layer 941L in the structure of FIG. 4A.

Each area of the first pad-connection via structures 968 is covered by a respective one of the discrete etch mask material portions 947. In one embodiment, the etch mask material portions 947 may include patterned discrete portions of a photoresist material formed by application and lithographic patterning of a photoresist material layer. Alternatively, a hard mask material layer can be deposited and lithographically patterned to form the discrete etch mask material portions 947. The discrete etch mask material portions 947 can have horizontal cross-sectional shapes of first bonding pads to be subsequently formed with an optional offset outward from a periphery of a respective first bonding pad in a plan view.

Figure 5B:
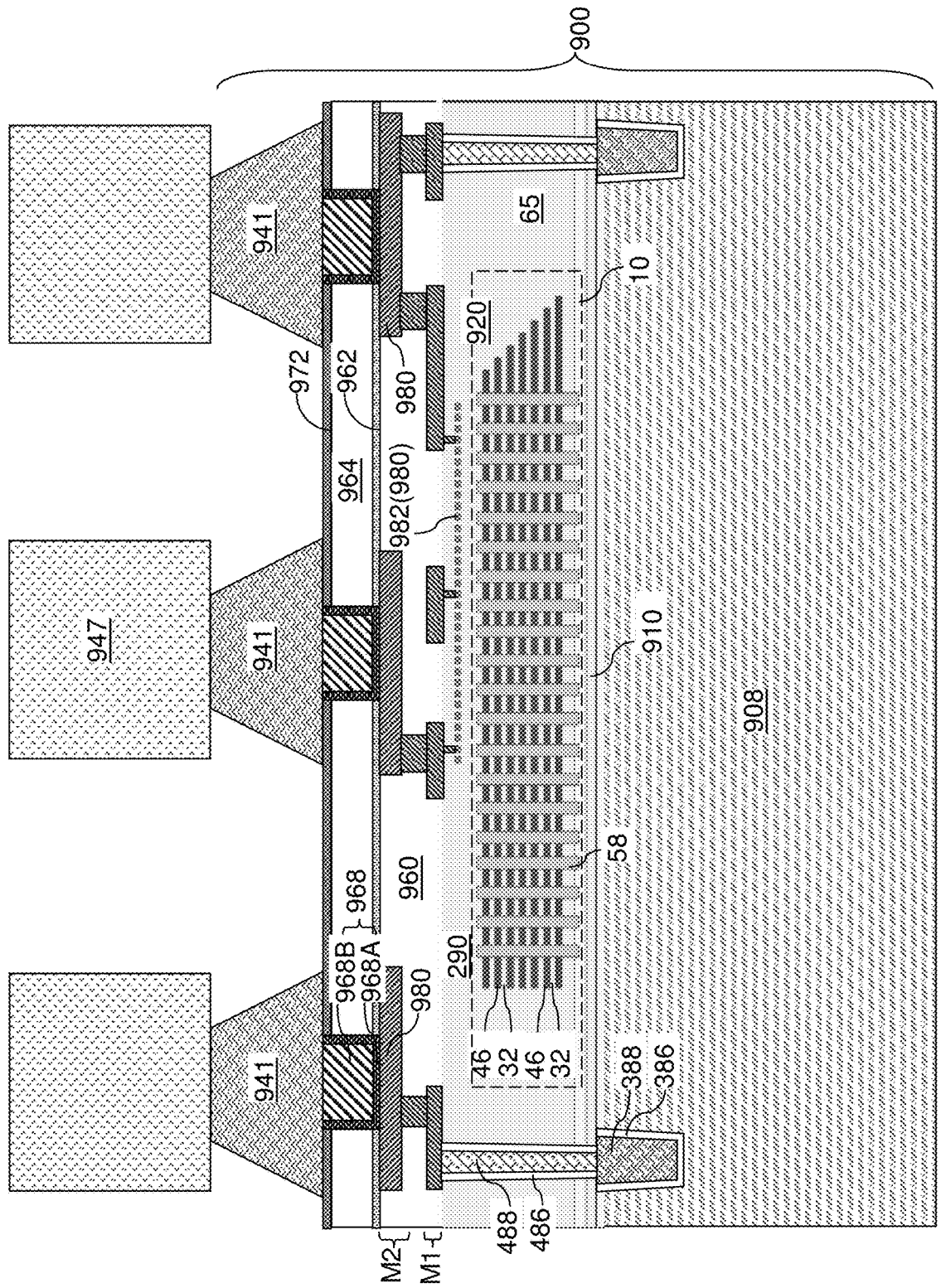
FIG. 5B is a schematic vertical cross-sectional view of the fourth configuration of the first semiconductor die after patterning the sacrificial material layer into sacrificial mesa structures according to the fourth embodiment of the present disclosure.

Referring to FIG. 5B, an anisotropic etch process can be subsequently performed to anisotropically etch unmasked portions of the sacrificial material layer 941L selective to the material of the first pad-level diffusion barrier layer 972 (or selective to the material of the first pad-connection-level dielectric layer 964 in case the first pad-level diffusion barrier layer 972 is omitted). In one embodiment, the anisotropic etch process has an isotropic etch component that causes an undercut around the periphery of each discrete etch mask material portion 947. In another embodiment, the anisotropic etch process collaterally trims the discrete etch mask material portions 947, and thereby widens the width of each etched region while the anisotropic etch process progresses. Patterned remaining portions of the sacrificial material layer 941L comprise sacrificial mesa structures 941 having tapered sidewalls. The tapered sidewalls of the sacrificial mesa structures 941 may be straight, and may have a taper angle (as measured between a two-dimensional plane including a sidewall of a sacrificial mesa structure 941 and a vertical line) in a range from 5 degrees to 45 degrees.

Each sacrificial mesa structure 941 can be formed on a top surface of a respective one of the first pad-connection via structures 968. Each sacrificial mesa structure 941 has a proximal horizontal surface (a bottom surface) that is proximal to the first substrate 908, a distal horizontal surface (a top surface) that is distal from the first substrate 908, and a set of at least one concave sidewall that continuously extends from a periphery of the proximal horizontal surface to a periphery of the distal horizontal surface. The distal horizontal surface of each sacrificial mesa structure 941 has a lesser area than the proximal horizontal surface of the sacrificial mesa structure 941. The periphery of the distal horizontal surface of each sacrificial mesa structure 941 is laterally offset inward from the periphery of the proximal horizontal surface of the sacrificial mesa structure 941 by a uniform lateral offset distance in a plan view, i.e., a view along a direction perpendicular to the top surface of the first substrate 908. The discrete etch mask material portions 947 can be subsequently removed, for example, by ashing.

Figure 5C:
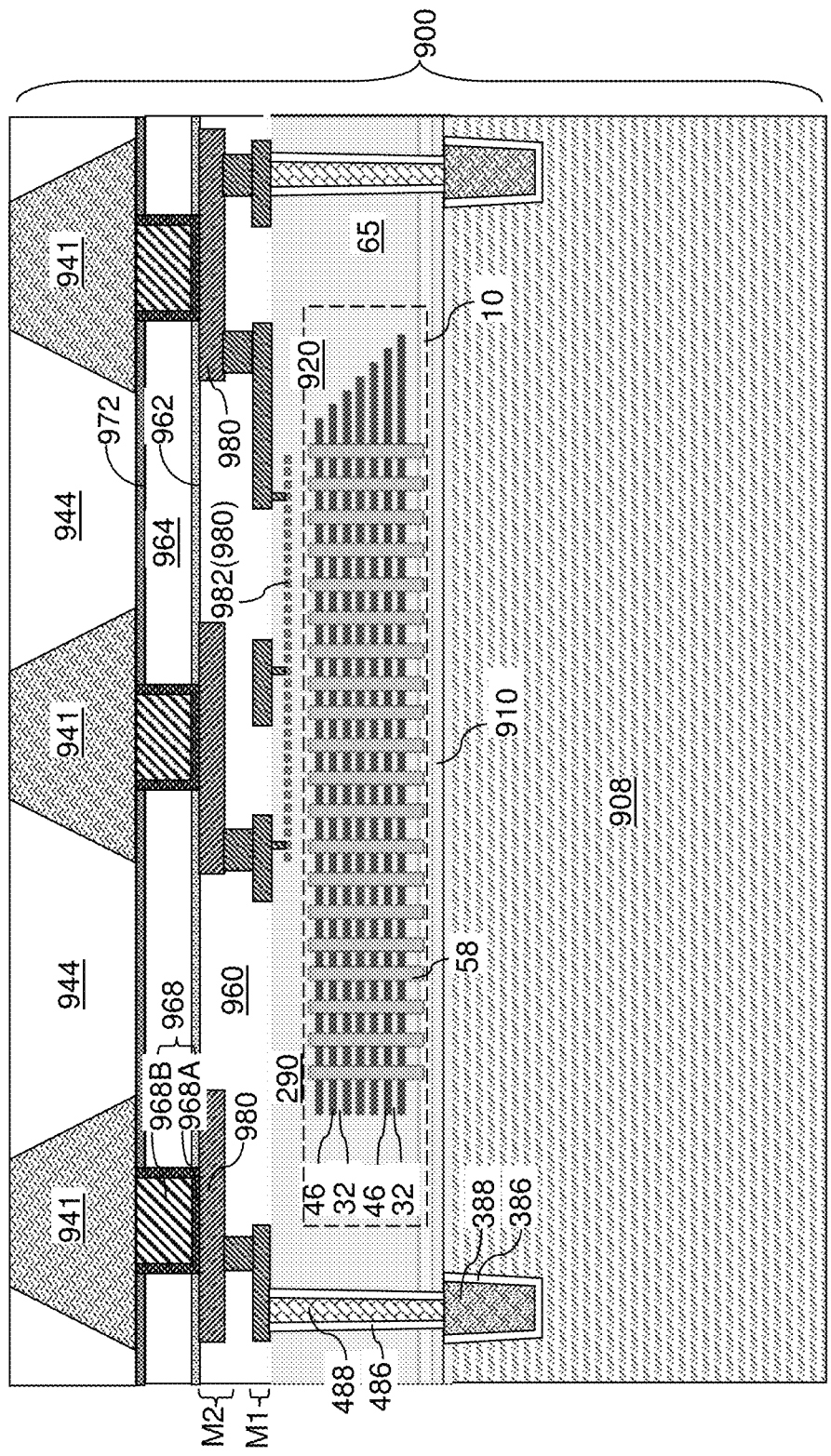
FIG. 5C is a schematic vertical cross-sectional view of the fourth configuration of the first semiconductor die after formation of a first pad-level dielectric layer according to the fourth embodiment of the present disclosure.
Figure 5D:
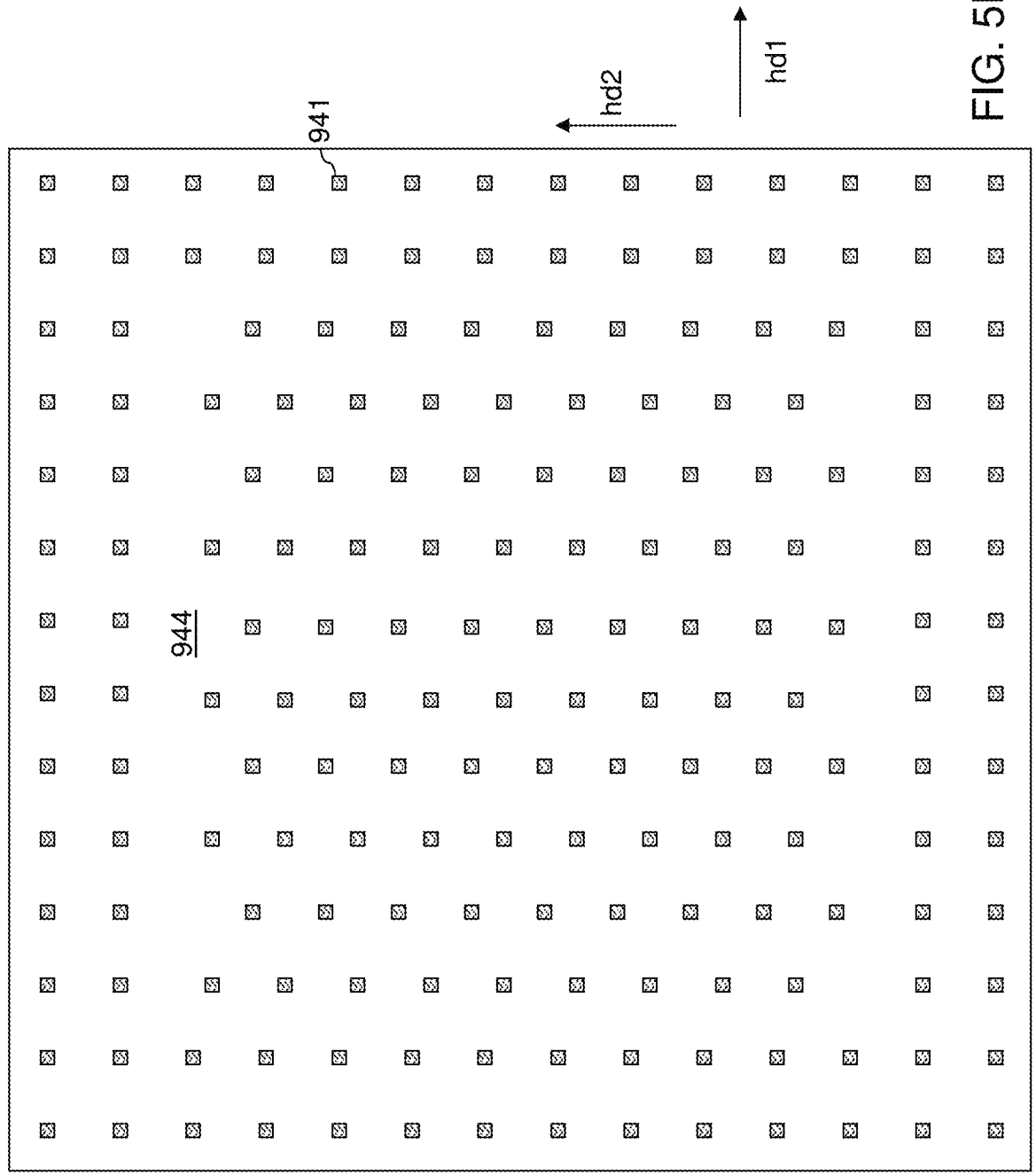
FIG. 5D is a top-down view of the fourth configuration of the first semiconductor die of FIG. 5C.

Referring to FIGS. 5C and 5D, a dielectric material that is different from the material of the sacrificial mesa structures 941 can be deposited in gaps in the array of sacrificial mesa structures 941 and over the array of sacrificial mesa structures 941. The deposited dielectric material can be subsequently planarized, for example, employing chemical mechanical planarization and/or a recess etch. Portions of the deposited dielectric material overlying the horizontal plane including the top surface of the sacrificial mesa structures 941 can be removed by the planarization process. A remaining continuous portions of the deposited dielectric material forms a first pad-level dielectric layer 944.

Figure 5E:
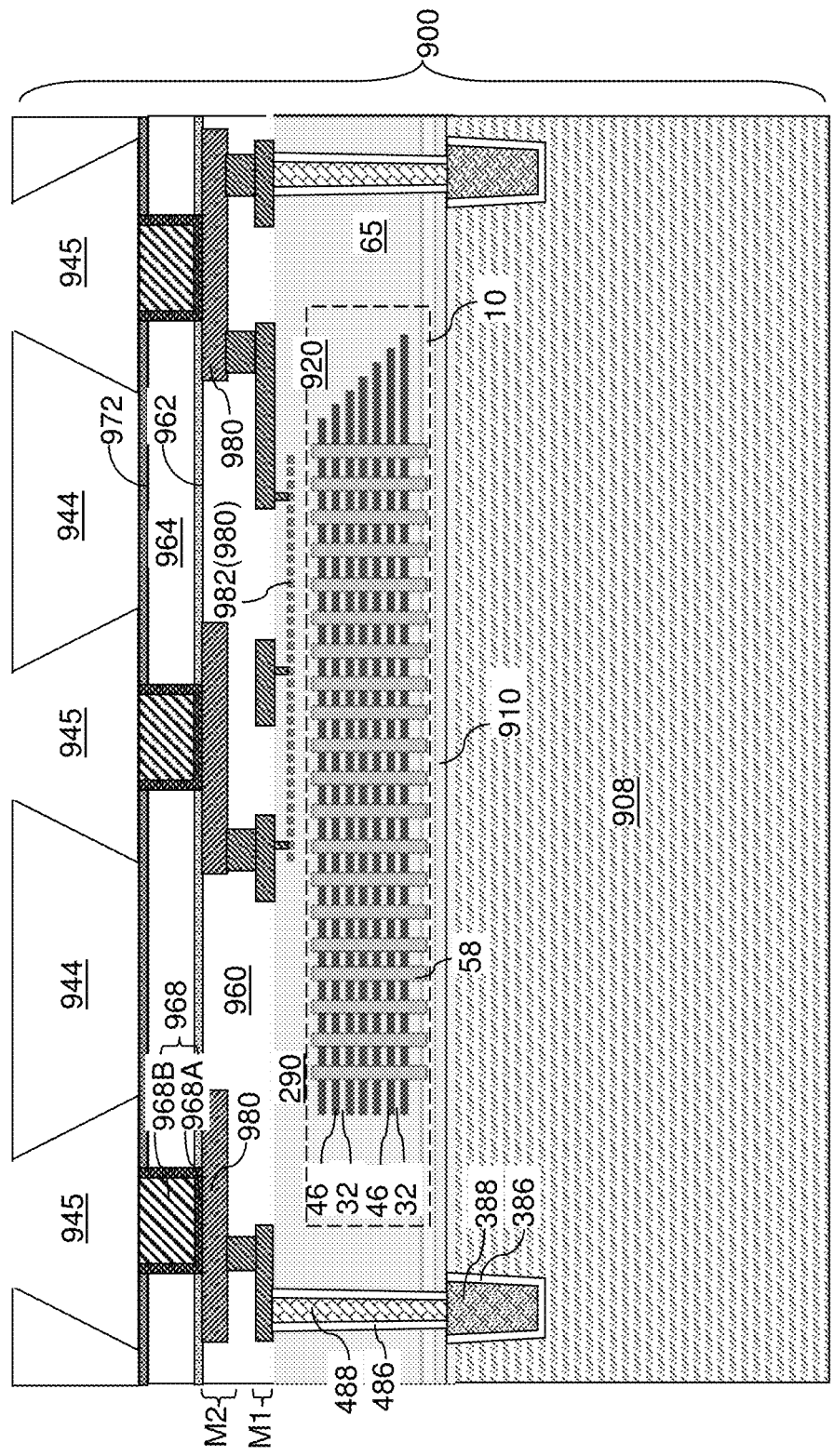
FIG. 5E is a schematic vertical cross-sectional view of the fourth configuration of the first semiconductor die after formation of a first cavities according to the fourth embodiment of the present disclosure.

Referring to FIG. 5E, a selective etch process that etches the material of the sacrificial mesa structures 941 selective to the material of the first pad-level dielectric layer 944 can be performed. For example, if the sacrificial mesa structures 941 comprise amorphous silicon, a wet etch process using hot trimethyl-2 hydroxyethyl ammonium hydroxide ("hot TMY") or tetramethyl ammonium hydroxide (TMAH) may be performed to remove the sacrificial mesa structures 941 selective to the first pad-level dielectric layer 944. If the sacrificial mesa structures 941 include silicon nitride, a wet etch process employing hot phosphoric acid can be performed to remove the sacrificial mesa structures 941 selective to the first pad-level dielectric layer 944. A pad cavity 945 can be formed in each volume from which a sacrificial mesa structure 941 is removed.

Figure 5F:
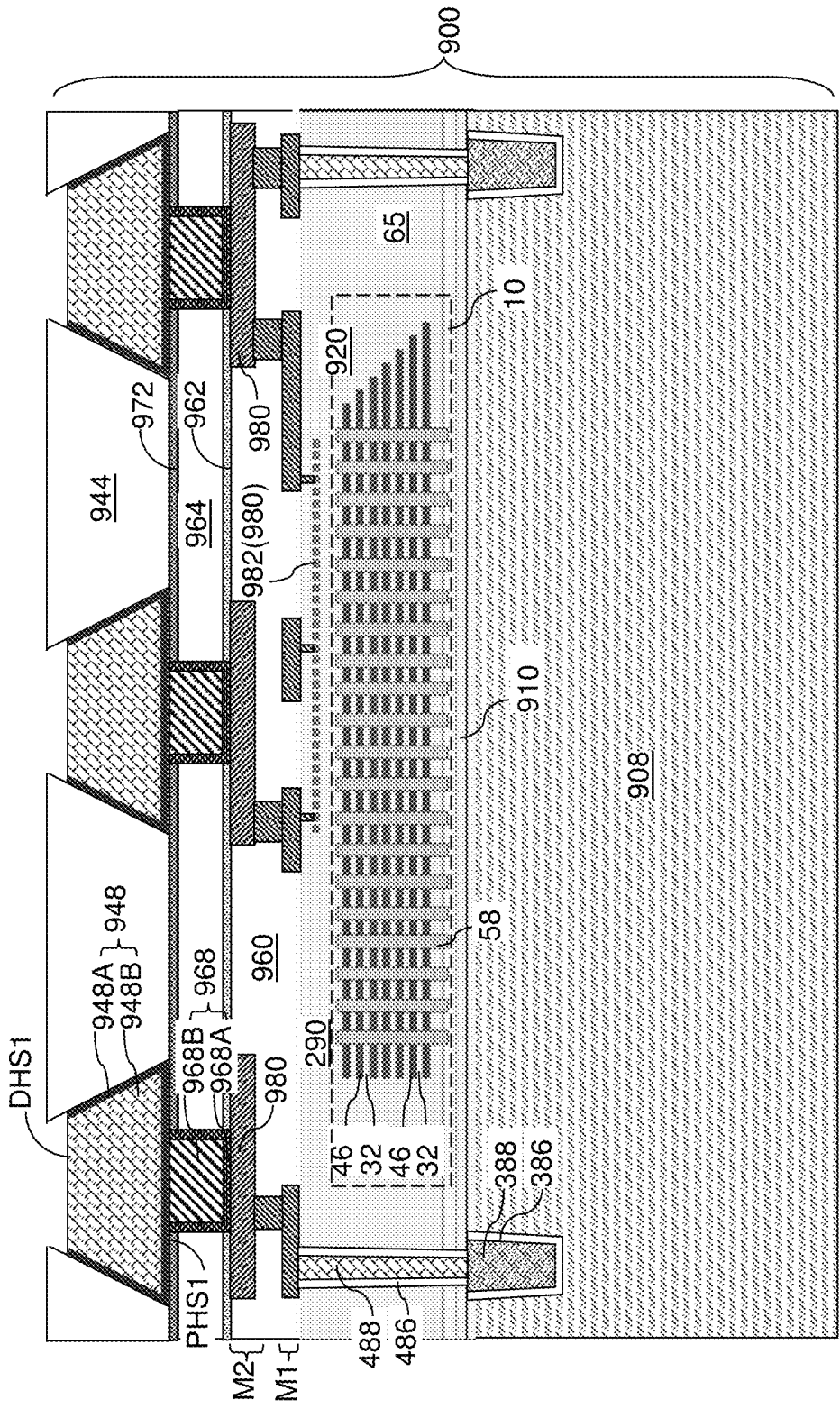
FIG. 5F is a schematic vertical cross-sectional view of the fourth configuration of the first semiconductor die after formation of a first bonding pads according to the fourth embodiment of the present disclosure.
Figure 5G:
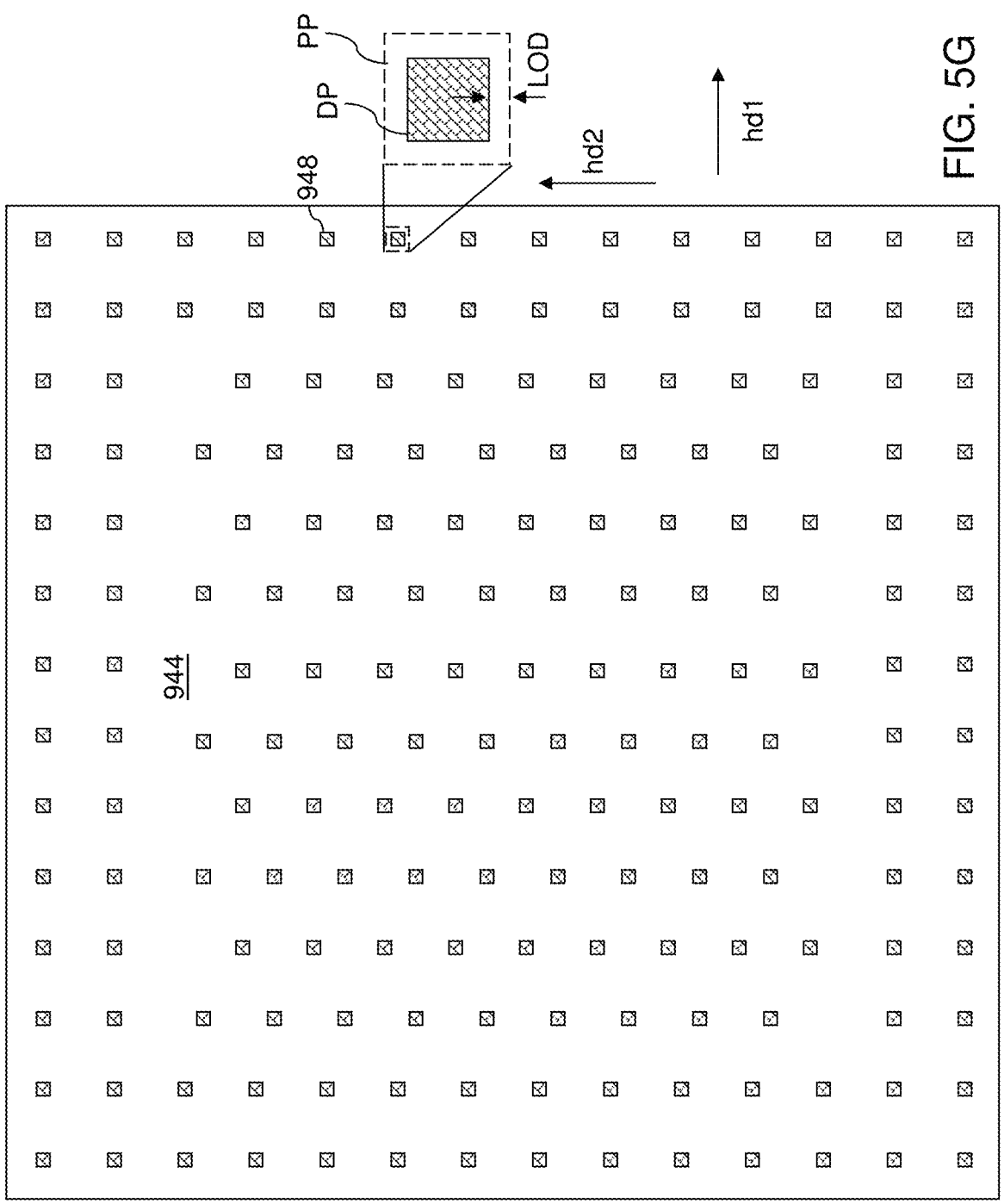
FIG. 5G is a top-down view of the fourth configuration of the first semiconductor die of FIG. 5F.

Referring to FIGS. 5F and 5G, the processing steps of FIGS. 4A and 4G can be performed to form first bonding pads 948 in the first pad cavities 945. Each first bonding pad 948 can include a first metallic liner 948A and a first metallic fill material portion 948B. Top surfaces of the first bonding pads 948 can be vertically recessed, for example, by over-polishing and/or a recess etch, to be located below the horizontal plane including the distal horizontal surface (i.e., the top surface) of the first pad-level dielectric layer 944. The vertical recess distance is selected so that volume expansion of the materials of the first bonding pads 948 causes the top surface of the first bonding pads 948 to be flush with the horizontal surface of the first pad-level dielectric layer 944 at the elevated temperature of a bonding process to be subsequently employed. For example, the vertical recess distance of the top surfaces of the first bonding pads 948 relative to the horizontal plane including the distal horizontal surface of the first pad-level dielectric layer 944 can be in a range from 10 nm to 100 nm, such as from 20 nm to 60 nm, although lesser and greater vertical recess distances may also be employed.

The first bonding pads 948 are formed in the first pad cavities 945 directly on the top surfaces of the first pad-connection via structures 968. Each of the first bonding pads 948 comprises, and/or consists of, a first metallic liner 948A comprising a metallic barrier material, and a first metallic fill material portion 948B embedded in the metallic liner 948A. The first pad-connection-level dielectric layer 964 can be located between the first interconnect-level dielectric material layers (290, 960) and the first pad-level dielectric layer 944, and can embed first pad-connection via structures 968 having a respective distal surface that is in contact with a respective one of the first bonding pads 948 and having a lesser area than an area of a horizontal surface of the respective one of the first bonding pads 948.

Generally, the sacrificial mesa structures 941 are replaced with the first bonding pads 948 by removing the sacrificial mesa structures 941 selective to the first pad-level dielectric layer 944. The first bonding pads 948 comprise inward tapered sidewalls that contact outward tapered sidewalls of the first pad-level dielectric layer 944.

Each of the first bonding pads 948 comprises a first proximal horizontal surface PHS1 and a first distal horizontal surface DHS1 that is more distal from the first substrate 908 than the first proximal horizontal surface PHS1 is from the first substrate 908. The first distal horizontal surface DHS1 has a lesser total area than a total area of the first proximal horizontal surface PHS1. In one embodiment, each of the first bonding pads 948 comprises: a first metallic liner 948A including a horizontally-extending portion and a sidewall portion that contacts the first pad-level dielectric layer 944, and a first metallic fill material portion 948B that is embedded in the first metallic liner 948A, is not in direct contact with the first pad-level dielectric layer 944, and is laterally spaced from the first pad-level dielectric layer 944. Each of the first metallic liners 948A extends from a first proximal horizontal surface PHS1 of a respective one of the first bonding pads 948 to a first distal horizontal surface DHS1 of the respective one of the first bonding pads 948.

The first distal horizontal surface DHS1 is connected to the first proximal horizontal surface PHS1 by a continuous sidewall that contacts the first pad-level dielectric layer 944. In one embodiment, the continuous sidewall comprises a straight sidewall that contacts a straight sidewall of the first pad-level dielectric layer 944, as shown in FIG. 5G. A periphery DP of the first distal horizontal surface DHS1 is located entirely within a periphery PP of the first proximal horizontal surface PHS1 in a plan view along a direction that is perpendicular to a top surface of the first substrate 908. In one embodiment, the periphery PP of the first proximal horizontal surface PHS1 is laterally offset outward from the periphery DP of the first distal horizontal surface DHS1 by a uniform lateral offset distance LOD.

Figure 6A:
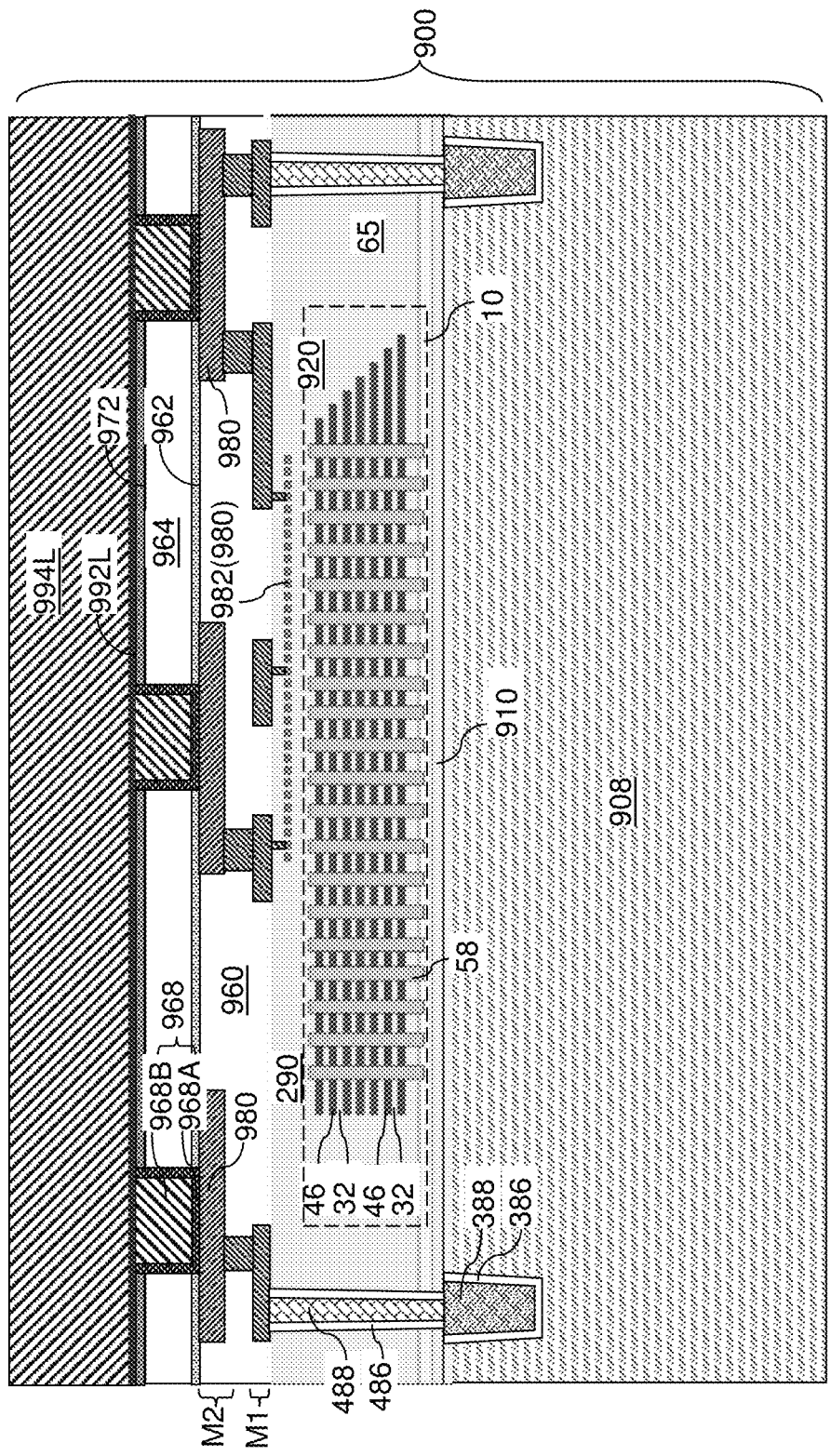
FIG. 6A is a schematic vertical cross-sectional view of a fifth configuration of the first semiconductor die after formation of a metallic liner and a metallic pad material layer according to a fifth embodiment of the present disclosure.

Referring to FIG. 6A, a fifth configuration of the first semiconductor die 900 can be derived from the first semiconductor die 900 of FIG. 1A by depositing an optional first metallic liner layer 992L and a metallic pad material layer 994L over the first interconnect-level dielectric material layers (290, 960).

The first metallic liner layer 992L includes a conductive metallic barrier material such as TiN, TaN, and/or WN. The conductive metallic barrier material can block diffusion of copper. The thickness of the first metallic liner layer 992L may be in a range from 4 nm to 80 nm, such as from 8 nm to 40 nm, although lesser and greater thicknesses can also be employed. The metallic pad material layer 994L can include copper, tungsten, molybdenum, cobalt, ruthenium, or a combination thereof. In an illustrative example, if the metallic pad material layer 994L includes copper, the metallic pad material layer 994L may be deposited by electroless or electroplating process.

Figure 6B:
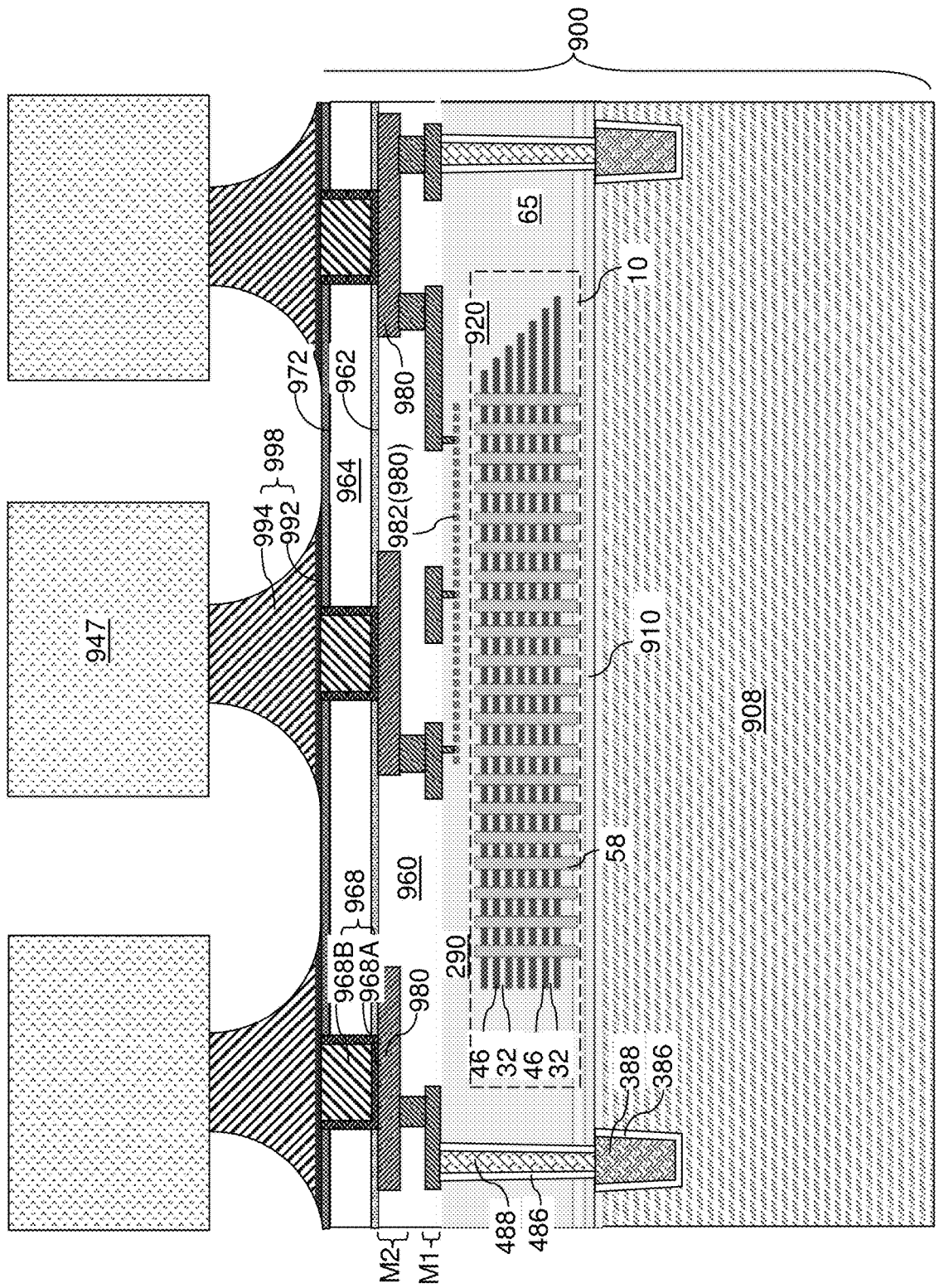
FIG. 6B is a schematic vertical cross-sectional view of the fifth configuration of the first semiconductor die after patterning the bonding pads according to the fifth embodiment of the present disclosure.

Referring to FIG. 6B, discrete etch mask material portions 947 can be formed over the metallic pad material layer 994L such that each area of the first pad-connection via structures 968 is covered by a respective one of the discrete etch mask material portions 947. In one embodiment, the etch mask material portions 947 may include patterned discrete portions of a photoresist material formed by application and lithographic patterning of a photoresist material layer. Alternatively, a hard mask material layer can be deposited and lithographically patterned to form the discrete etch mask material portions 947. The discrete etch mask material portions 947 can have horizontal cross-sectional shapes of first bonding pads to be subsequently formed with an optional offset outward from a periphery of a respective first bonding pad in a plan view.

An isotropic etch process can be subsequently performed to isotropically etch unmasked portions of the metallic pad material layer 994L and the first metallic liner layer 992L selective to the material of the first pad-level diffusion barrier layer 972 (or selective to the material of the first pad-connection-level dielectric layer 964 in case the first pad-level diffusion barrier layer 972 is omitted). Unmasked portions of the metallic pad material layer 994L and the first metallic liner layer 992L are isotropically etched employing the discrete etch mask material portions 947 as an etch mask. Patterned remaining portions of the metallic pad material layer 994L and the first metallic liner layer 992L comprise first bonding pads 998. Each bonding pad 998 can be formed on a top surface of a respective one of the first pad-connection via structures 968. Each first bonding pad 998 can optionally comprise a first metallic liner 992, which is a patterned portion of the first metallic liner layer 992. Further, each first bonding pad 998 can comprise a first metallic pad material portion 994, which is a patterned portion of the metallic pad material layer 994L. Each first bonding pad 998 can have at least one concave sidewall, which may be a single sidewall having a circular or cylindrical horizontal cross-sectional shape or a set of multiple horizontally-straight sidewalls providing a polygonal horizontal cross-sectional shape. The discrete etch mask material portions 947 can be subsequently removed, for example, by ashing.

Figure 6C:
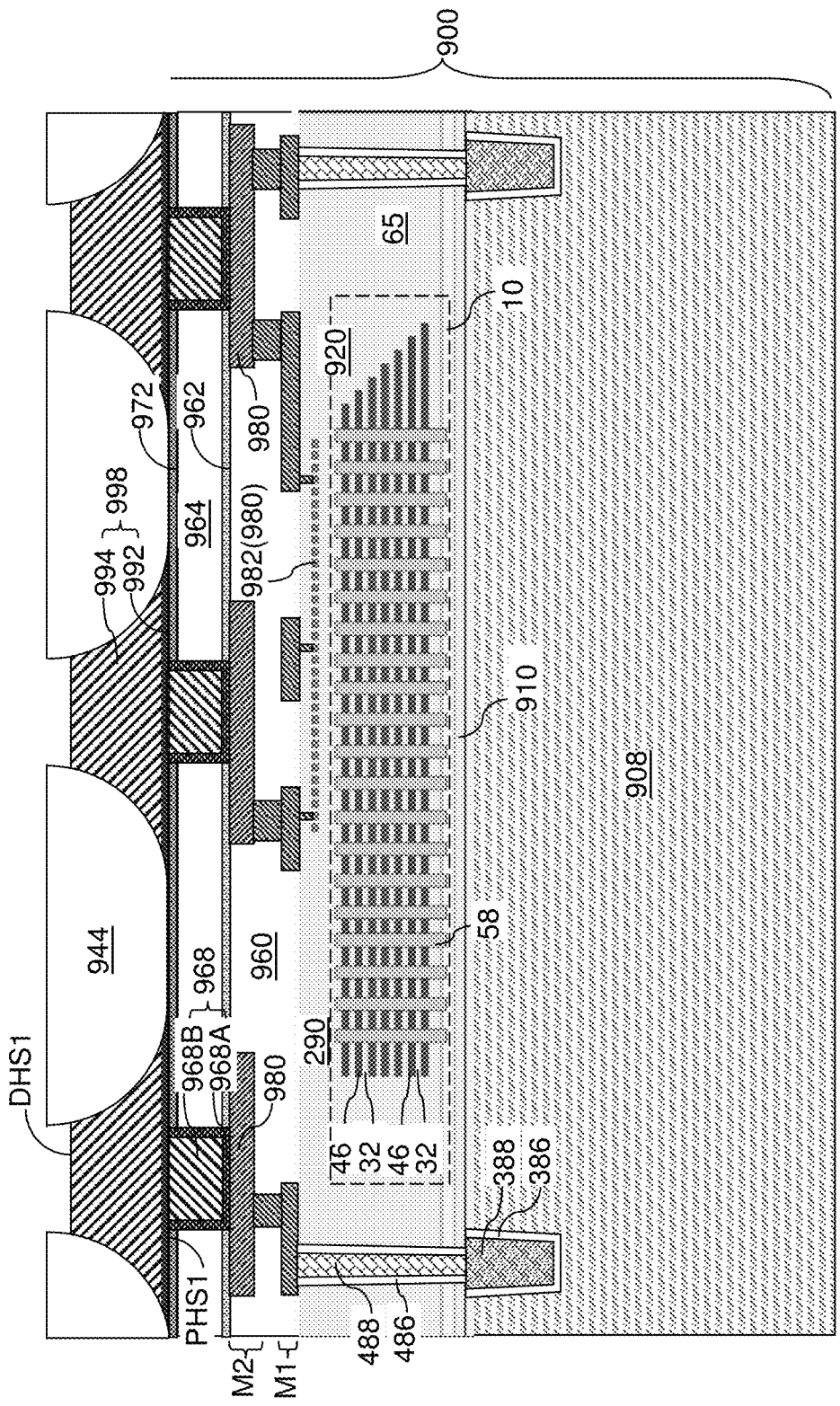
FIG. 6C is a schematic vertical cross-sectional view of the fifth configuration of the first semiconductor die after formation of a first pad-level dielectric layer according to the fifth embodiment of the present disclosure.

Referring to FIG. 6C, a dielectric material can be deposited in gaps in the array of first bonding pads 998 and over the array of the first bonding pads 998. The deposited dielectric material can be subsequently planarized, for example, employing chemical mechanical planarization and/or a recess etch. Portions of the deposited dielectric material overlying the horizontal plane including the top surface of the first bonding pads 998 can be removed by the planarization process. A remaining continuous portions of the deposited dielectric material forms a first pad-level dielectric layer 944.

Top surfaces of the first bonding pads 998 can be vertically recessed, for example, by overpolishing and/or a recess etch, to be located below the horizontal plane including the distal horizontal surface (i.e., the top surface) of the first pad-level dielectric layer 944. The vertical recess distance is selected so that volume expansion of the materials of the first bonding pads 948 causes the top surface of the first bonding pads 998 to be flush with the horizontal surface of the first pad-level dielectric layer 944 at the elevated temperature of a bonding process to be subsequently employed. For example, the vertical recess distance of the top surfaces of the first bonding pads 998 relative to the horizontal plane including the distal horizontal surface of the first pad-level dielectric layer 944 can be in a range from 10 nm to 100 nm, such as from 20 nm to 60 nm, although lesser and greater vertical recess distances may also be employed.

Each first bonding pad 998 can include a first metallic liner 992 and a first metallic pad material portion 994. The first metallic liner 992 includes, and/or consists of, a horizontally-extending portion. The first metallic fill material portion 994 contacts a top surface of the first metallic liner 992, and is in direct contact with the first pad-level dielectric layer 944. The first pad-level dielectric layer 944 overlies the first interconnect-level dielectric material layers (290, 960), and embeds the first bonding pads 998. Each of the first bonding pads 998 comprises a first proximal horizontal surface PHS1 and a first distal horizontal surface DHS1 that is more distal from the first substrate 908 than the first proximal horizontal surface PHS1 is from the first substrate 908, and has a lesser total area than a total area of the first proximal horizontal surface PHS1.

In one embodiment, the first distal horizontal surface DHS1 is connected to the first proximal horizontal surface PHS1 by a continuous sidewall that contacts the first pad-level dielectric layer 944. In one embodiment, continuous sidewall comprises a concave sidewall that contacts a convex sidewall of the first pad-level dielectric layer 944. In one embodiment, a periphery of the first distal horizontal surface DHS1 is located entirely within a periphery of the first proximal horizontal surface PHS1 in a plan view along a direction that is perpendicular to a top surface of the first substrate 908. In one embodiment, the periphery of the first proximal horizontal surface PHS1 is laterally offset outward from the periphery of the first distal horizontal surface DHS1 by a uniform lateral offset distance LOD in the same manner illustrated in FIGS. 4G and 5G.

Figure 7A:
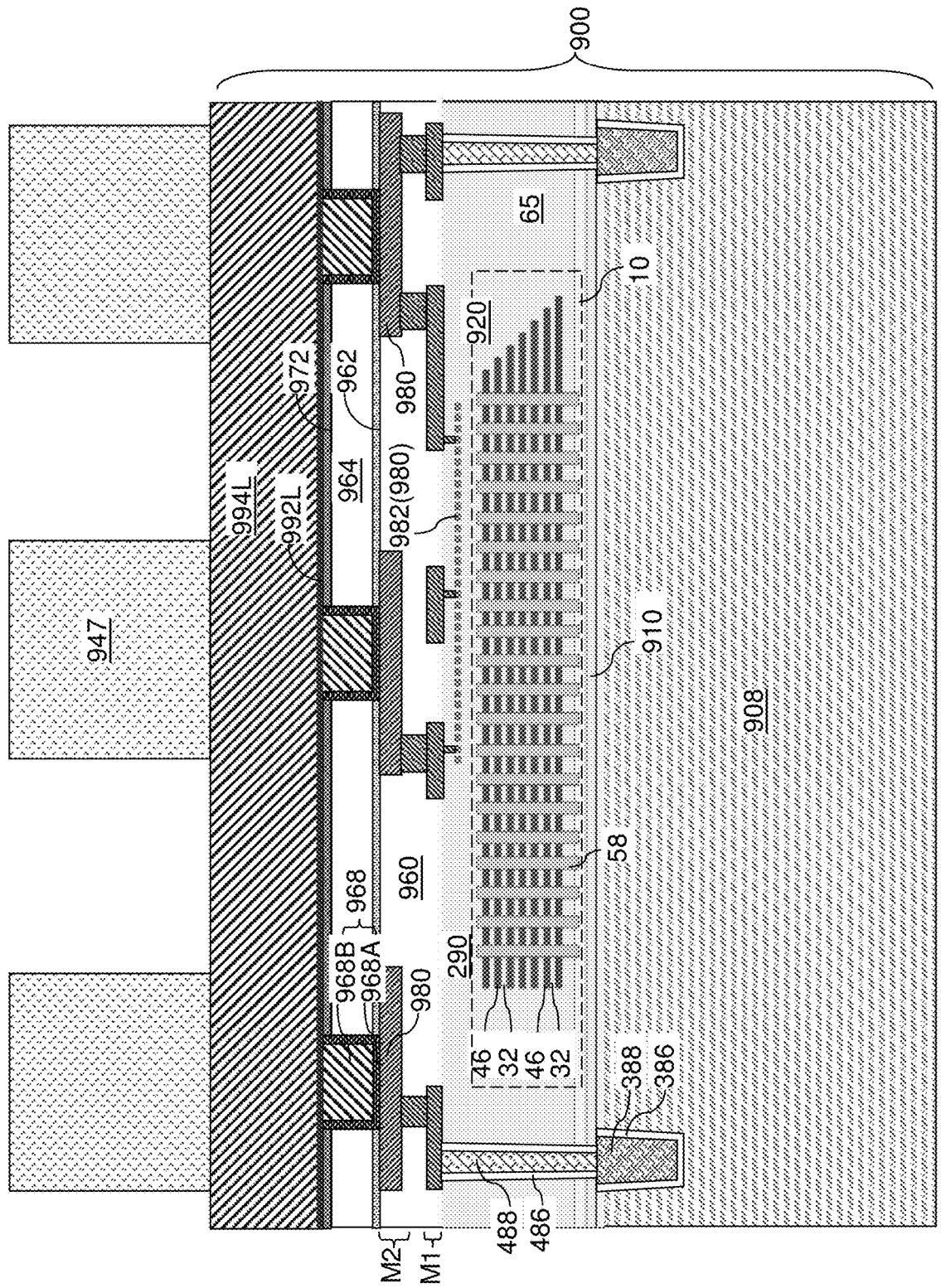
FIG. 7A is a schematic vertical cross-sectional view of a sixth configuration of the first semiconductor die after formation of a metallic liner and a metallic pad material layer according to a sixth embodiment of the present disclosure.

Referring to FIG. 7A, a sixth configuration of the first semiconductor die 900 can be derived from the fifth configuration of the first semiconductor die 900 of FIG. 6A by forming discrete etch mask material portions 947 over the metallic pad material layer 994L. Each area of the first pad-connection via structures 968 is covered by a respective one of the discrete etch mask material portions 947. In one embodiment, the etch mask material portions 947 may include patterned discrete portions of a photoresist material formed by application and lithographic patterning of a photoresist material layer. Alternatively, a hard mask material layer can be deposited and lithographically patterned to form the discrete etch mask material portions 947. The discrete etch mask material portions 947 can have horizontal cross-sectional shapes of first bonding pads to be subsequently formed with an optional offset outward from a periphery of a respective first bonding pad in a plan view.

Figure 7B:
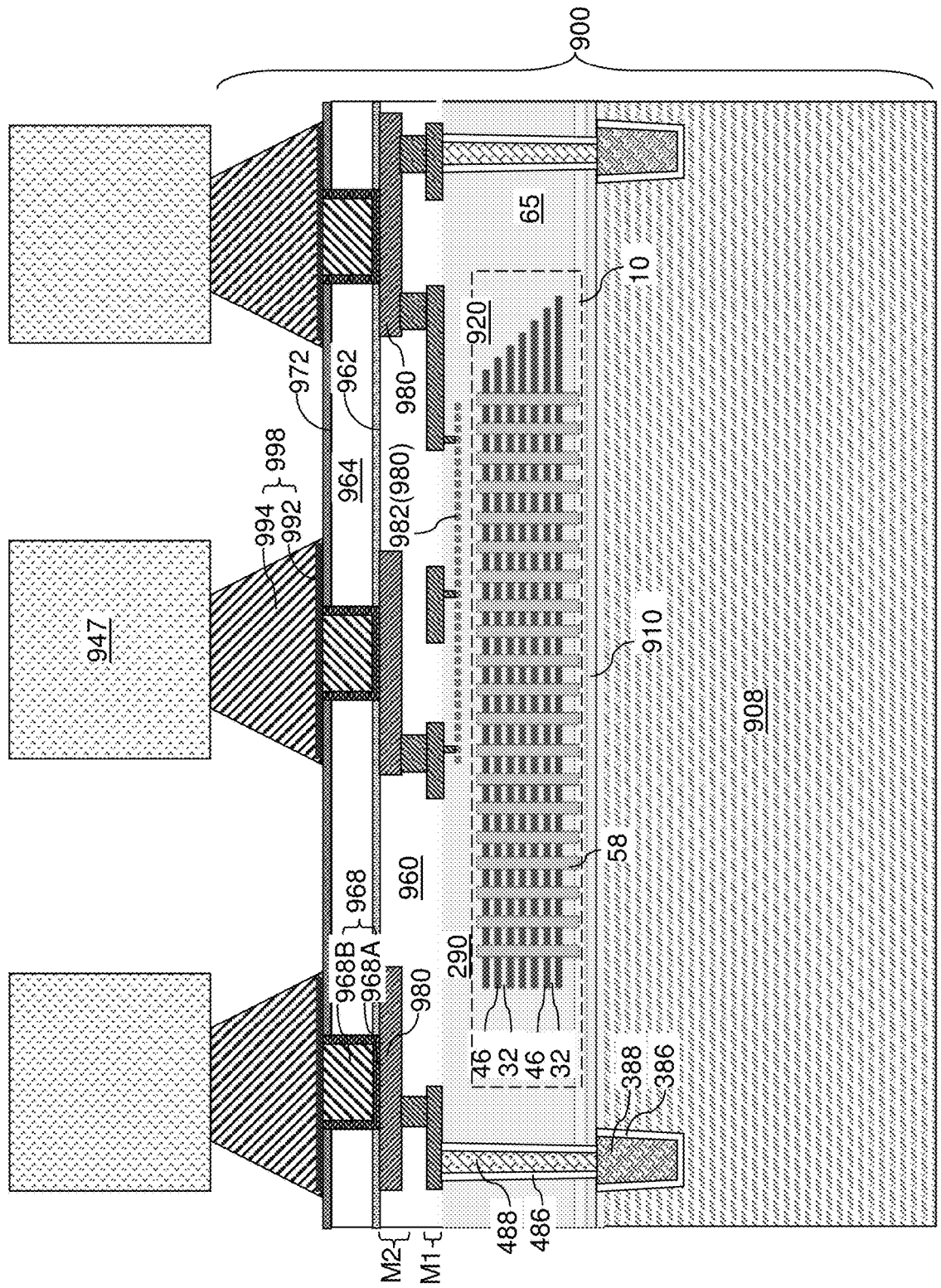
FIG. 7B is a schematic vertical cross-sectional view of the sixth configuration of the first semiconductor die after patterning the bonding pads according to the sixth embodiment of the present disclosure.

Referring to FIG. 7B, an anisotropic etch process can be subsequently performed to anisotropically etch unmasked portions of the metallic pad material layer 994L and the first metallic liner layer 992L selective to the material of the first pad-level diffusion barrier layer 972 (or selective to the material of the first pad-connection-level dielectric layer 964 in case the first pad-level diffusion barrier layer 972 is omitted). In one embodiment, the anisotropic etch process has an isotropic etch component that causes an undercut around the periphery of each discrete etch mask material portion 947. In another embodiment, the anisotropic etch process collaterally trims the discrete etch mask material portions 947, and thereby widens the width of each etched region while the anisotropic etch process progresses. Patterned remaining portions of the metallic pad material layer 994L and the first metallic liner layer 992L comprise first bonding pads 998 having tapered sidewalls. The tapered sidewalls of the first bonding pads 998 may be straight, and may have a taper angle (as measured between a two-dimensional plane including a sidewall of a sacrificial mesa structure 941 and a vertical line) in a range from 5 degrees to 45 degrees.

Each bonding pad 998 can be formed on a top surface of a respective one of the first pad-connection via structures 968. Each first bonding pad 998 can comprise a first metallic liner 992, which is a patterned portion of the first metallic liner layer 992. Further, each first bonding pad 998 can comprise a first metallic pad material portion 994, which is a patterned portion of the metallic pad material layer 994L. Each first bonding pad 998 can have at least one tapered straight sidewall, which may be a single sidewall having a circular or cylindrical horizontal cross-sectional shape or a set of multiple horizontally-straight sidewalls providing a polygonal horizontal cross-sectional shape. The discrete etch mask material portions 947 can be subsequently removed, for example, by ashing.

Figure 7C:
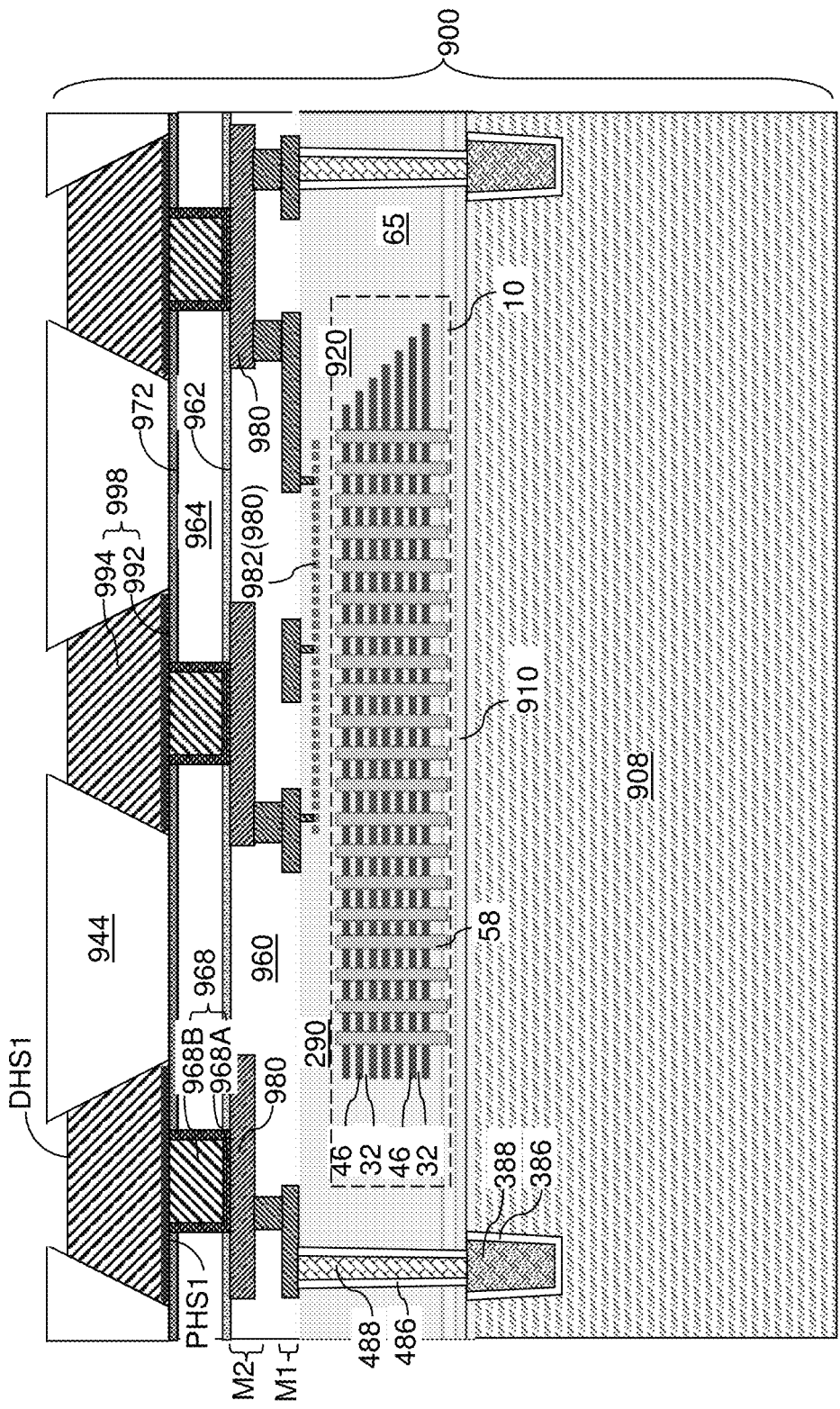
FIG. 7C is a schematic vertical cross-sectional view of the sixth configuration of the first semiconductor die after formation of a first pad-level dielectric layer according to the sixth embodiment of the present disclosure.

Referring to FIG. 7C, a dielectric material can be deposited in gaps in the array of first bonding pads 998 and over the array of the first bonding pads 998. The deposited dielectric material can be subsequently planarized, for example, employing chemical mechanical planarization and/or a recess etch. Portions of the deposited dielectric material overlying the horizontal plane including the top surface of the first bonding pads 998 can be removed by the planarization process. A remaining continuous portions of the deposited dielectric material forms a first pad-level dielectric layer 944.

Top surfaces of the first bonding pads 998 can be vertically recessed, for example, by overpolishing and/or a recess etch, to be located below the horizontal plane including the distal horizontal surface (i.e., the top surface) of the first pad-level dielectric layer 944. The vertical recess distance is selected so that volume expansion of the materials of the first bonding pads 948 causes the top surface of the first bonding pads 998 to be flush with the horizontal surface of the first pad-level dielectric layer 944 at the elevated temperature of a bonding process to be subsequently employed. For example, the vertical recess distance of the top surfaces of the first bonding pads 998 relative to the horizontal plane including the distal horizontal surface of the first pad-level dielectric layer 944 can be in a range from 10 nm to 100 nm, such as from 20 nm to 60 nm, although lesser and greater vertical recess distances may also be employed.

Each first bonding pad 998 can include a first metallic liner 992 and a first metallic pad material portion 994. The first metallic liner 992 includes, and/or consists of, a horizontally-extending portion. The first metallic fill material portion 994 contacts a top surface of the first metallic liner 992, and is in direct contact with the first pad-level dielectric layer 944. The first pad-level dielectric layer 944 overlies the first interconnect-level dielectric material layers (290. 960), and embeds the first bonding pads 998. Each of the first bonding pads 998 comprises a first proximal horizontal surface PHS1 and a first distal horizontal surface DHS1 that is more distal from the first substrate 908 than the first proximal horizontal surface PHS1 is from the first substrate 908, and has a lesser total area than a total area of the first proximal horizontal surface PHS1.

In one embodiment, the first distal horizontal surface DHS1 is connected to the first proximal horizontal surface PHS1 by a continuous sidewall that contacts the first pad-level dielectric layer 944. In one embodiment, continuous sidewall comprises a tapered straight sidewall that contacts a tapered straight sidewall of the first pad-level dielectric layer 944. Each tapered straight sidewall have a straight vertical cross-sectional profile, and is at a non-zero angle with respective to the vertical direction. In one embodiment, a periphery of the first distal horizontal surface DHS1 is located entirely within a periphery of the first proximal horizontal surface PHS1 in a plan view along a direction that is perpendicular to a top surface of the first substrate 908. In one embodiment, the periphery of the first proximal horizontal surface PHS1 is laterally offset outward from the periphery of the first distal horizontal surface DHS1 by a uniform lateral offset distance LOD in the same manner illustrated in FIGS. 4G and 5G.

Figure 8A:
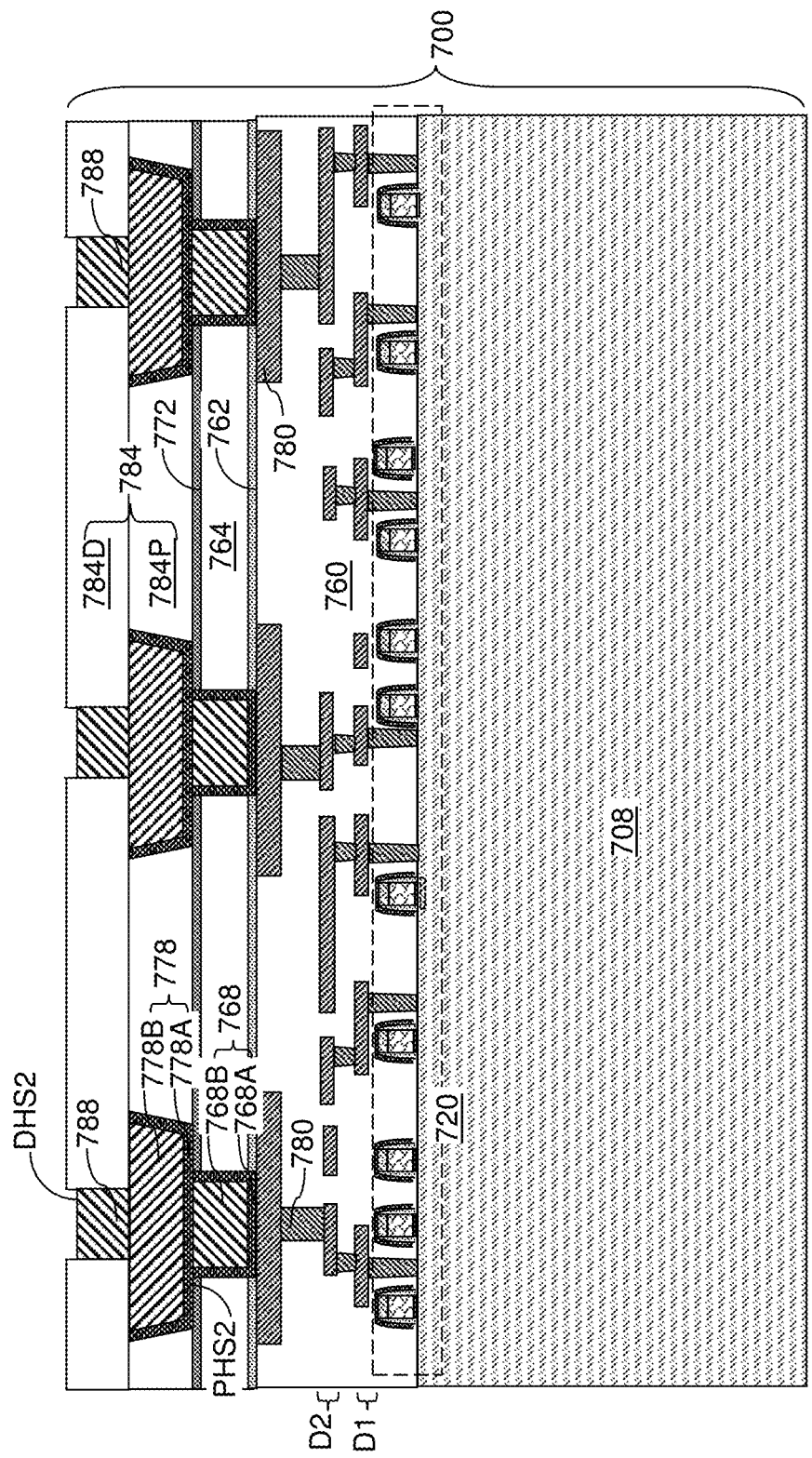
FIG. 8A is a vertical cross-sectional view of a first configuration of a second semiconductor die according to an embodiment of the present disclosure.

Referring to FIG. 8A, a second semiconductor die 700 according to an embodiment of the present disclosure is illustrated. The second semiconductor die 700 includes a second substrate 708, second semiconductor devices 720 overlying the second substrate 708, second interconnect-level dielectric material layers 760 overlying the second semiconductor devices 720, and second metal interconnect structures 780 embedded in the second interconnect-level dielectric material layers 760. In one embodiment, the second semiconductor devices 720 may include at least one complementary metal oxide semiconductor (CMOS) circuitry including field effect transistors. In one embodiment, the second substrate 708 may be a second substrate such as a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive layers 46), and bit lines 982, and the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second interconnect-level dielectric material layers 760 may include a dielectric material such as undoped silicate glass (e.g., silicon oxide), a doped silicate glass, organosilicate glass, silicon nitride, a dielectric metal oxide, or a combination thereof. In an illustrative example, the second metal interconnect structures 780 may include a first logic-side metal level D1 including logic-side first-level metal lines, and a second logic-side metal level D2 including logic-side second-level metal lines.

The second interconnect-level dielectric material layers 760 may include one or more dielectric diffusion barrier layers (not expressly shown). In this case, each dielectric diffusion barrier layer embedded in the second interconnect-level dielectric material layers 760 may include silicon carbon nitride (SiCN), silicon nitride ($Si_3N_4$), silicon oxynitride, or any other dielectric material that is effective in blocking diffusion of copper.

Subsequently, the processing steps of FIG. 1A can be performed with any needed modifications to form a layer stack including an optional second interconnect-capping dielectric diffusion barrier layer 762, a second pad-connection-level dielectric layer 764, and an optional second pad-level diffusion barrier layer 772, and second pad-connection via structure 768 embedded in the layer stack. Each second pad-connection via structure 768 can include a pad-connection-level metallic barrier liner 768A and a pad-connection-level metallic fill material portion 768B.

The processing steps of FIGS. 1B and 1C can be performed with any needed modifications to form a second proximal pad-level dielectric layer 784P over the second pad-connection-level dielectric layer 764, and second pad base portions 778 can be formed in the second proximal pad-level dielectric layer 784P. Each second pad base portion 778 include a second metallic liner 778A and a second pad base plate portion 778B. The second pad-connection-level dielectric layer 764 can be located between the second interconnect-level dielectric material layers 760 and the second pad-level dielectric layer 784P, and can embed second pad-connection via structures 768 having a respective distal surface that is in contact with a respective one of the second pad base portions 778 and having a lesser area than an area of a proximal horizontal surface of the respective one of the second pad base portions 778.

The processing steps of FIGS. 1D-1F can be performed to form a second distal pad-level dielectric layer 784D over the second proximal pad-level dielectric layer 784P. Second pad pillar portions 788 can be formed in the second distal pad-level dielectric layer 784D. Top surfaces of the second pad pillar portions 788 can be vertically recessed, for example, by overpolishing and/or a recess etch, to be located below the horizontal plane including the distal horizontal surface (i.e., the top surface) of the second distal pad-level dielectric layer 784D. The vertical recess distance is selected so that volume expansion of the materials of the second pad base portions 778 and the second pad pillar portions 788 causes the top surface of the second pad pillar portions 788 to be flush with the distal horizontal surface of the second distal pad-level dielectric layer 784D at the elevated temperature of a bonding process to be subsequently employed. For example, the vertical recess distance of the top surfaces of the second pad pillar portion 788 relative to the horizontal plane including the distal horizontal surface of the second distal pad-level dielectric layer 784D can be in a range from 10 nm to 100 nm, such as from 20 nm to 60 nm, although lesser and greater vertical recess distances may also be employed. Each second pad pillar portion 788 can be formed in a respective second pillar cavity directly on the top surface of a respective second pad base portion 778.

Each contiguous combination of a second pad base portion 778 and a second pad pillar portion 788 constitutes a second bonding pad (778, 788). The combination of the second proximal pad-level dielectric layer 784P and the second distal pad-level dielectric layer 784D constitutes a second pad-level dielectric layer 784 that laterally surrounds, and embeds, the second bonding pads (778, 788). The second pad-level dielectric layer 784 is a composite layer including a layer stack of the second proximal pad-level dielectric layer 784P and the second distal pad-level dielectric layer 784D.

Generally, the second bonding pads (778, 788) in the second pad-level dielectric layer 784 can be formed such that the each of the second bonding pads (778, 788) comprises a second proximal horizontal surface PHS2 and a second distal horizontal surface DHS2 that is more distal from the second substrate 708 than the second proximal horizontal surface PHS2 is from the second substrate 708 and has a lesser total area than a total area of the second proximal horizontal surface PHS2. The second pad-level dielectric layer 784 overlies the second interconnect-level dielectric material layers 760 and embeds the second bonding pads (778, 788).

Each of the second bonding pads (778, 788) comprises a second pad base portion 778 embedded in the second proximal pad-level dielectric layer 784P and a second pad pillar portion 788 contacting the second distal pad-level dielectric layer 784D. The second pad base portions 778 are formed within the second proximal pad-level dielectric layer 784P prior to formation of the second distal pad-level dielectric layer 784D.

In one embodiment, planar distal surfaces of each second pad base portion 778 contacts portions of a proximal horizontal surface of the second distal pad-level dielectric layer 784D. In one embodiment, each second pad base portion 778 comprises a stack of a second metallic liner 778A and a pad base plate portion 778B. Each second pad pillar portion 788 contacts a sidewall of the second distal pad-level dielectric layer 784D. In one embodiment, each of the second bonding pads (778, 788) consists of a second pad base portion 778 and a single second pad pillar portion 788. In on embodiment, each second pad base portion 778 comprises a straight sidewall that vertically extends from a proximal horizontal surface of the second proximal pad-level dielectric layer 784P to a distal horizontal surface of the second proximal pad-level dielectric layer 784P.

Figure 8B:
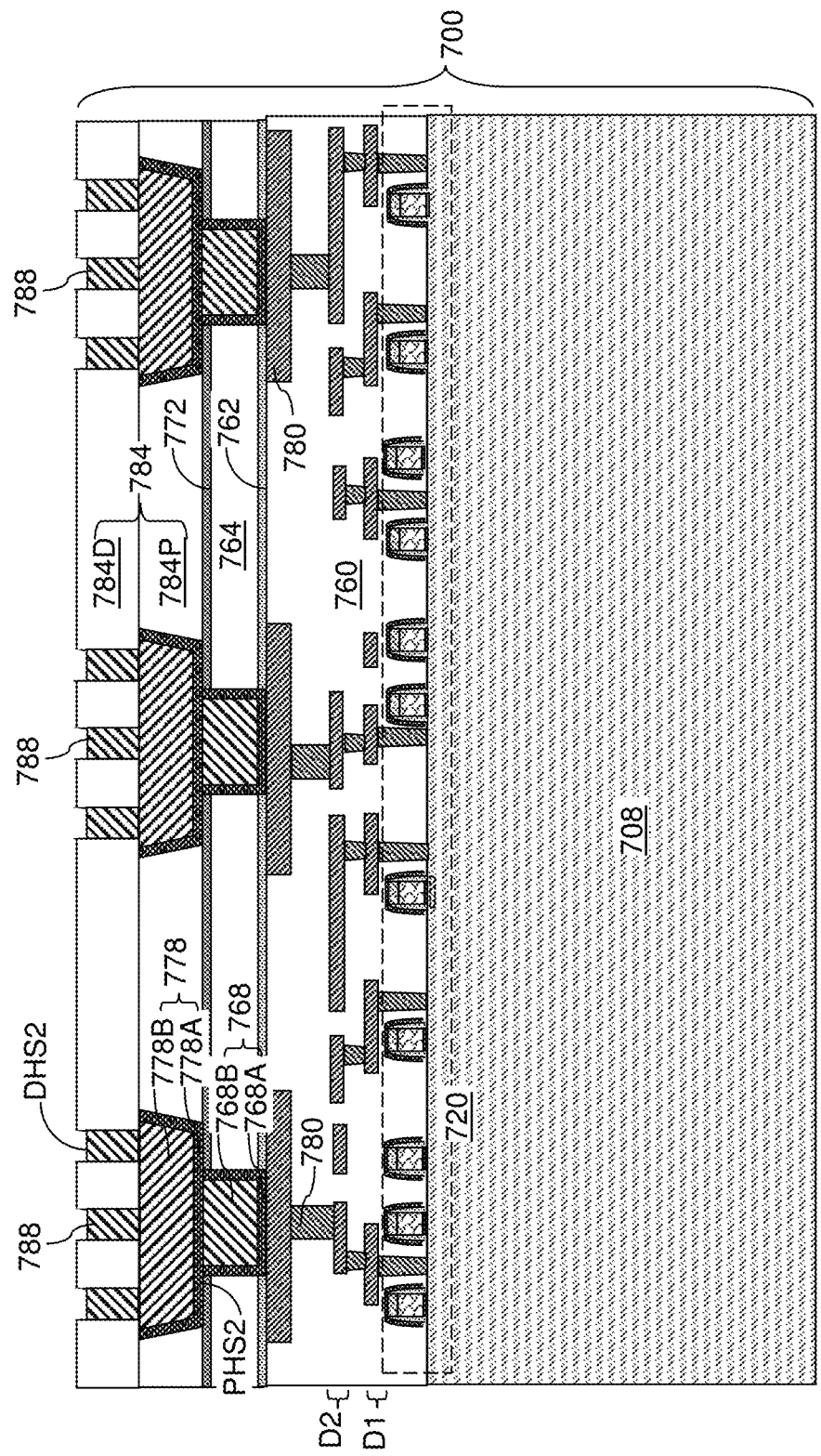
FIG. 8B is a vertical cross-sectional view of a variant of the first configuration of a second semiconductor die according to an embodiment of the present disclosure.

Referring to FIG. 8B, a variant of the first configuration of the second semiconductor die 700 can be derived from the second semiconductor die 700 of FIG. 8A by performing the processing steps of FIGS. 2A and 2B instead of the processing steps of FIGS. 1D-1F. At least two pad pillar portions 788 can be formed directly on each second pad base portion 778. In one embodiment, a one-dimensional array of pad pillar portions 788 or a two-dimensional array of pad pillar portions 788 can be formed directly on a top surface of each second pad base portion 778. Generally, a second bonding pad (778, 788) can include a second pad base portion 778 and at least one second pad pillar portion 788. The at least one second pad pillar portion 788 may include a single pad pillar portion 788, or a plurality of second pad pillar portions 788 that are laterally spaced apart from each other. In one embodiment, the plurality of second pad pillar portions 788 may include an M'×N' rectangular periodic array of second pad pillar portions 788, in which M' and N' are independent integers in a range from 2 to 10.

Figure 8C:
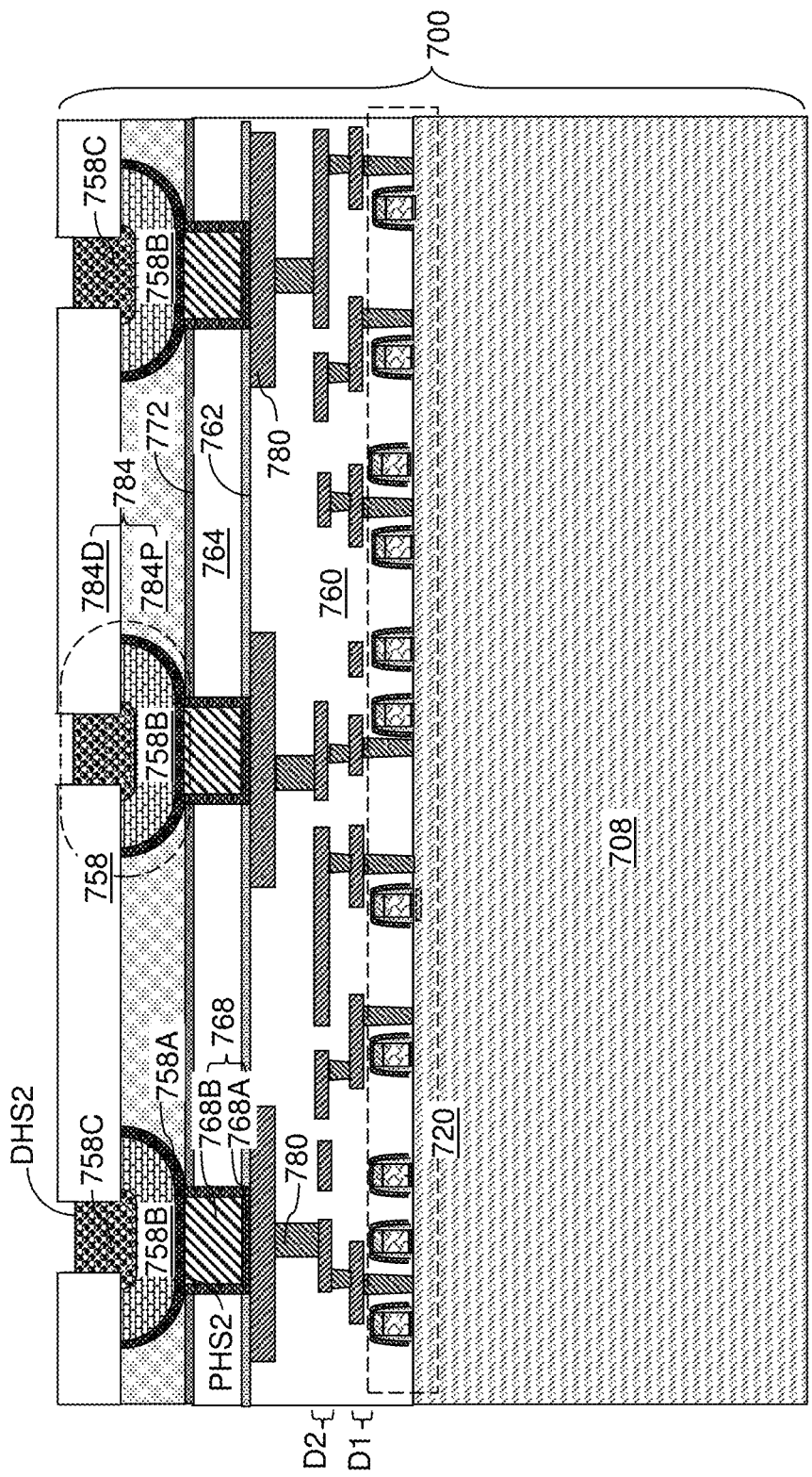
FIG. 8C is a vertical cross-sectional view of a second configuration of a second semiconductor die according to an embodiment of the present disclosure.

Referring to FIG. 8C, a second configuration of the second semiconductor die 700 can be derived from the first configuration of the second semiconductor die 700 by performing the processing steps of FIGS. 3A-3H according to an embodiment of the present disclosure. Second bonding pads 758 can be formed in the second pad-level dielectric layer 784 such that the each of the second bonding pads 758 comprises a second proximal horizontal surface PHS2 and a second distal horizontal surface DHS2 that is more distal from the second substrate 708 than the second proximal horizontal surface PHS2 is from the second substrate 708 and has a lesser total area than a total area of the second proximal horizontal surface PHS2. The second pad-level dielectric layer 784 overlies the second interconnect-level dielectric material layers 760 and embeds the second bonding pads 750.

Each of the second bonding pads 758 comprises a second pad base portion (758A, 758B) embedded in the second proximal pad-level dielectric layer 784P and a second pad pillar portion 758C contacting the second distal pad-level dielectric layer 784D. The second pad base portions (758A, 758B) are formed within the second proximal pad-level dielectric layer 784P after formation of the second distal pad-level dielectric layer 784D.

In one embodiment, planar distal surfaces of each second pad base portion (758A, 758B) contacts portions of a proximal horizontal surface of the second distal pad-level dielectric layer 784D. In one embodiment, each second pad base portion (758A, 758B) comprises a stack of a second metallic liner 758A and a pad base plate portion 758B. Each second pad pillar portion 758C contacts a sidewall of the second distal pad-level dielectric layer 784D. In one embodiment, each of the second bonding pads 758 consists of a second pad base portion (758A, 758B) and a single second pad pillar portion 758C. In on embodiment, each second pad base portion (758A, 758B) comprises a convex sidewall that vertically extends from a proximal horizontal surface of the second proximal pad-level dielectric layer 784P to a distal horizontal surface of the second proximal pad-level dielectric layer 784P.

Figure 8D:
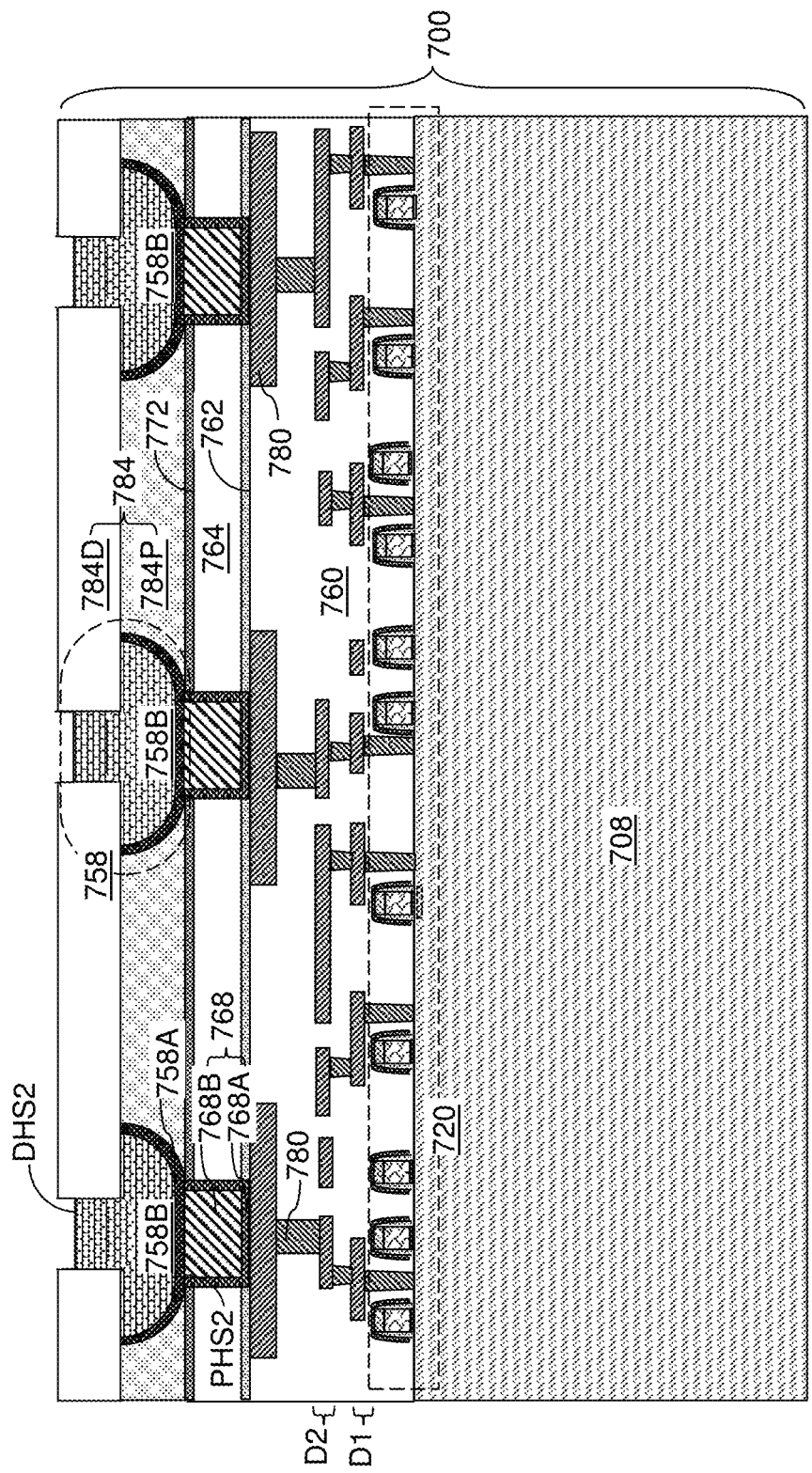
FIG. 8D is a vertical cross-sectional view of a first variant of the second configuration of a second semiconductor die according to an embodiment of the present disclosure.

Referring to FIG. 8D, a first variant of the second configuration of the second semiconductor die 700 can be derived from the second configuration of the second semiconductor die 700 of FIG. 8C by performing with any needed modifications the processing steps of FIG. 3G in lieu of a subset of the processing steps employed to form the second configuration of the second semiconductor die 700 of FIG. 8C.

Figure 8E:
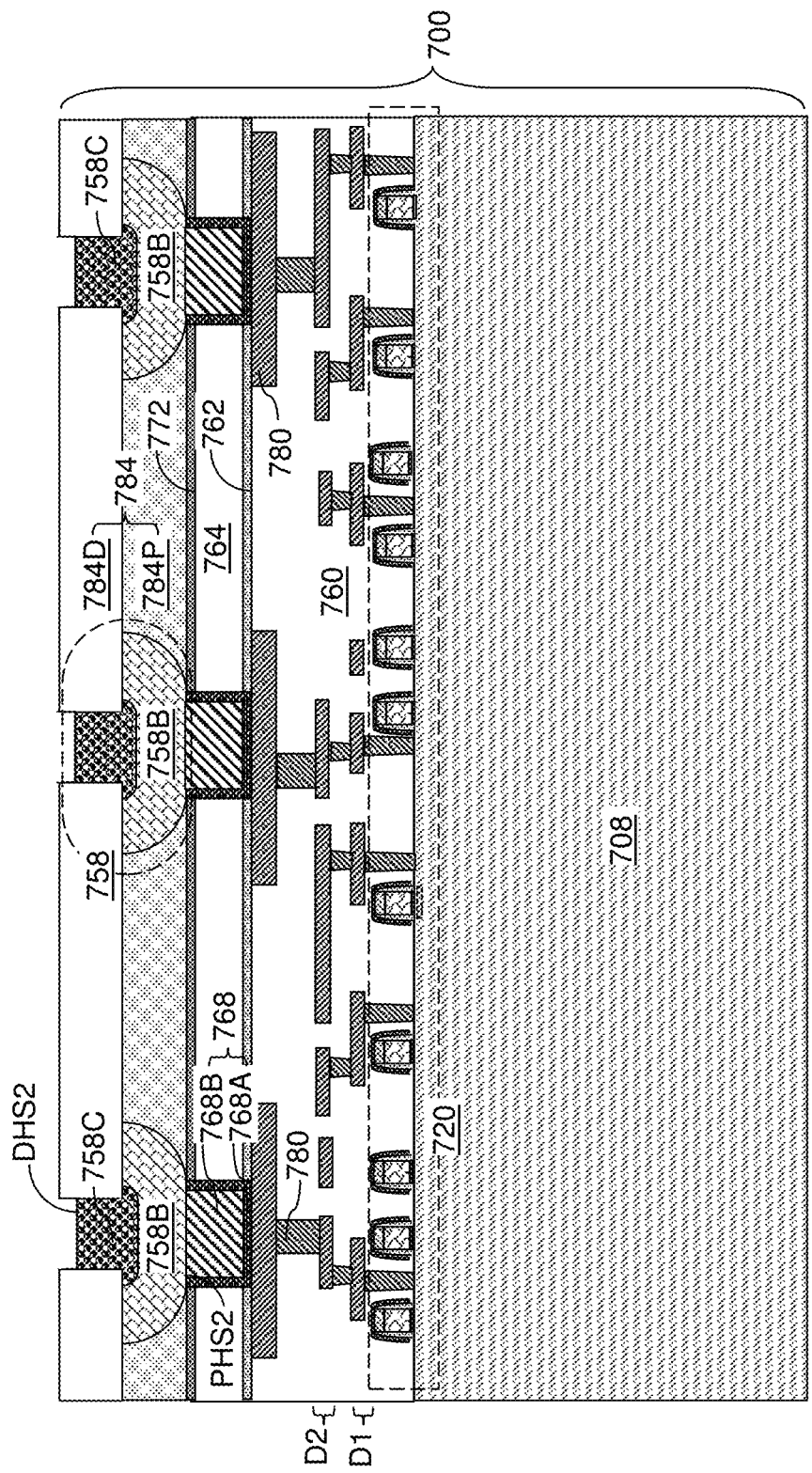
FIG. 8E is a vertical cross-sectional view of a second variant of the second configuration of a second semiconductor die according to an embodiment of the present disclosure.

Referring to FIG. 8E, a second variant of the second configuration of the second semiconductor die 700 can be derived from the second configuration of the second semiconductor die 700 of FIG. 8C by performing with any needed modifications the processing steps of FIG. 3H in lieu of a subset of the processing steps employed to form the second configuration of the second semiconductor die 700 of FIG. 8C.

Figure 9:
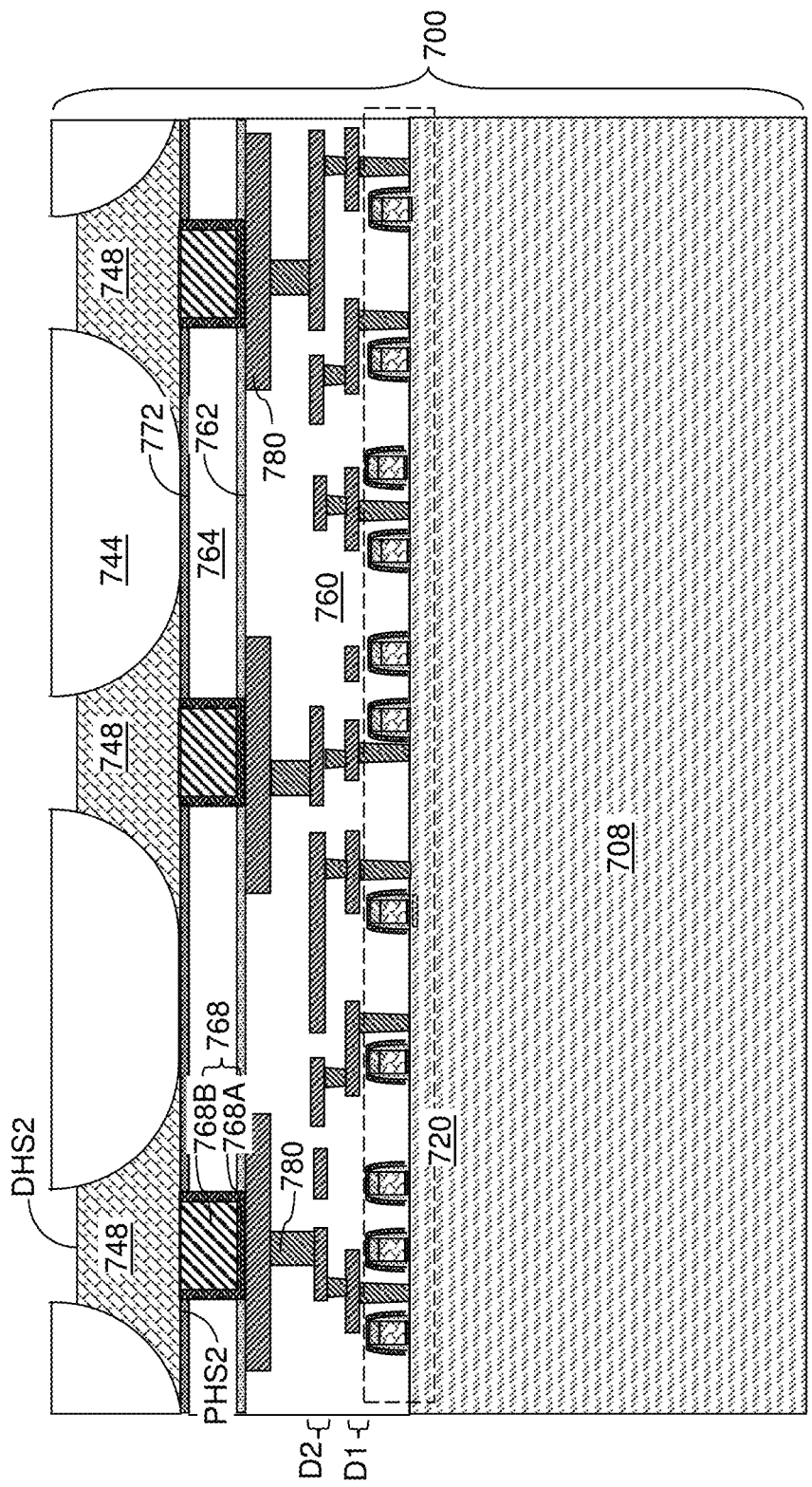
FIG. 9 is a vertical cross-sectional view of a third configuration of a second semiconductor die according to an embodiment of the present disclosure.

Referring to FIG. 9, a third configuration of the second semiconductor die 700 can be derived from the second semiconductor die 700 of FIG. 8A by performing with any needed modifications the processing steps of FIGS. 4A-4G or the processing steps of FIG. 6A-6C. Second bonding pads 748 are formed in a second pad-level dielectric layer 744. Each second bonding pad 748 may have a configuration that is equivalent to the configuration of the first bonding pads 948 in FIG. 4F, or may have a configuration that is equivalent to the configuration of the first bonding pads 948 in FIG. 6C.

Top surfaces of the second bonding pads 748 can be vertically recessed, for example, by overpolishing and/or a recess etch, to be located below the horizontal plane including the distal horizontal surface (i.e., the top surface) of the second pad-level dielectric layer 744. The vertical recess distance is selected so that volume expansion of the materials of the second bonding pads 748 causes the top surface of the second bonding pads 748 to be flush with the horizontal surface of the second pad-level dielectric layer 744 at the elevated temperature of a bonding process to be subsequently employed. For example, the vertical recess distance of the top surfaces of the second bonding pads 748 relative to the horizontal plane including the distal horizontal surface of the second pad-level dielectric layer 744 can be in a range from 10 nm to 100 nm, such as from 20 nm to 60 nm, although lesser and greater vertical recess distances may also be employed. The second pad-connection-level dielectric layer 764 can be located between the second interconnect-level dielectric material layers 760 and the second pad-level dielectric layer 744, and can embed second pad-connection via structures 768 having a respective distal surface that is in contact with a respective one of the second bonding pads 748 and having a lesser area than an area of a horizontal surface of the respective one of the second bonding pads 748.

Each of the second bonding pads 748 comprises a second proximal horizontal surface PHS2 and a second distal horizontal surface DHS2 that is more distal from the second substrate 708 than the second proximal horizontal surface PHS2 is from the second substrate 708. The second distal horizontal surface DHS2 has a lesser total area than a total area of the second proximal horizontal surface PHS2.

The second distal horizontal surface DHS2 is connected to the second proximal horizontal surface PHS2 by a continuous sidewall that contacts the second pad-level dielectric layer 744. In one embodiment, the continuous sidewall comprises a concave sidewall that contacts a convex sidewall of the second pad-level dielectric layer 744. A periphery of the second distal horizontal surface DHS2 is located entirely within a periphery of the second proximal horizontal surface PHS2 in a plan view along a direction that is perpendicular to a top surface of the second substrate 708. In one embodiment, the periphery of the second proximal horizontal surface PHS2 is laterally offset outward from the periphery of the second distal horizontal surface DHS2 by a uniform lateral offset distance.

Figure 10:
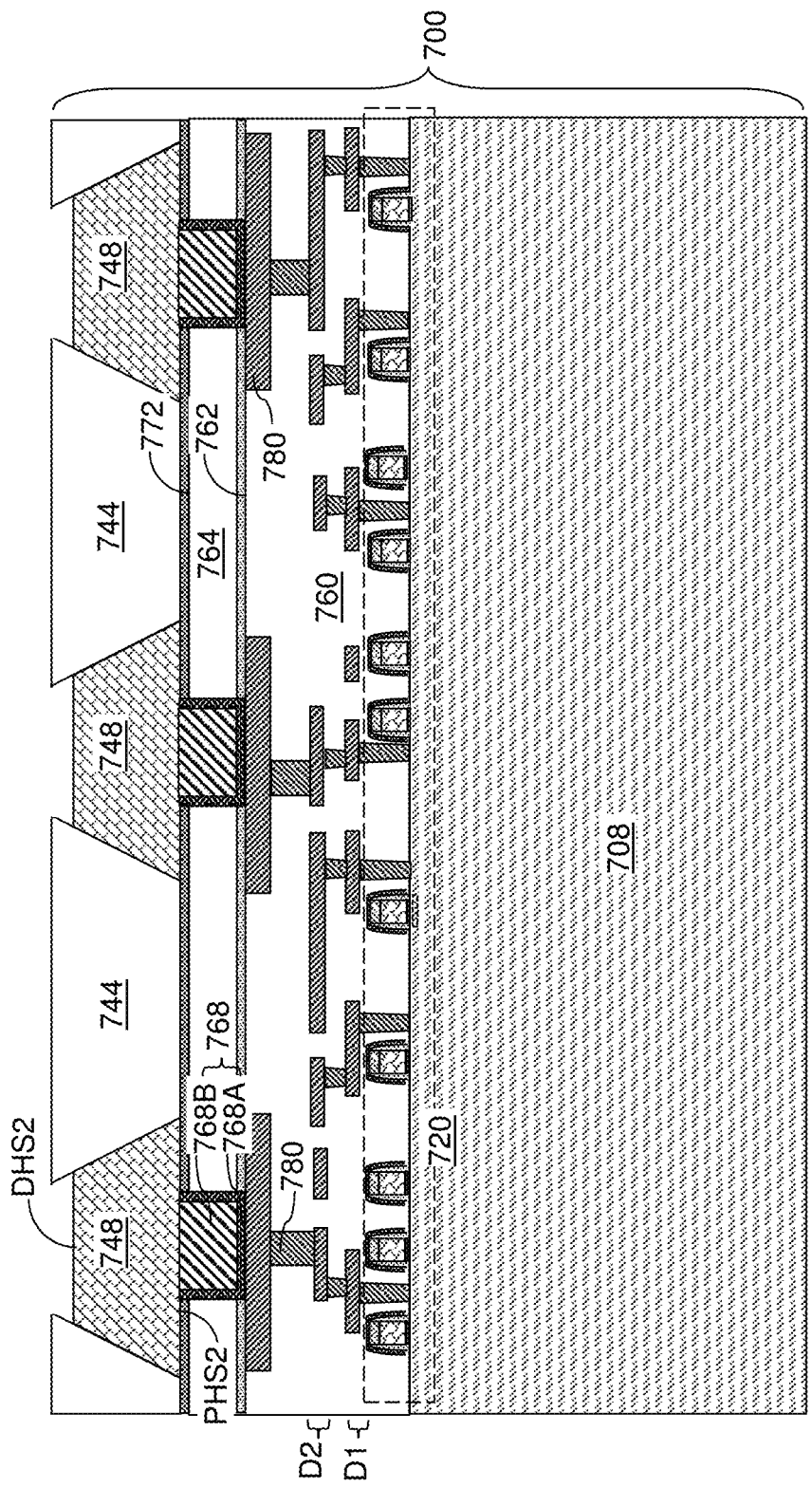
FIG. 10 is a vertical cross-sectional view of a fourth configuration of a second semiconductor die according to an embodiment of the present disclosure.

Referring to FIG. 10, a fourth configuration of the second semiconductor die 700 can be derived from the second semiconductor die 700 of FIG. 8A by performing with any needed modifications the processing steps of FIGS. 5A-5G or the processing steps of FIG. 7A-7C. Second bonding pads 748 are formed in a second pad-level dielectric layer 744. Each second bonding pad 748 may have a configuration that is equivalent to the configuration of the first bonding pads 948 in FIG. 5F, or may have a configuration that is equivalent to the configuration of the first bonding pads 948 in FIG. 7C.

Top surfaces of the second bonding pads 748 can be vertically recessed, for example, by overpolishing and/or a recess etch, to be located below the horizontal plane including the distal horizontal surface (i.e., the top surface) of the second pad-level dielectric layer 744. The vertical recess distance is selected so that volume expansion of the materials of the second bonding pads 748 causes the top surface of the second bonding pads 748 to be flush with the horizontal surface of the second pad-level dielectric layer 744 at the elevated temperature of a bonding process to be subsequently employed. For example, the vertical recess distance of the top surfaces of the second bonding pads 748 relative to the horizontal plane including the distal horizontal surface of the second pad-level dielectric layer 744 can be in a range from 10 nm to 100 nm, such as from 20 nm to 60 nm, although lesser and greater vertical recess distances may also be employed. The second pad-connection-level dielectric layer 764 can be located between the second interconnect-level dielectric material layers 760 and the second pad-level dielectric layer 744, and can embed second pad-connection via structures 768 having a respective distal surface that is in contact with a respective one of the second bonding pads 748 and having a lesser area than an area of a horizontal surface of the respective one of the second bonding pads 748.

Each of the second bonding pads 748 comprises a second proximal horizontal surface PHS2 and a second distal horizontal surface DHS2 that is more distal from the second substrate 708 than the second proximal horizontal surface PHS2 is from the second substrate 708. The second distal horizontal surface DHS2 has a lesser total area than a total area of the second proximal horizontal surface PHS2.

The second distal horizontal surface DHS2 is connected to the second proximal horizontal surface PHS2 by a continuous sidewall that contacts the second pad-level dielectric layer 744. In one embodiment, the continuous sidewall comprises a tapered straight sidewall that contacts a tapered straight sidewall of the second pad-level dielectric layer 744. A periphery of the second distal horizontal surface DHS2 is located entirely within a periphery of the second proximal horizontal surface PHS2 in a plan view along a direction that is perpendicular to a top surface of the second substrate 708. In one embodiment, the periphery of the second proximal horizontal surface PHS2 is laterally offset outward from the periphery of the second distal horizontal surface DHS2 by a uniform lateral offset distance.

Referring to FIG. 11, a first wafer including a plurality of the first semiconductor dies 900 and a second wafer including a plurality of second semiconductor dies 700 can be aligned to each other for bonding. While the present disclosure is described employing the configuration of the first semiconductor die 900 illustrated in FIGS. 1E and 1F and the configuration of the second semiconductor die 700 illustrated in FIG. 8A, any configuration of the first semiconductor die 900 and any configuration of the second semiconductor die 700 may be employed in all possible combinations. Generally, the pattern of the bonding surfaces of the first bonding pads {(978, 988), 958, 948, 998} in each first semiconductor die 900 can be a mirror image pattern of the bonding surfaces of the second bonding pads {(778, 788}, 758, 748, 798}.

Each second bonding pad {(778, 788}, 758, 748, 798} faces a respective one of the first bonding pads {(978, 988}, 958, 948, 998}. Each facing pair of a first bonding pad {(978, 988}, 958, 948, 998} and a second bonding pad {(778, 788}, 758, 748, 798} can be aligned to maximize the areal overlap between the first bonding pads {(978, 988}, 958, 948, 998} and the second bonding pads {(778, 788}, 758, 748, 798}. If the first bonding pads {(978, 988}, 958, 948, 998} and the second bonding pads {(778, 788}, 758, 748, 798} have different areas, each overlap area between a facing pair of a first bonding pad {(978, 988}, 958, 948, 998} and a second bonding pad {(778, 788}, 758, 748, 798} can be the same as the area of the smaller bonding pad between the facing pair of the first bonding pad {(978, 988}, 958, 948, 998} and the second bonding pad {(778, 788}, 758, 748, 798}. If the first bonding pads {(978, 988}, 958, 948, 998} and the second bonding pads {(778, 788}, 758, 748, 798} have the same area, the overlap area between a facing pair of a first bonding pad {(978, 988}, 958, 948, 998} and a second bonding pad {(778, 788}, 758, 748, 798} can be in a range from 90% to 100%, such as from 95% to 100%, of the area of the first bonding pad {(978, 988}, 958, 948, 998} (which is the same as the area of the second bonding pad {(778, 788}, 758, 748, 798}).

Each facing pair of a first semiconductor die 900 and a second semiconductor die 700 can be brought into contact each other so that each first bonding pad {(978, 988}, 958, 948, 998} contacts a respective one of the second bonding pads {(778, 788}, 758, 748, 798} with a respective areal overlap therebetween. The assembly of the first semiconductor die 900 and the second semiconductor die 700 are annealed at an elevated temperature in a range from 300 degrees Celsius to 400 degrees Celsius to induce copper diffusion across each interface between facing pairs of a respective first bonding pad {(978, 988}, 958, 948, 998} and a respective second bonding pad {(778, 788}, 758, 748, 798}. Each mating pair of a first bonding surface of a first bonding pad {(978, 988}, 958, 948, 998} and a second bonding surface of a second bonding pad {(778, 788}, 758, 748, 798} are brought into contact with each other at a bonding interface located at, or close to, the horizontal plane at which the first pad-level dielectric layer (984, 944) contacts the second pad-level dielectric layer (784, 744). The duration of the anneal process at the elevated temperature can be in a range from 5 minutes to 2 hours, although shorter or longer anneal duration may also be employed. Each facing pair of a first bonding pad {(978, 988}, 958, 948, 998} and a second bonding pad {(778, 788}, 758, 748, 798} is bonded to each other during the anneal process at the elevated temperature. A first exemplary bonded structure including the first semiconductor die 900 and the second semiconductor die 700 can be formed.

Figure 11A:
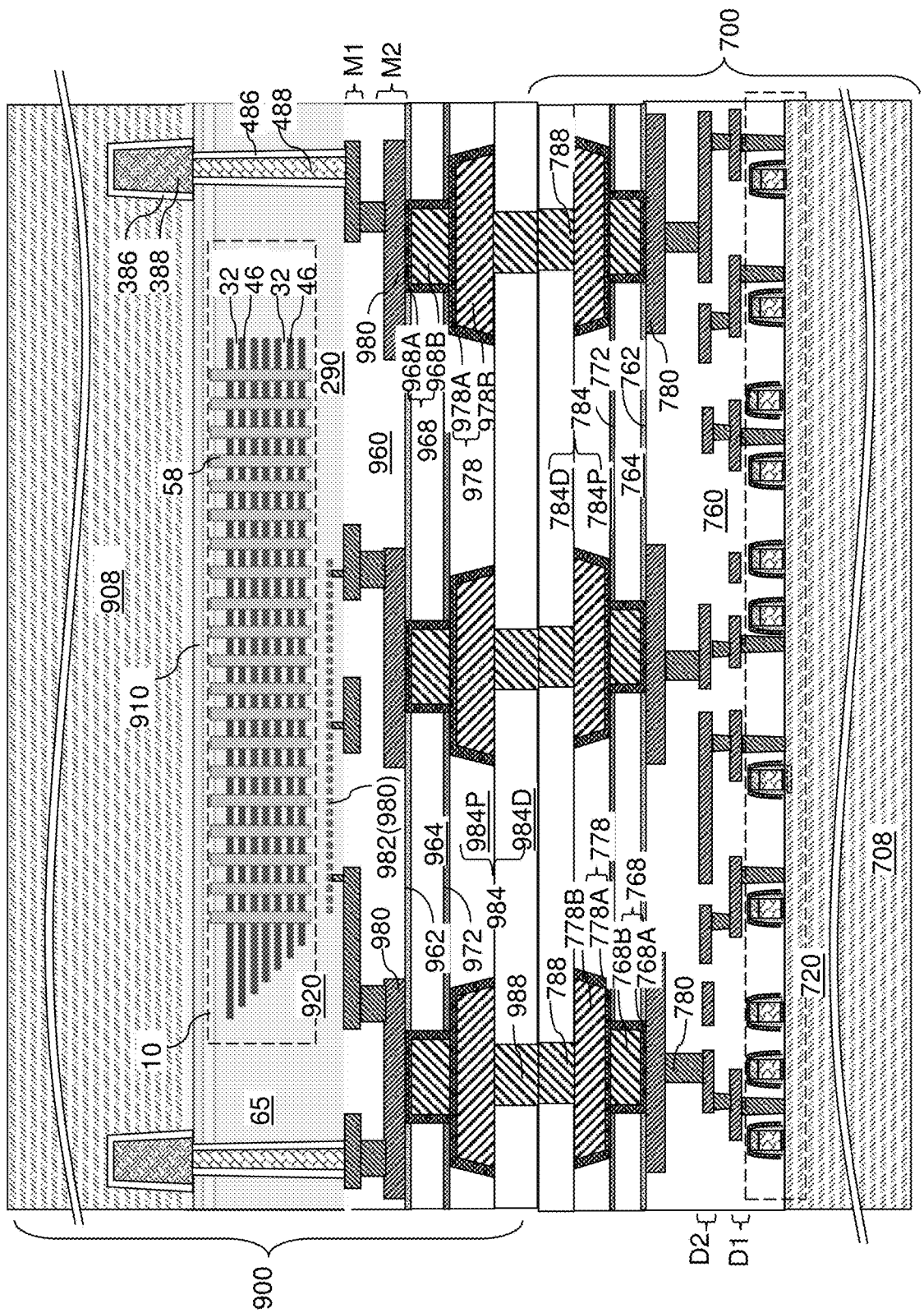
FIG. 11A is a schematic vertical cross-sectional view of a first exemplary structure including a first configuration of the first semiconductor die and a first configuration of the second semiconductor die after bonding the first semiconductor die with the second semiconductor die according to an embodiment of the present disclosure.
Figure 11B:
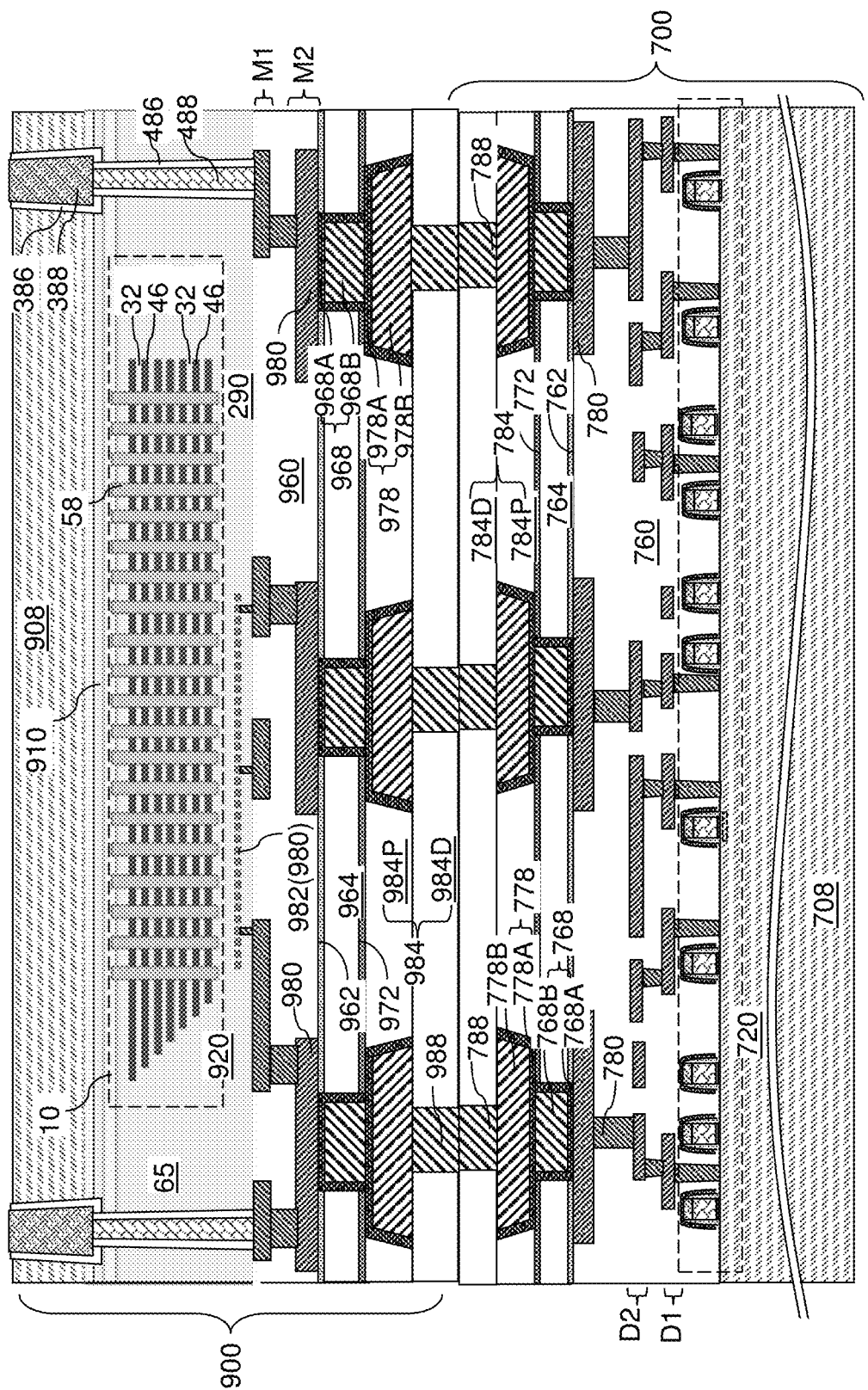
FIG. 11B is a schematic vertical cross-sectional view of the first exemplary structure after thinning the first semiconductor die from the backside according to an embodiment of the present disclosure.

Referring to FIG. 11B, the first substrate 908 may be thinned from the backside by grinding, polishing, an anisotropic etch, or an isotropic etch. The thinning process can continue until horizontal portions of the through-substrate liners 386 are removed, and horizontal surfaces of the through-substrate via structures 388 are physically exposed. Generally, end surfaces of the through-substrate via structures 388 can be physically exposed by thinning the backside of the first substrate 908, which may be the substrate of a memory die. The thickness of the first substrate 908 after thinning may be in a range from 1 micron to 30 microns, such as from 2 microns to 15 microns, although lesser and greater thicknesses can also be employed.

Figure 11C:
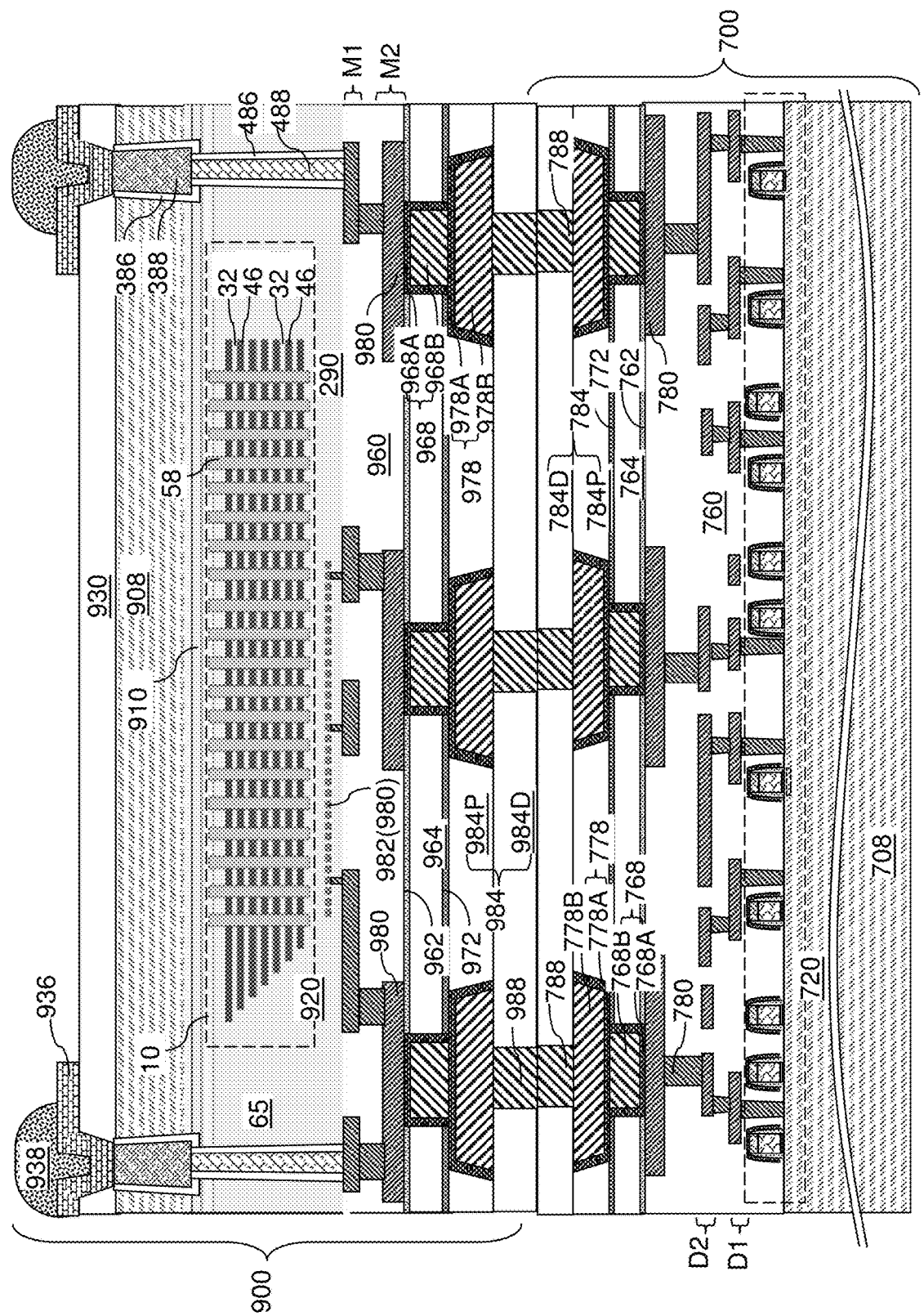
FIG. 11C is a schematic vertical cross-sectional view of the first exemplary structure after formation of a backside insulating layer, external bonding pads, and solder material portions according to an embodiment of the present disclosure.

Referring to FIG. 11C, a backside insulating layer 930 may be formed on the backside of the first substrate 908. The backside insulating layer 930 includes an insulating material such as silicon oxide. The thickness of the backside insulating layer 930 can be in a range from 50 nm to 500 nm, although lesser and greater thicknesses can also be employed. A photoresist layer (not shown) may be applied over the backside insulating layer 930, and may be lithographically patterned to form opening over areas of the through-substrate via structures 388. An etch process can be performed to form via cavities through the backside insulating layer 930 underneath each opening in the photoresist layer. A top surface of a through-substrate via structure 388 can be physically exposed at the bottom of each via cavity through the backside insulating layer 930.

At least one metallic material can be deposited into the openings through the backside insulating layer 930 and over the planar surface of the backside insulating layer 930 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 930, and over the physically exposed planar surface of the backside insulating layer 930. The thickness of the metallic nitride liner material can be in a range from 10 nm to 100 nm, although lesser and greater thicknesses can also be employed. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the backside insulating layer 930 can be in a range from 0.5 microns to 10 microns, such as from 1 micron to 5 microns, although lesser and greater thicknesses can also be employed.

The at least one metallic fill material and the metallic material layer can be subsequently patterned to form discrete backside bonding pads 936 contacting a respective one of the through-substrate via structures 388. The backside bonding pads 936 can function as external bonding pads that can be employed to electrically connect various nodes of within the first semiconductor die 900 and the second semiconductor die 700 to external nodes, such as bonding pads on a packaging substrate or C4 bonding pads of another semiconductor die. For example, solder material portions 938 can be formed on the backside bonding pads 936, and a C4 bonding process or a wire bonding process can be performed to electrically connect the backside bonding pads 936 to external electrically active nodes.

Generally, backside bonding pads 936 can be formed on a backside surface of the first semiconductor die 900 (which may be a memory die) that is located on an opposite side of the bonding interface between the first bonding pads {(978, 988}, 958, 948, 998} and the second bonding pads {(778, 788}, 758, 748, 798}. Through-substrate via structures 388 can vertically extend through the first semiconductor die 900, and can provide electrical connection between the backside bonding pads 936 and a subset of the bonding pads (988, 788).

Figure 11D:
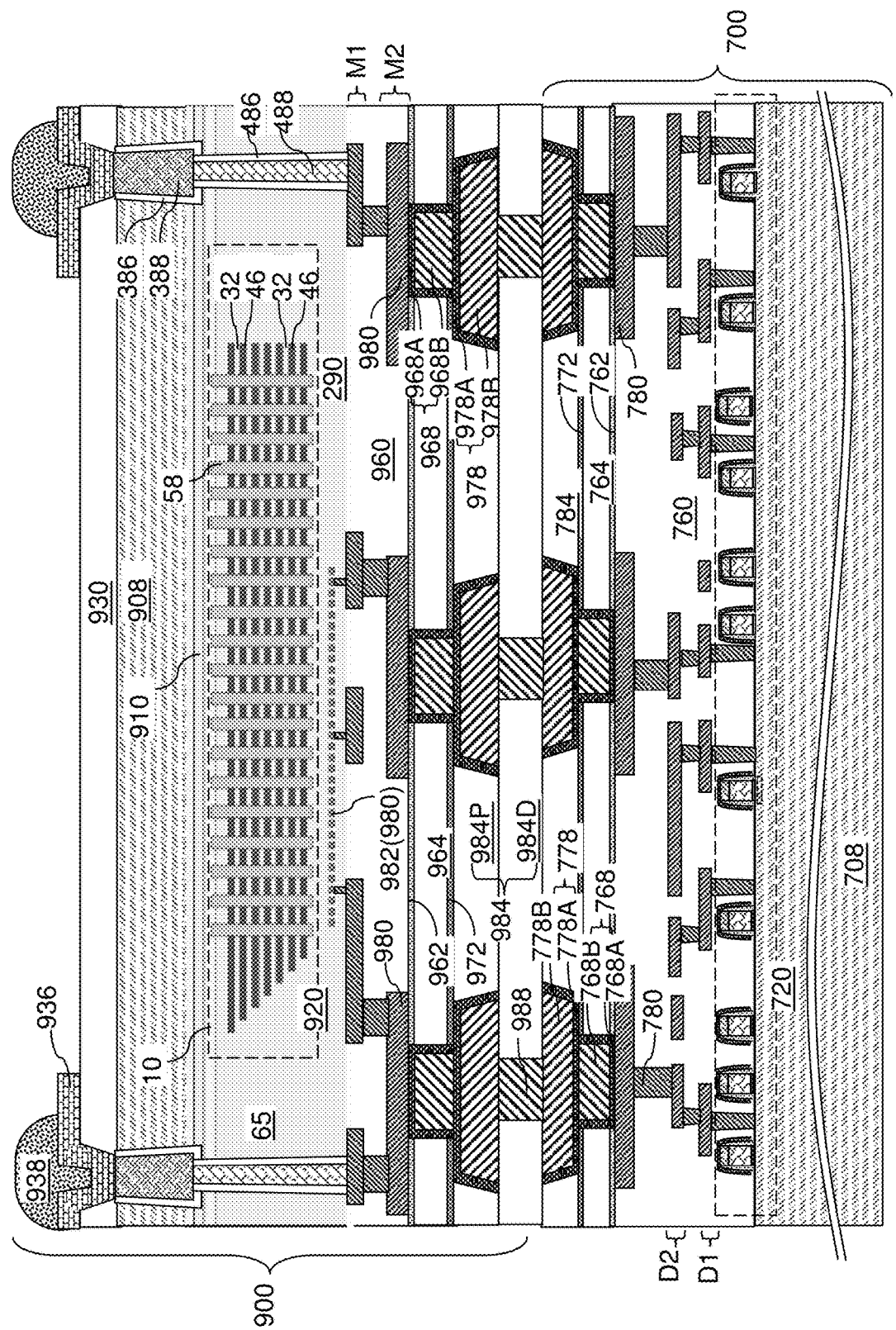
FIGS. 11D and 11E are schematic vertical cross-sectional views of variants of the first exemplary structure of FIG. 11C in which only one semiconductor die has reentrant profile bonding pads.
Figure 11E:
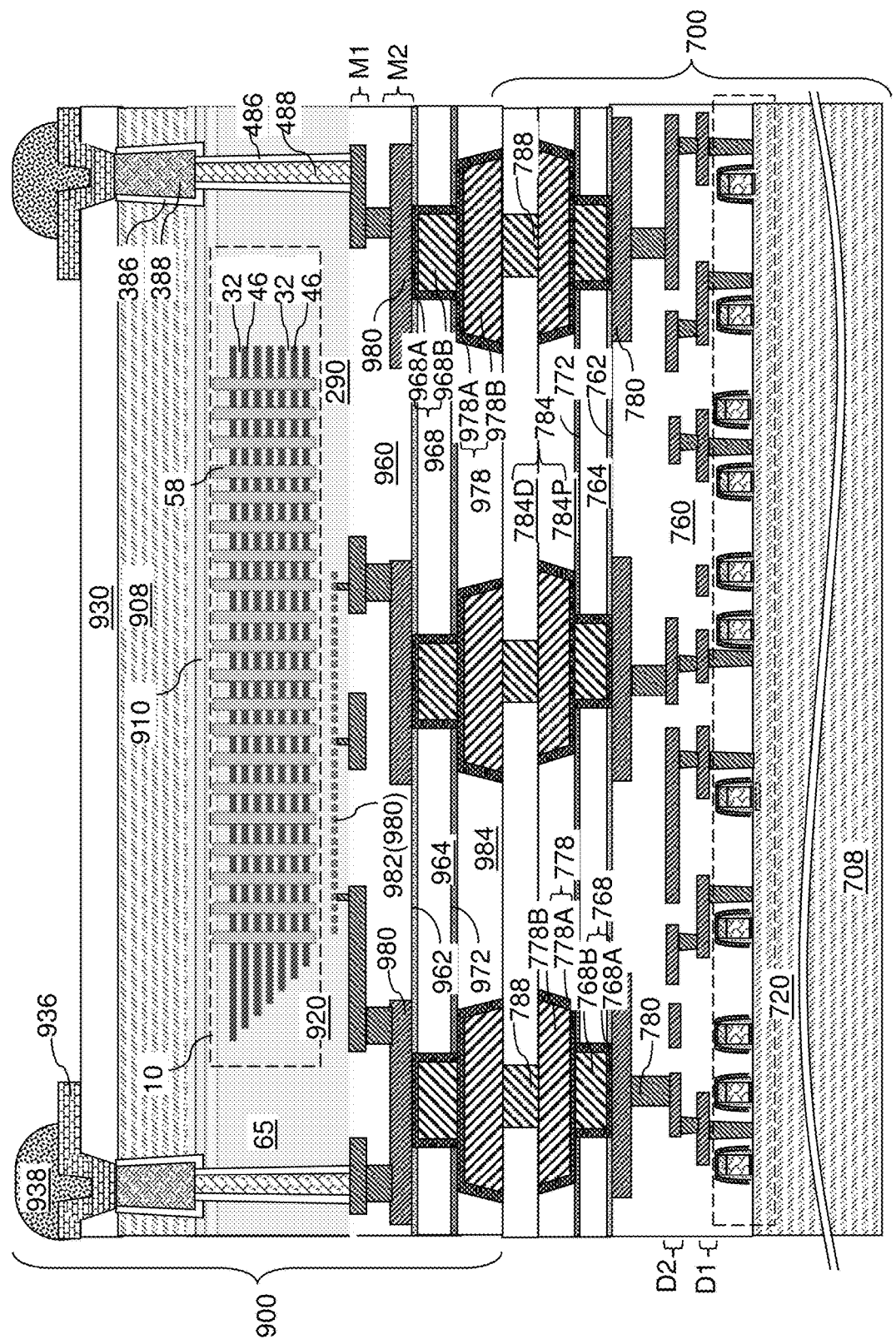

In alternative variants of the first exemplary structure, the reentrant shaped bonding pads having a lesser distal horizontal surface area of each bonding pad than the area of a proximal horizontal surface area of the respective bonding pad shown in FIG. 11C may be implemented in only one semiconductor die in a bonded assembly, as illustrated in FIGS. 11D and 11E. As shown in FIG. 11D, only the first semiconductor die 900 has reentrant shaped bonding pads. Alternatively, as shown in FIG. 11E, only the second semiconductor die 700 has reentrant shaped bonding pads.

Figure 12:
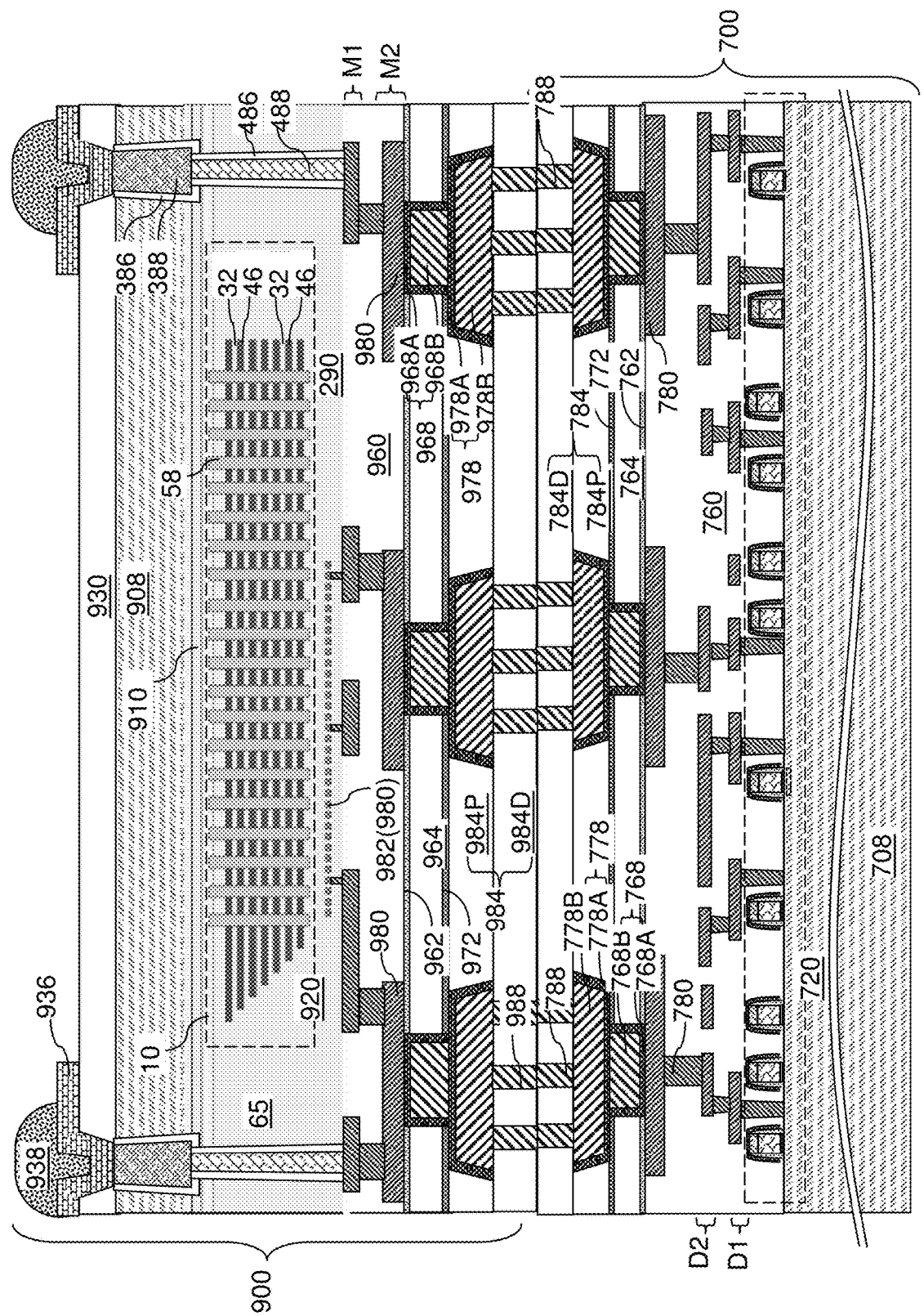
FIG. 12 is a schematic vertical cross-sectional view of a variant of the first exemplary structure after formation of a backside insulating layer, external bonding pads, and solder material portions according to an embodiment of the present disclosure.

Referring to FIG. 12, a variant of the first exemplary structure can be derived from the first exemplary structure of FIG. 11C by employing a variant of the first configuration of the first semiconductor die 900 illustrated in FIGS. 2A and 2B and by employing a variant of the first configuration of the second semiconductor die 700 illustrated in FIG. 8B.

Figure 13:
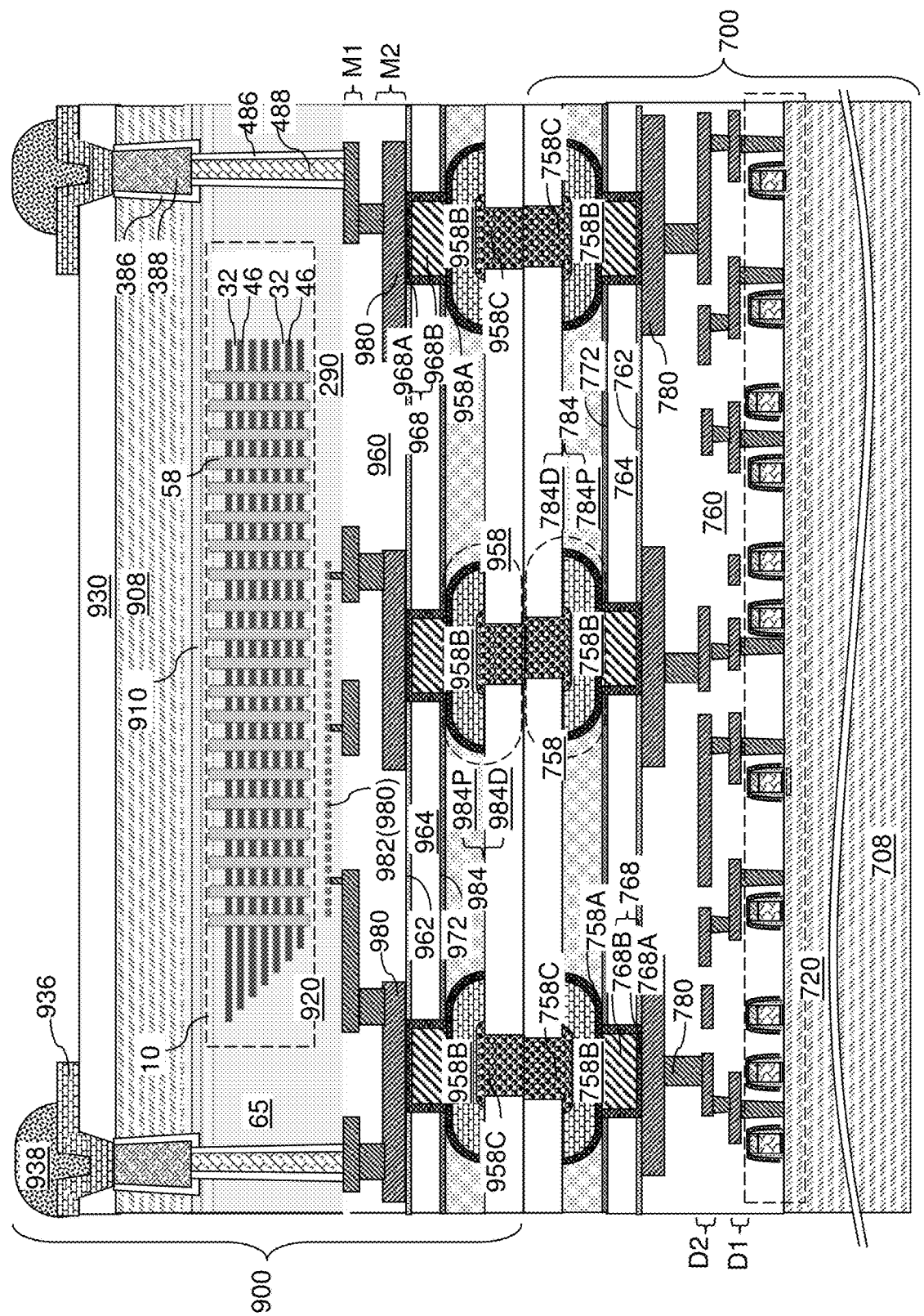
FIG. 13 is a schematic vertical cross-sectional view of a second exemplary structure after formation of a backside insulating layer, external bonding pads, and solder material portions according to an embodiment of the present disclosure.

Referring to FIG. 13, a second exemplary structure can be derived from the first exemplary structure of FIG. 11C by employing a second configuration of the first semiconductor die 900 illustrated in FIG. 3F (or variants thereof as shown in FIGS. 3G and 3H) and by employing a second configuration of the second semiconductor die 700 illustrated in FIG. 8C (or variants thereof as illustrated in FIGS. 8D and 8E).

Figure 14:
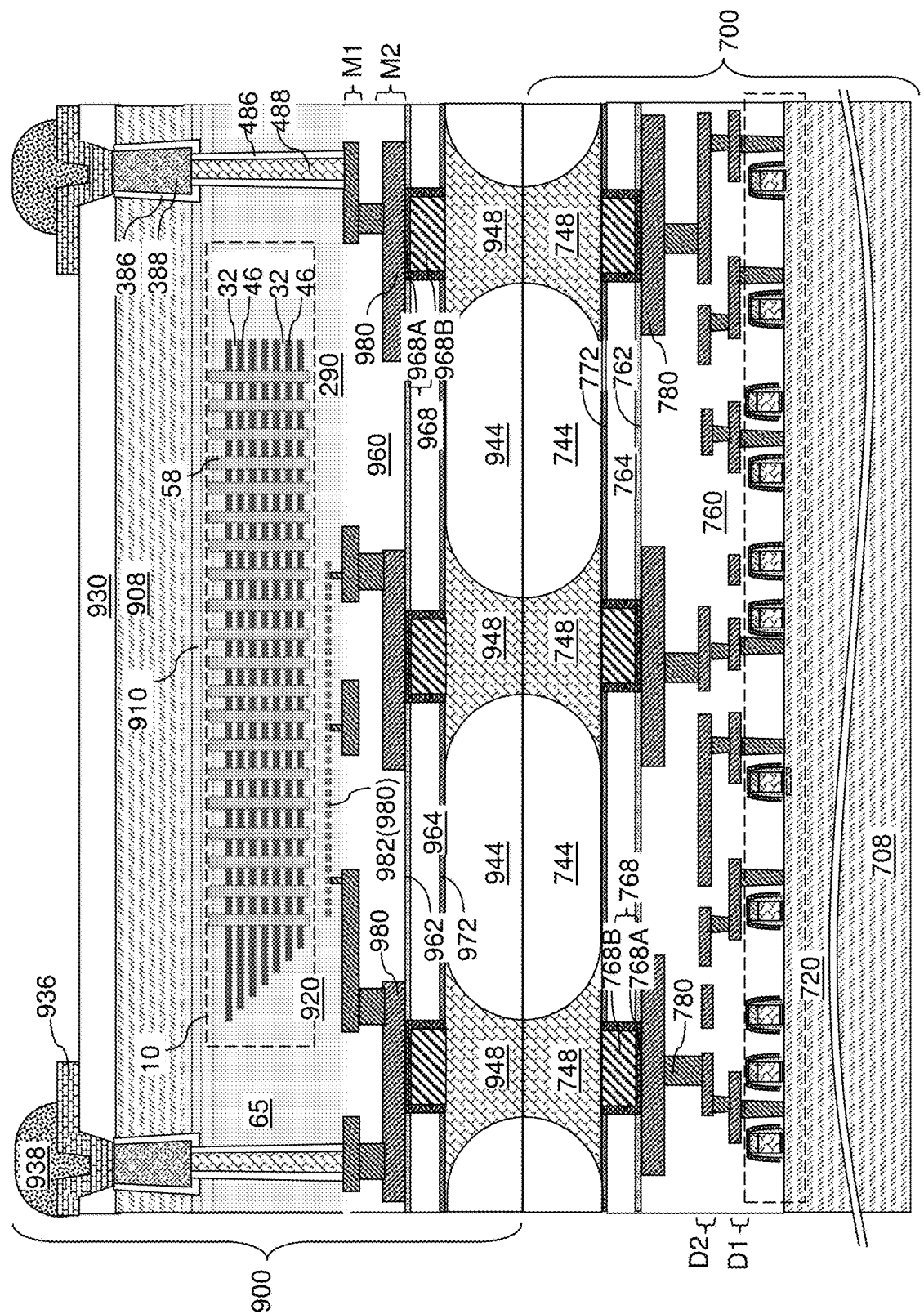
FIG. 14 is a schematic vertical cross-sectional view of a third exemplary structure after formation of a backside insulating layer, external bonding pads, and solder material portions according to an embodiment of the present disclosure.

Referring to FIG. 14, a third exemplary structure can be derived from the first exemplary structure of FIG. 11C by employing a third configuration of the first semiconductor die 900 illustrated in FIGS. 4F and 4G or by employing a fifth configuration of the first semiconductor die 900 illustrated in FIG. 6C, and by employing a third configuration of the second semiconductor die 700 illustrated in FIG. 9.

Figure 15:
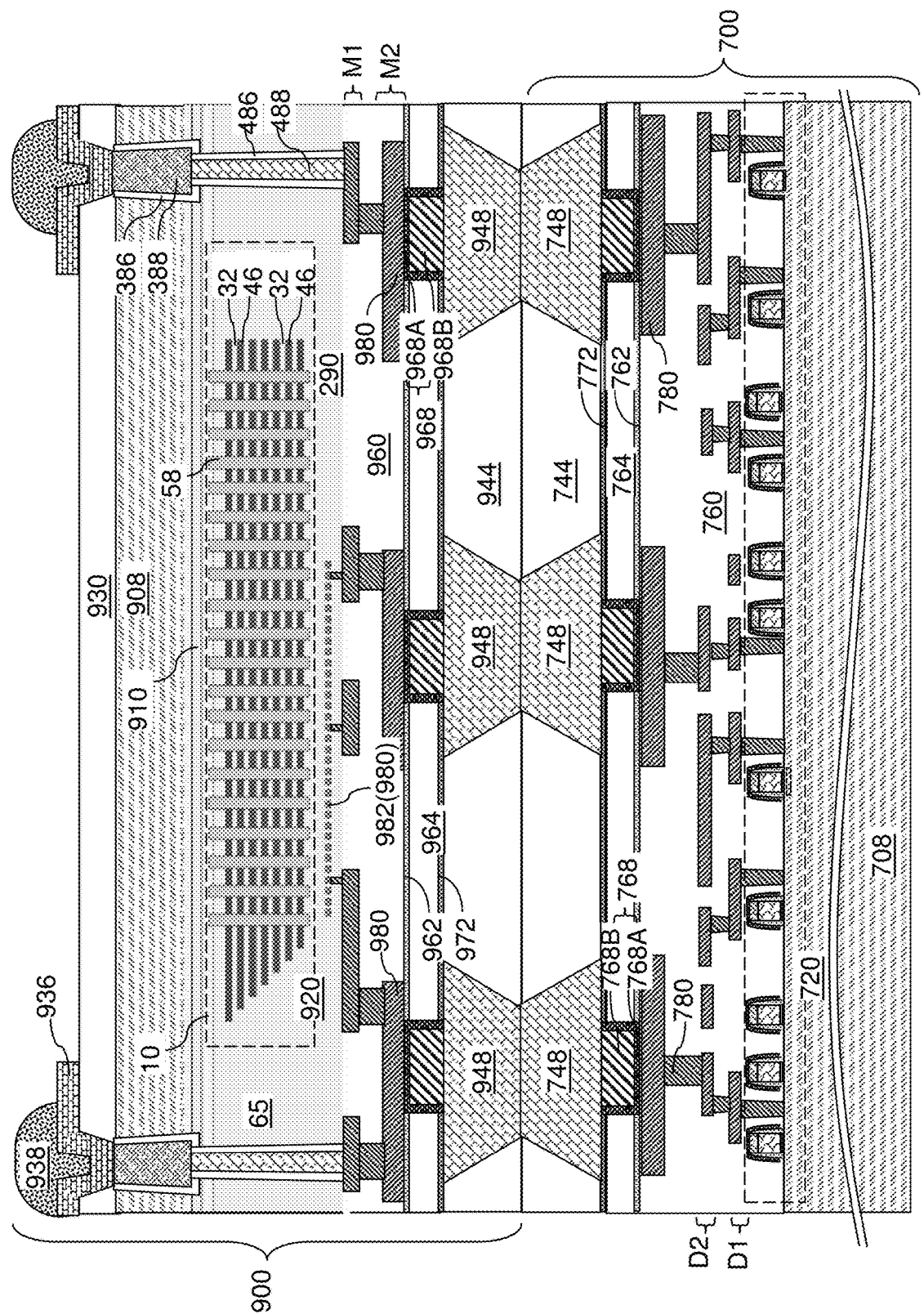
FIG. 15 is a schematic vertical cross-sectional view of a fourth exemplary structure after formation of a backside insulating layer, external bonding pads, and solder material portions according to an embodiment of the present disclosure.

Referring to FIG. 15, a fourth exemplary structure can be derived from the first exemplary structure of FIG. 11C by employing a fourth configuration of the first semiconductor die 900 illustrated in FIGS. 5F and 4G or by employing a sixth configuration of the first semiconductor die 900 illustrated in FIG. 7C, and by employing a fourth configuration of the second semiconductor die 700 illustrated in FIG. 10.

The reentrant shaped bonding pads having a lesser distal horizontal surface area of each bonding pad than the area of a proximal horizontal surface area of the respective bonding pad shown in FIGS. 11D and 11E may be implemented in only one semiconductor die in a bonded assembly illustrated in FIGS. 12, 13, 14 and/or 15.

The change in volume of a bonding pad after the bonding anneal is a function of the initial volume of the bonding pad. The change in height of the bonding pad after the bonding anneal is proportional to the change in volume divided by the area of the bonding pad at the bonding interface. Thus, reentrant shaped bonding pads have a larger change in height of the bonding pad after the bonding anneal because they have a larger volume in the proximal portion of the bonding pad (which acts as a reservoir of the bonding metal) and a smaller area of the distal portion of the bonding pad at the bonding interface. Therefore, the reentrant shape of bonding pad of one or more semiconductor dies of the embodiments present disclosure can be advantageously employed to ensure that the bonding surface of a mating pair of bonding pads make direct contact with each other during a bonding process, and thus decrease an amount of voids between the mating pads, and increase the bonding yield and the reliability of bonded pads.

Referring to all drawings of the present disclosure collectively, the various embodiments of the present disclosure provide a structure comprising a first semiconductor die 900. The first semiconductor die 900 can comprise: first semiconductor devices 920 located over a first substrate 908; first interconnect-level dielectric material layers (290, 960) embedding first metal interconnect structures 980 and located on the first semiconductor devices 920; and a first pad-level dielectric layer (984, 944) located on the first interconnect-level dielectric material layers (290, 960) and embedding first bonding pads {(978, 988), 958, 948, 998}, wherein each of the first bonding pads {(978, 988), 958, 948, 998} comprises a first pad base portion {(958A, 958B), (958A, 958D1), 958B} and at least one first pad pillar portion (958C, 958D2) that has a lesser area than the first pad base portion {(958A, 958B), (958A, 958D1), 958B}, and is more distal from the first substrate 908 than the first pad base portion {(958A, 958B), (958A, 958D1), 958B} is from the first substrate 908.

According to another aspect of the present disclosure, a structure comprising a first semiconductor die 900 is provided. The first semiconductor die 900 can comprise: first semiconductor devices 920 located over a first substrate 908; first interconnect-level dielectric material layers (290, 960) embedding first metal interconnect structures 980 and located on the first semiconductor devices 920; and a first pad-level dielectric layer (984, 944) located on the first interconnect-level dielectric material layers (290, 960) and embedding first bonding pads {(978, 988), 958, 948, 998}, wherein each of the first bonding pads {(978, 988), 958, 948, 998} comprises a first proximal horizontal surface PHS1 and at least one first distal horizontal surface DHS1 that is more distal from the first substrate 908 than the first proximal horizontal surface PHS1 is from the first substrate 908 and has a lesser total area than a total area of the first proximal horizontal surface PHS1.

FIGS. 16A-16D are sequential vertical cross-sectional views of a first configuration of a first bonding pad for a fifth exemplary structure according to another embodiment of the present disclosure.

Figure 16B:
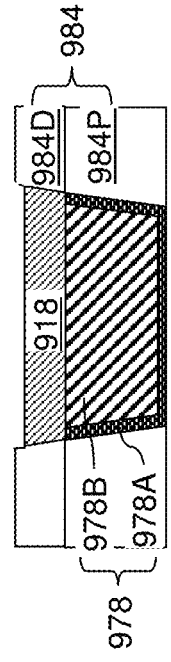
FIGS. 16A-16D are sequential vertical cross-sectional views of a first configuration of a first bonding pad for a fifth exemplary structure according to an embodiment of the present disclosure.
Figure 16D:
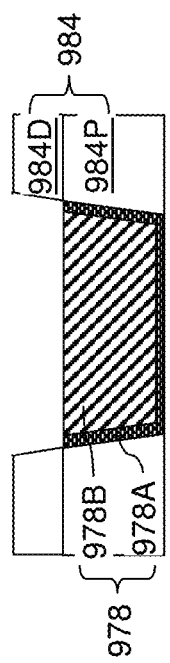
Figure 16A:
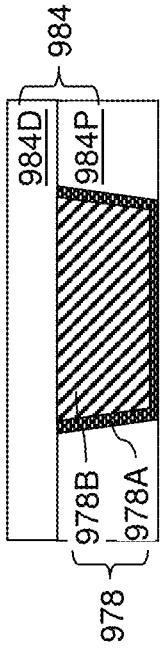

Referring to FIG. 16A, the first configuration of the first bonding pad for the fifth exemplary structure can be provided by performing any of the previously described processing steps for forming first pad base portions 978 in the first proximal pad-level dielectric layer 984P. In one embodiment, the first pad base portions 978 may include copper at an atomic percentage greater than 95%. In one embodiment, the first pad base plate portions 978B comprise, and/or consist essentially of, copper, and can be formed by electroplating and a subsequent planarization process, such as a chemical mechanical planarization process. In one embodiment, the first pad base portions 978 may have a respective planar top surface that is coplanar with a top surface of the first proximal pad-level dielectric layer 984P.

Referring to FIG. 16B, a first distal pad-level dielectric layer 984D can be deposited in the same manner as described above. The combination of the first proximal pad-level dielectric layer 984P and the first distal pad-level dielectric layer 984D constitutes a first pad-level dielectric layer 984.

Figure 16C:
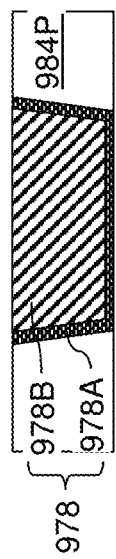

Referring to FIG. 16C, a pad cavity can be formed above each first pad base portion 978, for example, by forming a photoresist layer above the first distal pad-level dielectric layer 984D, patterning the photoresist layer with openings having the same pattern as the first pad base portions 978, and transferring the pattern in the photoresist layer through the first distal pad-level dielectric layer 984D. A top surface of a first pad base portion 978 can be physically exposed at the bottom of each pad cavity. The photoresist layer can be subsequently removed, for example, by ashing.

Referring to FIG. 16D and according to an aspect of the present disclosure, first metal alloy-forming material portions 918 can be formed in each pad cavity in the first distal pad-level dielectric layer on a respective one of the first pad base portions 978. In one embodiment, the first metal alloy-forming material portions 918 comprise silicon, germanium or a silicon-germanium compound semiconductor material which can form a first metal-semiconductor alloy material, such as copper silicide (e.g., $Cu_5Si$, $Cu_{15}Si_4$ and/or $Cu_3Si$), copper germanide or copper germanide-silicide after annealing by interdiffusion with copper of first pad base portions 978. The annealing may be conducted after deposition of the first metal alloy-forming material portions 918, or during a subsequent die bonding step which will be described in more detail below with respect to FIGS. 18 and 19. In another embodiment, the first metal alloy-forming material portions 918 comprise an as-deposited first metal-semiconductor alloy material, such as copper silicide, copper germanide or copper germanide-silicide. In yet another embodiment, the first metal alloy-forming material portions 918 comprise a first intermetallic alloy material, such as an alloy of copper and at least one other metal. For example, the intermetallic alloy may comprise a copper based alloy containing more than 50 atomic percent copper, such as 60 to 99 atomic percent copper, such as 80 to 98 atomic percent copper, and less than 50 atomic percent, such as 1 to 40 atomic percent, such as 2 to 20 atomic percent of another metal, such as a metal selected from aluminum, zinc, iron and/or tin.

Generally, the first metal-semiconductor alloy material or the first intermetallic alloy material of the first metal alloy-forming material portions 918 has a higher coefficient of thermal expansion (CTE) than the material (e.g., copper) of first pad base portions 978. Copper has a CTE of about $1.65 \times 10^{-5}$/K. In one embodiment, the first pad base portions 978 may include copper at an atomic percentage greater than 95%, and can have a CTE in a range from $1.5 \times 10^{-5}$/K to $2.0 \times 10^{-5}$/K, and the material of the first metal alloy-forming material portions 918 can have a CTE in a range from $1.7 \times 10^{-5}$/K to $4.0 \times 10^{-5}$/K. The first metal alloy-forming material portions 918 can be formed by chemical vapor deposition, physical vapor deposition, spin coating, electroplating, or electroless plating. Each contiguous combination of a first pad base portion 978 and a first metal alloy-forming material portion 918 comprises a first bonding pad (978, 918).

Figure 17B:
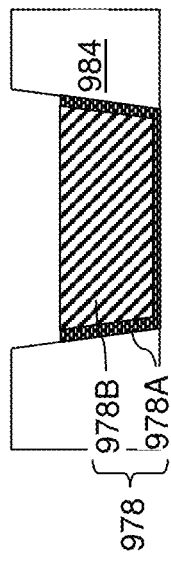
FIGS. 17A-17C are sequential vertical cross-sectional views of a second configuration of a first bonding pad for the fifth exemplary structure according to an embodiment of the present disclosure.
Figure 17A:
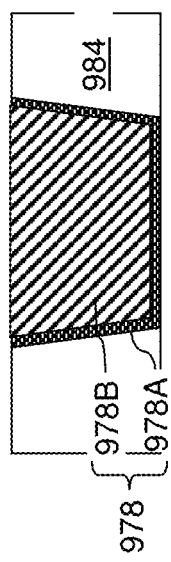
Figure 17C:
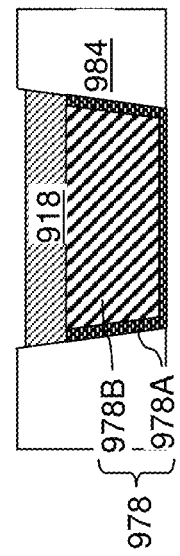

FIGS. 17A-17C are sequential vertical cross-sectional views of a second configuration of a first bonding pad for the fifth exemplary structure according to an embodiment of the present disclosure.

Referring to FIG. 17A, first pad base portions 978 can be formed in a first pad-level dielectric layer 984. The thickness of the first pad-level dielectric layer 984 may be in a range for the combined thickness for the first proximal pad-level dielectric layer 984P and the first distal pad-level dielectric layer 984D. The first pad base portions 978 may include copper at an atomic percentage greater than 95%. In one embodiment, the first pad base plate portions 978B comprise, and/or consist essentially of, copper, and can be formed by electroplating and a subsequent planarization process such as a chemical mechanical planarization process. In one embodiment, the first pad base portions 978 may have a respective planar top surface that is coplanar with a top surface of the first pad-level dielectric layer 984.

Referring to FIG. 17B, a recess etch process can be performed to vertically recess the top surfaces of the first pad base portions 978. The vertical recess distance may be in a range from 30 nm to 600 nm, such as from 60 nm to 300 nm, although lesser and greater vertical recess distances may also be employed. A wet etch process or a dry etch process may be employed for the recess etch process. Pad cavities are formed in volumes formed by recessing the first pad base portions 978.

Referring to FIG. 17C, the processing steps of FIG. 16D can be performed to form first metal alloy-forming material portions 918 in each pad cavity in the first pad-level dielectric layer 984 on a respective one of the first pad base portions 978. The first metal alloy-forming material portions 918 can have the same material composition and the same thickness as described above. Each contiguous combination of a first pad base portion 978 and a first metal alloy-forming material portion 918 comprises a first bonding pad (978, 918).

Figure 18:
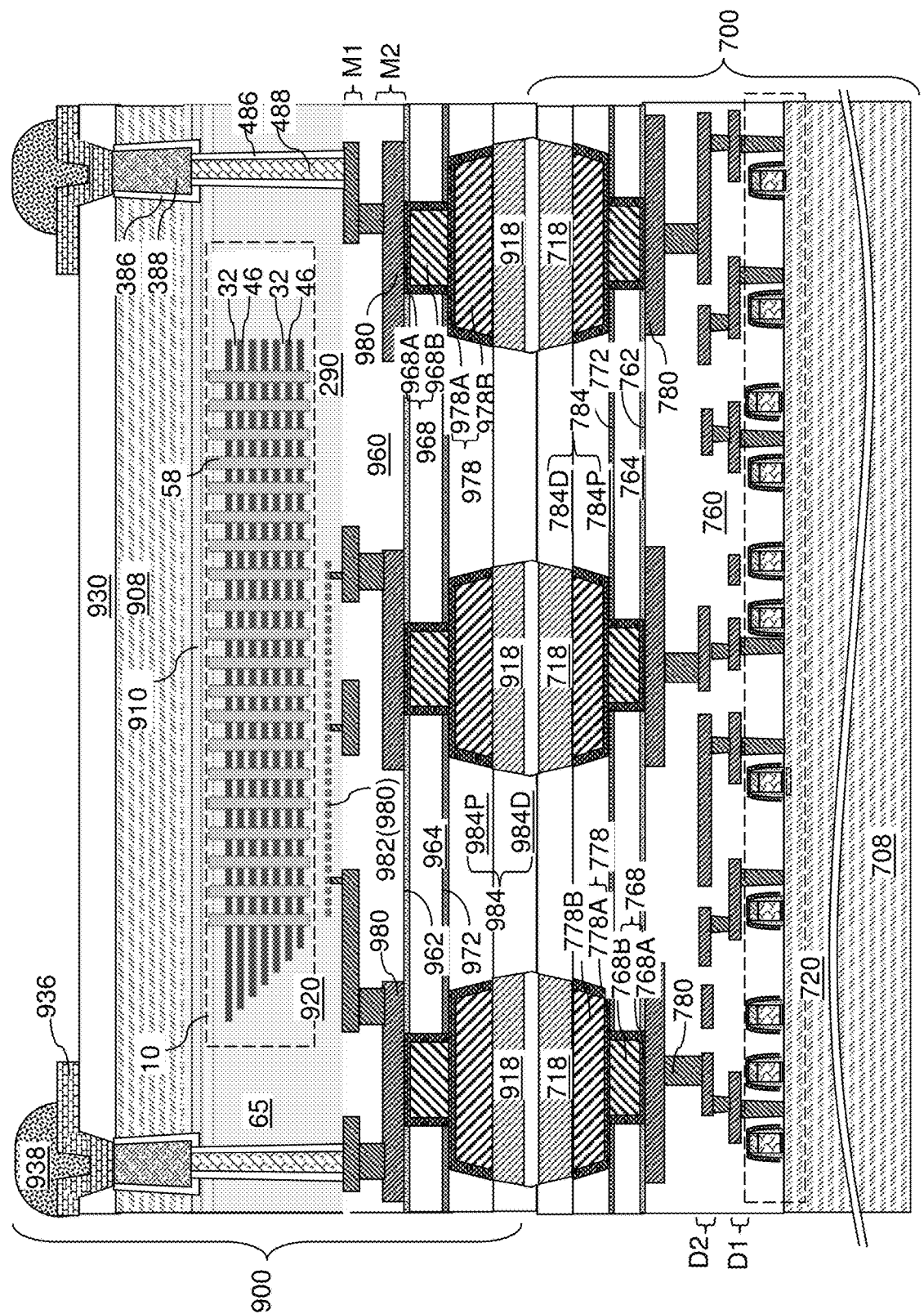
FIG. 18 is a vertical cross-sectional view of the fifth exemplary structure after aligning two semiconductor dies and prior to bonding according to an embodiment of the present disclosure.

Referring to FIG. 18, a fifth exemplary structure is illustrated after aligning a first semiconductor die 900 and a second semiconductor die 700 for bonding. Generally, a first semiconductor die 900 is provided, which comprises first semiconductor devices 910 located over a first substrate 908, and a first pad-level dielectric layer 984 and embedding first bonding pads (978, 918). In one embodiment, each of the first bonding pads (978, 918) comprises a respective first pad base portion 978 and a respective first metal alloy-forming material portion 918. A second semiconductor die 700 is provided, which comprises second semiconductor devices 710 located over a second substrate 708, and a second pad-level dielectric layer 784 embedding second bonding pads (778, 718). In one embodiment, each of the second bonding pads (778, 718) comprises a respective second pad base portion 778 and a respective second metal alloy-forming material portion 718. Generally, the second pad base portions 778 can have the same geometry and the same material composition as any of the first pad base portions 978 described above. The second metal alloy-forming material portions 718 can have the same geometry and the same material composition as any of the first metal alloy-forming material portions 918 described above. In one embodiment described above with respect to FIG. 16D, the first metal alloy-forming material portions 918 comprise silicon, germanium or a silicon-germanium compound semiconductor material which can form a first metal-semiconductor alloy material, such as copper silicide (e.g., $Cu_5Si$, $Cu_{15}Si_4$ and/or $Cu_3Si$), copper germanide or copper germanide-silicide after annealing by interdiffusion with copper of first pad base portions 978.

Figure 19:
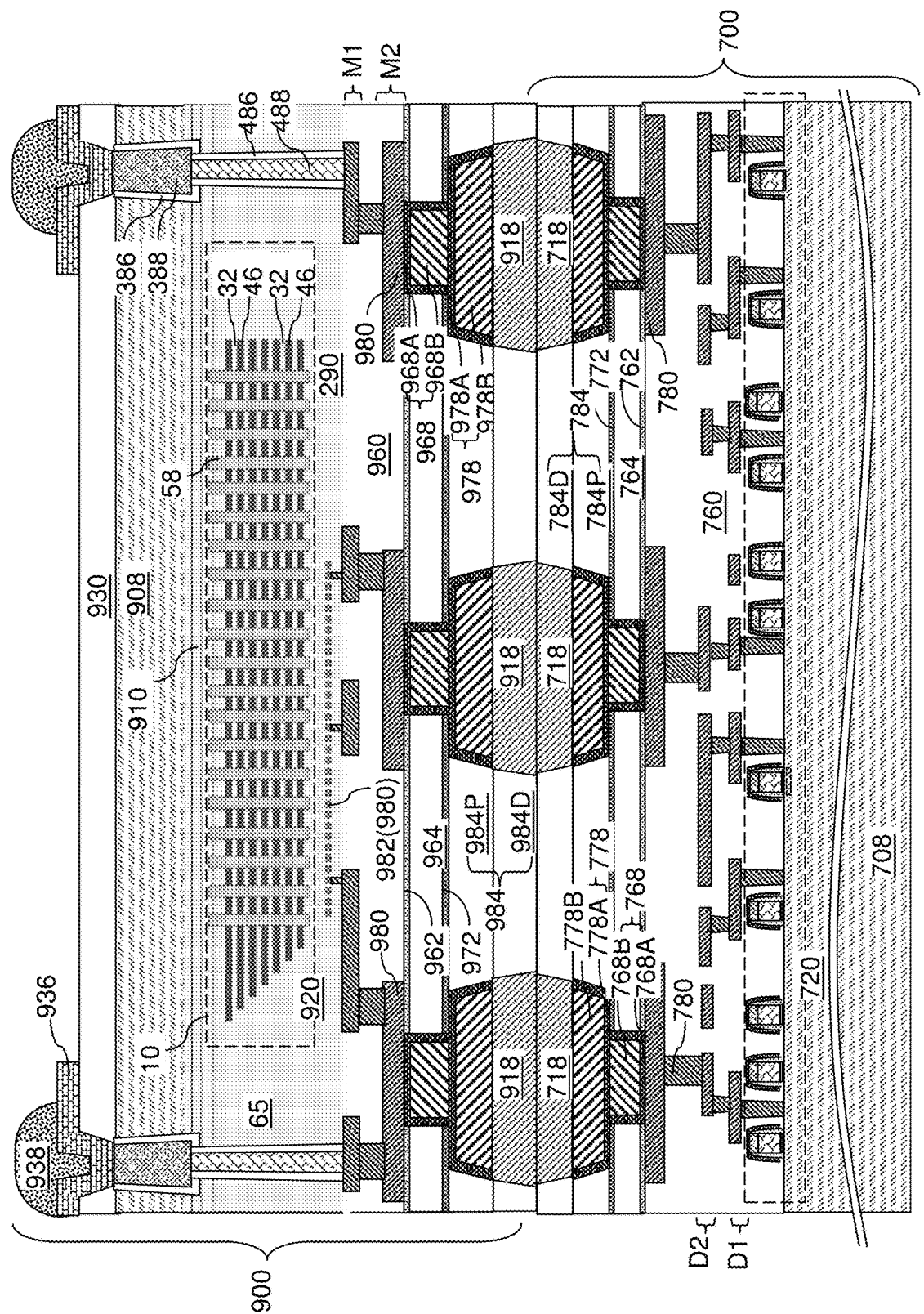
FIG. 19 is a vertical cross-sectional view of the fifth exemplary structure after formation of a bonded assembly according to an embodiment of the present disclosure.

Referring to FIG. 19, an anneal process is performed to induce bonding between the first bonding pads (978, 918) and the second bonding pads (778, 718). In one embodiment, the first metal alloy-forming material portions 918 and the second metal alloy-forming material portions 718 comprise a first metal-semiconductor alloy-forming material and a second metal-semiconductor alloy material. The second metal-semiconductor alloy material may be the same as, or may be different from, the first metal-semiconductor alloy material.

In one embodiment, the as-deposited first metal alloy-forming material portions 918 and the second metal alloy-forming material portions 718 comprise, and/or consist essentially of, silicon, germanium or a silicon-germanium compound semiconductor. During the bonding anneal, the first metal alloy-forming material portions 918 interdiffuse with the first pad base portions 978 to form first metal-semiconductor alloy material, such as copper silicide, copper germanide, or copper germanide-silicide in the first metal alloy-forming material portions 918. During the bonding anneal, the second metal alloy-forming material portions 718 also interdiffuse with the second pad base portions 778 to form a second metal-semiconductor alloy material, such as copper silicide, copper germanide, or copper germanide-silicide in the second metal alloy-forming material portions 718. For example, the $Cu_3Si$ phase of copper silicide may be formed at about 200° C. by reaction of a copper layer and a silicon layer. The bonding anneal temperature may be between 200° C. and 400° C., such as between 250° C. and 350° C., which is sufficient to form copper silicide first metal alloy-forming material portions 918 and second metal alloy-forming material portions 718. Performing the silicidation anneal and the bonding anneal during the same annealing step results in the volume expansion during formation of the silicide and also leads to a strong contact and bond between the two silicide portions (718, 918). This can supplement the benefits of higher volume expansion of the bonding surfaces due to a higher coefficient of thermal expansion.

In another embodiment, the as-deposited first metal alloy-forming material portions 918 and the second metal alloy-forming material portions 718 comprise, and/or consist essentially of, copper silicide, copper germanide, or copper germanide-silicide. In yet another embodiment, the as-deposited first metal alloy-forming material portions 918 and the second metal alloy-forming material portions 718 comprise, and/or consist essentially of an intermetallic alloy, such as a copper based alloy with at least one of Al, Zn, Fe or Sn.

The first metal alloy-forming material portions 918 which comprise the above metal-semiconductor alloy or intermetallic alloy material have a higher coefficient of thermal expansion (CTE) than the CTE of the respective first pad base portion 978. The second metal alloy-forming material portions 718 which comprise the above metal-semiconductor alloy or intermetallic alloy material have a higher CTE than the CTE of the respective second pad base portion 778. The higher CTE leads to a higher volume expansion during an anneal.

The volumes of the first metal alloy-forming material portions 918 and the second metal alloy-forming material portions 718 expand at the elevated temperature during the bonding anneal process. Each mating pair of a first metal alloy-forming material portions 918 and a second metal alloy-forming material portions 718 is bonded to each other by metal-to-metal bonding to form bonded pairs of a first bonding pad (978, 918) and a second bonding pad (778, 718). The higher CTE of the first metal alloy-forming material portions 918 and the second metal alloy-forming material portions 718 relative to the materials of the first pad base portions 978 and the second pad base portions 778 facilitates improved filling of the cavities between mating pairs of the first bonding pads (978, 918) and a second bonding pads (778, 718) compared to bonding pads which consist of only the respective copper base portions 998 and 778. Each of the second bonding pads (778, 718) is bonded to a respective one of the first bonding pads (978, 918).

Figure 20A:
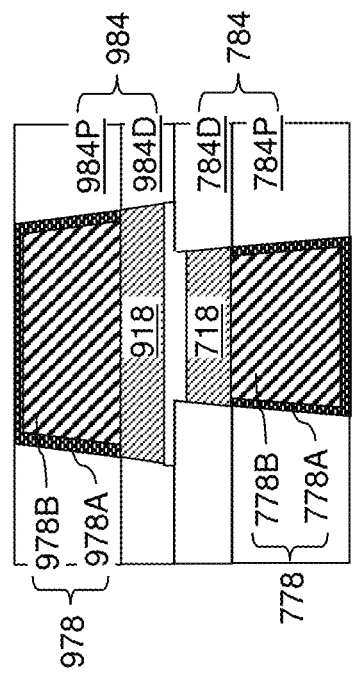
FIGS. 20A and 20B are sequential vertical cross-sectional views of a third configuration of bonding pads in the fifth exemplary structure during a bonding process according to an embodiment of the present disclosure.
Figure 20B:
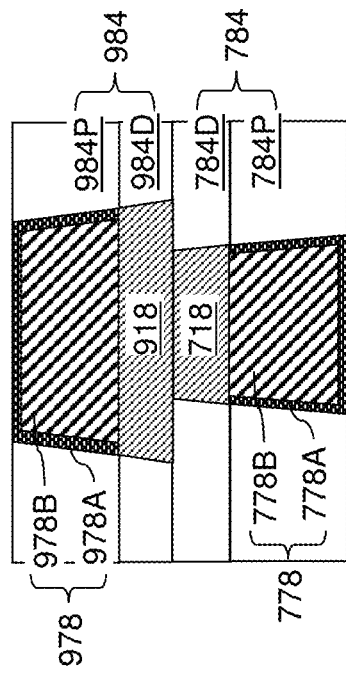

FIGS. 20A and 20B are sequential vertical cross-sectional views of a third configuration of bonding pads in the fifth exemplary structure during a bonding process according to another embodiment of the present disclosure.

Referring to FIG. 20A, the third configuration of the bonding pads can be derived from the configuration illustrated in FIG. 18 by reducing the lateral dimension of the second bonding pads (778, 718) relative to the lateral dimension of the first bonding pads (978, 918) and by employing a tapered reentrant profile for the second bonding pads (778, 718). In one embodiment, the processing steps of FIGS. 5A-5F, 6A-6C, or 7A-7C may be employed to form the second bonding pads (778, 718) illustrated in FIG. 20A.

Referring to FIG. 20B, the processing steps of FIG. 19 may be performed to form a bonded assembly. Each mating pair of a first bonding pad (978, 918) and a second bonding pad (778, 718) is bonded to each other.

Figure 21B:
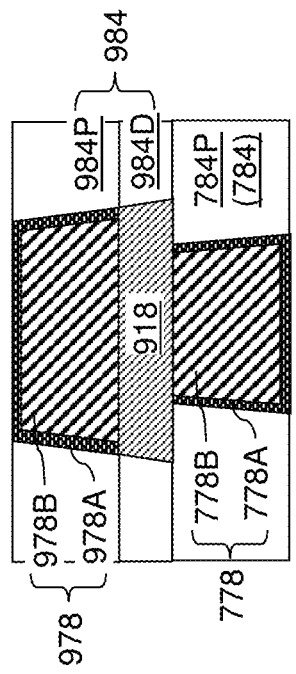
FIGS. 21A and 21B are sequential vertical cross-sectional views of a fourth configuration of bonding pads in the fifth exemplary structure during a bonding process according to an embodiment of the present disclosure.
Figure 21A:
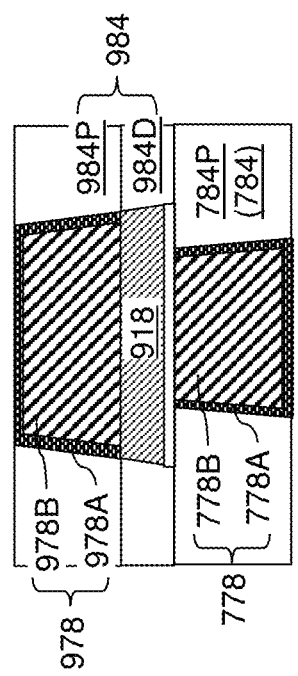

FIGS. 21A and 21B are sequential vertical cross-sectional views of a fourth configuration of bonding pads in the fifth exemplary structure during a bonding process according to an embodiment of the present disclosure.

Referring to FIG. 21A, the fourth configuration of the bonding pads can be derived from the configuration illustrated in FIG. 20A by omitting the processing steps for formation of the second distal pad-level dielectric layer 784D and the second metal alloy-forming material portions 718. Each second bonding pad includes a second pad base portion 778.

Referring to FIG. 21B, the processing steps of FIG. 19 may be performed to form a bonded assembly. Each mating pair of a first bonding pad (978, 918) and a second bonding pad 778 is bonded to each other. In one embodiment, the second pad base portions 778 include copper at an atomic percentage greater than 95%, and are bonded directly to a respective one of the first metal alloy-forming material portions 918.

Figure 22B:
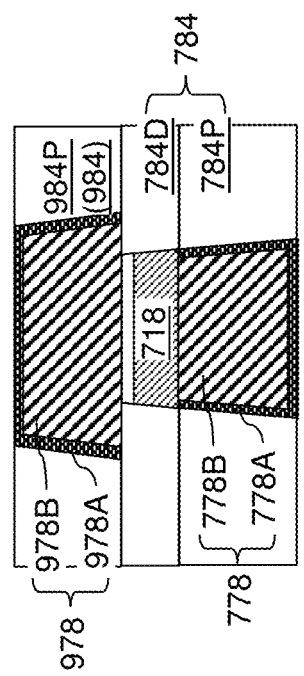
FIGS. 22A and 22B are sequential vertical cross-sectional views of a fifth configuration of bonding pads in the fifth exemplary structure during a bonding process according to an embodiment of the present disclosure.
Figure 22A:
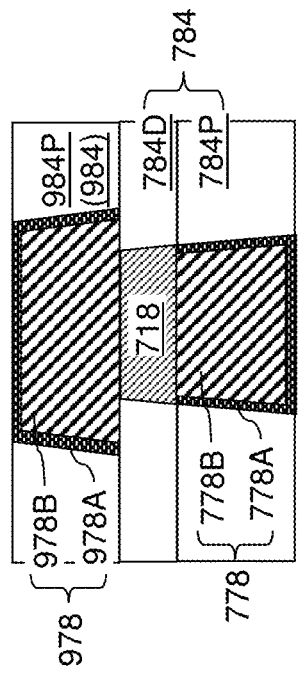

FIGS. 22A and 22B are sequential vertical cross-sectional views of a fifth configuration of bonding pads in the fifth exemplary structure during a bonding process according to an embodiment of the present disclosure.

Referring to FIG. 22A, the fifth configuration of the bonding pads can be derived from the configuration illustrated in FIG. 20A by omitting the processing steps for formation of the first distal pad-level dielectric layer 984D and the first metal alloy-forming material portions 918. Each first bonding pad includes a first pad base portion 978.

Referring to FIG. 22B, the processing steps of FIG. 19 may be performed to form a bonded assembly. Each mating pair of a first bonding pad 978 and a second bonding pad (778, 718) is bonded to each other. In one embodiment, the first pad base portions 978 include copper at an atomic percentage greater than 95%, and are bonded directly to a respective one of the second metal alloy-forming material portions 718.

FIGS. 23A-23D are sequential vertical cross-sectional views of a sixth configuration of a first bonding pad for the fifth exemplary structure according to an embodiment of the present disclosure.

Figure 23B:
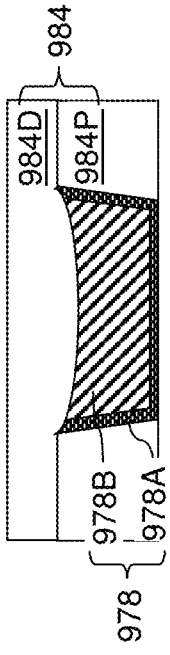
FIGS. 23A-23D are sequential vertical cross-sectional views of a sixth configuration of a first bonding pad for the fifth exemplary structure according to an embodiment of the present disclosure.
Figure 23D:
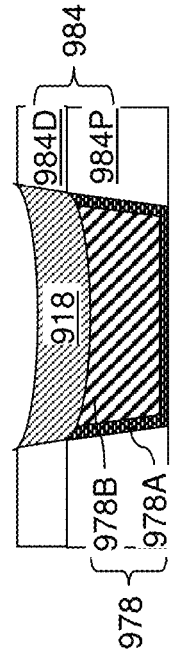
Figure 23A:
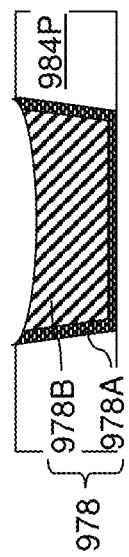

Referring to FIG. 23A, the sixth configuration of a first bonding pad for the fifth exemplary structure can be derived from the structure employed in FIG. 16A by employing a chemical mechanical planarization (i.e., chemical mechanical polishing) process that induces dishing of the first pad base portions 978. In this embodiment, the first pad-level dielectric layer 984 may consist of a first distal pad-level dielectric layer 984P.

Referring to FIG. 23B, the processing steps of FIG. 16B can be performed to form a first distal pad-level dielectric layer 984D over the first proximal pad-level dielectric layer 984P.

Figure 23C:
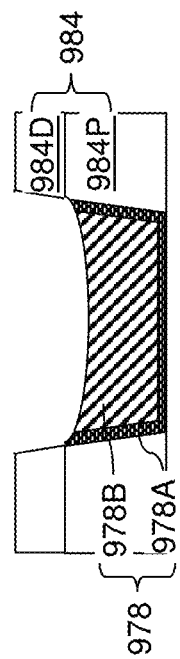

Referring to FIG. 23C, the processing steps of FIG. 16C can be performed to form pad cavities in the first proximal pad-level dielectric layer 984P over each of the first pad base portions 978.

Referring to FIG. 23D, the processing steps of FIG. 16D can be performed to form first metal alloy-forming material portions 918. The first metal alloy-forming material portions 918 can be formed with convex bottom surfaces and concave top surfaces. Subsequently, the processing steps of FIGS. 18 and 19 can be performed to form a bonded assembly.

Figure 24A:
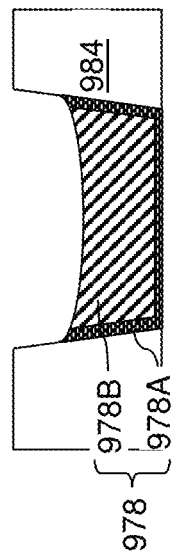
FIGS. 24A-24C are sequential vertical cross-sectional views of an alternative to the sixth configuration of a first bonding pad for the fifth exemplary structure according to an embodiment of the present disclosure.
Figure 24B:
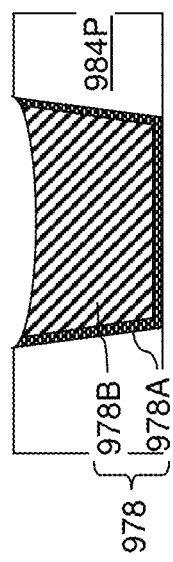
Figure 24C:
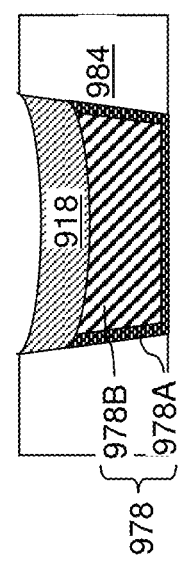

FIGS. 24A-24C are sequential vertical cross-sectional views of an alternative of the sixth configuration of a first bonding pad for the fifth exemplary structure according to an embodiment of the present disclosure in which the first distal pad-level dielectric layer 984D is omitted.

Referring to FIG. 24A, the alternative of the sixth configuration of a first bonding pad for the fifth exemplary structure can be derived from the structure employed in FIG. 17A by employing a chemical mechanical planarization process that induces dishing of the first pad base portions 978. In this embodiment, the first pad-level dielectric layer 984 may consist of a first distal pad-level dielectric layer 984P.

Referring to FIG. 24B, the processing steps of FIG. 17B can be performed to form pad cavities in the first pad-level dielectric layer 984 over each of the first pad base portions 978.

Referring to FIG. 24C, the processing steps of FIG. 17C can be performed to form first metal alloy-forming material portions 918. The first metal alloy-forming material portions 918 can be formed with convex bottom surfaces and concave top surfaces. Subsequently, the processing steps of FIGS. 18 and 19 can be performed to form a bonded assembly.

Figure 25B:
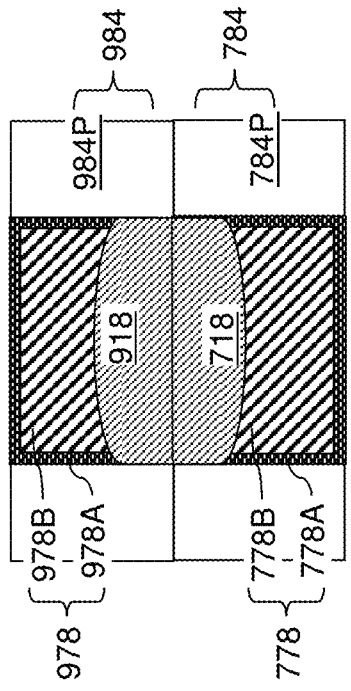
FIGS. 25A and 25B are sequential vertical cross-sectional views of the sixth configuration of bonding pads in the fifth exemplary structure during a bonding process according to an embodiment of the present disclosure.
Figure 25A:
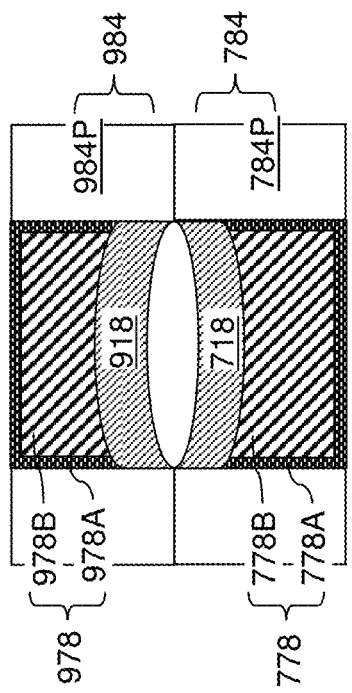

FIGS. 25A and 25B are sequential vertical cross-sectional views of the sixth configuration of bonding pads in the fifth exemplary structure during a bonding process according to an embodiment of the present disclosure.

Referring to FIG. 25A, each of the first semiconductor die 900 and the second semiconductor die 700 can have the configuration illustrated in FIG. 23D or in FIG. 24C. The processing steps of FIG. 18 can be performed to align the first semiconductor die 900 and the second semiconductor die.

Referring to FIG. 25B, the processing steps of FIG. 19 can be performed to form a bonded assembly of the first semiconductor die 900. Each mating pair of a first bonding pad (978, 918) and a second bonding pad (778, 718) is bonded, and void between the first bonding pad (978, 918) and the second bonding pad (778, 718) may be eliminated during, and after, the bonding process.

Figure 26B:
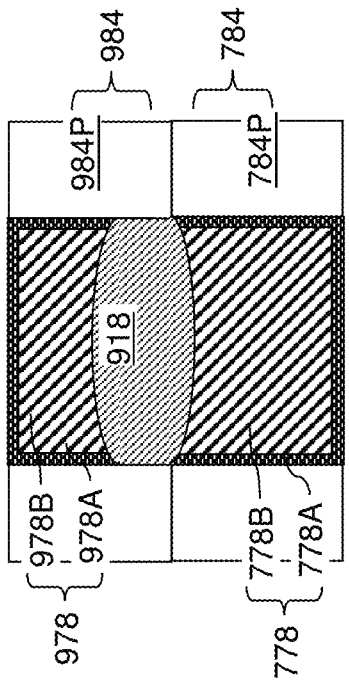
FIGS. 26A and 26B are sequential vertical cross-sectional views of a seventh configuration of bonding pads in the fifth exemplary structure during a bonding process according to an embodiment of the present disclosure.
Figure 26A:
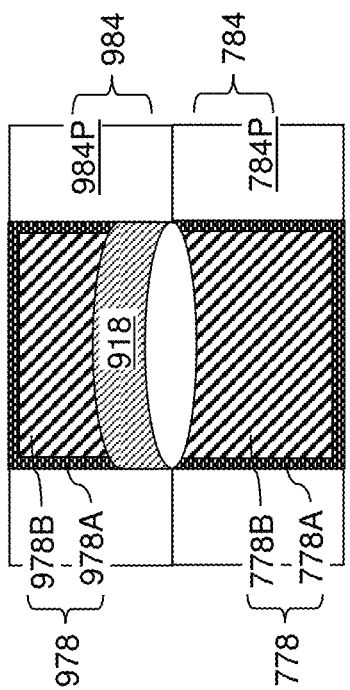

FIGS. 26A and 26B are sequential vertical cross-sectional views of a seventh configuration of bonding pads in the fifth exemplary structure during a bonding process according to an embodiment of the present disclosure.

Referring to FIG. 26A, the seventh configuration of the bonding pads can be derived from the configuration illustrated in FIG. 25A by omitting the processing steps for recessing the second pad base portions 778 and by omitting the processing steps for forming the second metal alloy-forming material portions 718. Each second bonding pad includes a second pad base portion 778.

Referring to FIG. 26B, the processing steps of FIG. 19 may be performed to form a bonded assembly. Each mating pair of a first bonding pad (978, 918) and a second bonding pad 778 is bonded to each other. In one embodiment, the second pad base portions 778 include copper at an atomic percentage greater than 95%, and are bonded directly to a respective one of the first metal alloy-forming material portions 918.

Figure 27B:
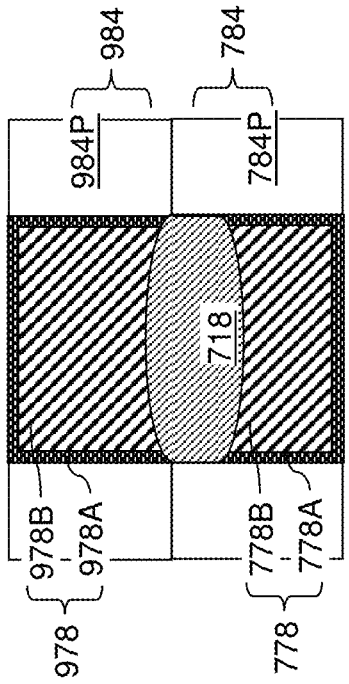
FIGS. 27A and 27B are sequential vertical cross-sectional views of an eighth configuration of bonding pads in the fifth exemplary structure during a bonding process according to an embodiment of the present disclosure.
Figure 27A:
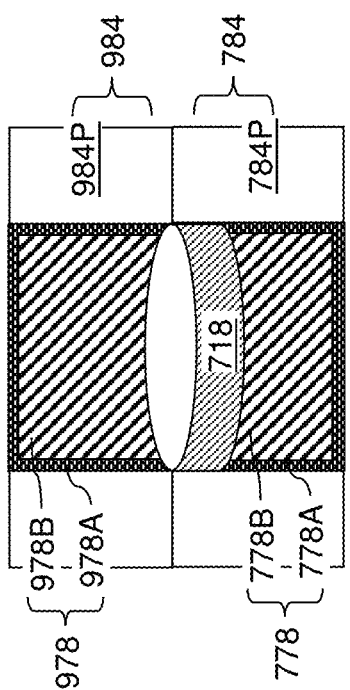

FIGS. 27A and 27B are sequential vertical cross-sectional views of an eighth configuration of bonding pads in the fifth exemplary structure during a bonding process according to an embodiment of the present disclosure.

Referring to FIG. 27A, the eighth configuration of the bonding pads can be derived from the configuration illustrated in FIG. 25A by omitting the processing steps for recessing the first pad base portions 978 and by omitting the processing steps for forming the first metal alloy-forming material portions 918. Each first bonding pad includes a first pad base portion 978.

Referring to FIG. 27B, the processing steps of FIG. 19 may be performed to form a bonded assembly. Each mating pair of a first bonding pad 978 and a second bonding pad (778, 718) is bonded to each other. In one embodiment, the first pad base portions 978 include copper at an atomic percentage greater than 95%, and are bonded directly to a respective one of the second metal alloy-forming material portions 718.

Figure 28B:
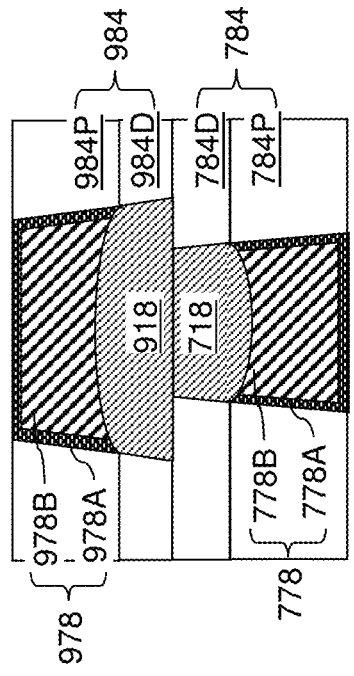
FIGS. 28A and 28B are sequential vertical cross-sectional views of a ninth configuration of bonding pads in the fifth exemplary structure during a bonding process according to an embodiment of the present disclosure.
Figure 28A:
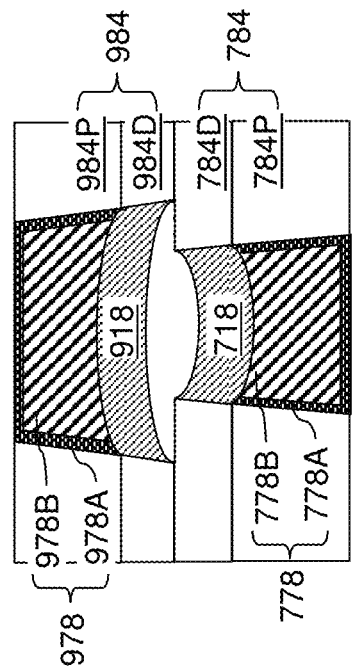

FIGS. 28A and 28B are sequential vertical cross-sectional views of a ninth configuration of bonding pads in the fifth exemplary structure during a bonding process according to an embodiment of the present disclosure.

Referring to FIG. 28A, the ninth configuration of the bonding pads can be derived from the structure illustrated in FIG. 20A by forming concave top surfaces during the planarization processes that form the first pad base portions 978, and by forming concave top surfaces during the planarization process that forms the second pad base portions 778. In one embodiment, each of the first metal alloy-forming material portions 918 can be formed with a convex surface and with a concave surface. Each of the second metal alloy-forming material portions 718 can be formed with a convex surface and with a concave surface.

Referring to FIG. 28B, the processing steps of FIG. 19 may be performed to form a bonded assembly. Each mating pair of a first bonding pad (978, 918) and a second bonding pad (778, 718) is bonded to each other.

Figure 29B:
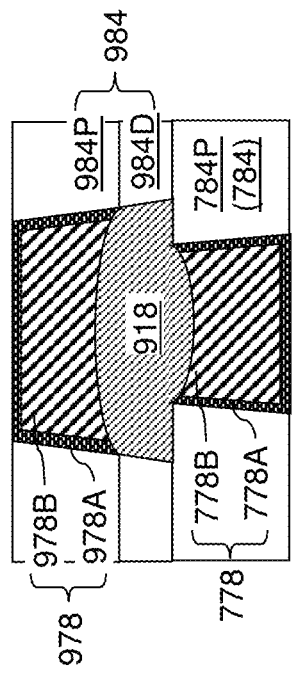
FIGS. 29A and 29B are sequential vertical cross-sectional views of a tenth configuration of bonding pads in the fifth exemplary structure during a bonding process according to an embodiment of the present disclosure.
Figure 29A:
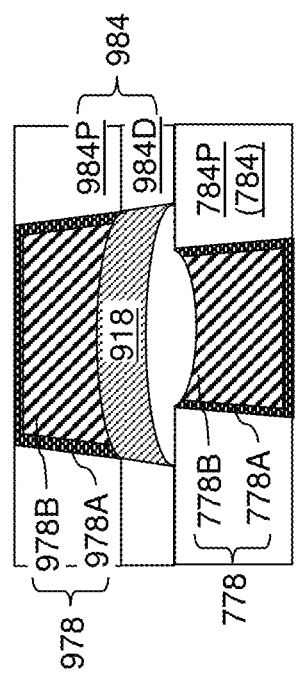

FIGS. 29A and 29B are sequential vertical cross-sectional views of a tenth configuration of bonding pads in the fifth exemplary structure during a bonding process according to an embodiment of the present disclosure.

Referring to FIG. 29A, the tenth configuration of the bonding pads can be derived from the configuration illustrated in FIG. 28A by omitting the processing steps for recessing the second pad base portions 778 and by omitting the processing steps for forming the second metal alloy-forming material portions 718. Each second bonding pad includes a second pad base portion 778.

Referring to FIG. 29B, the processing steps of FIG. 19 may be performed to form a bonded assembly. Each mating pair of a first bonding pad (978, 918) and a second bonding pad 778 is bonded to each other. In one embodiment, the second pad base portions 778 include copper at an atomic percentage greater than 95%, and are bonded directly to a respective one of the first metal alloy-forming material portions 918.

Figure 30B:
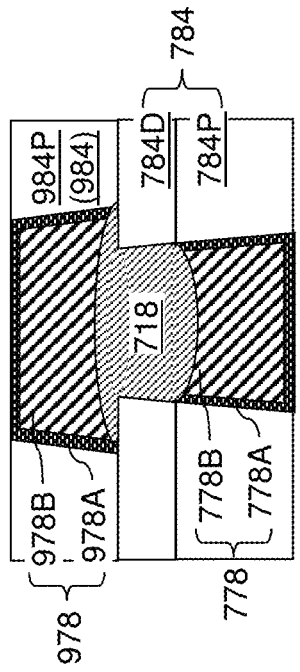
FIGS. 30A and 30B are sequential vertical cross-sectional views of an eleventh configuration of bonding pads in the fifth exemplary structure during a bonding process according to an embodiment of the present disclosure.
Figure 30A:
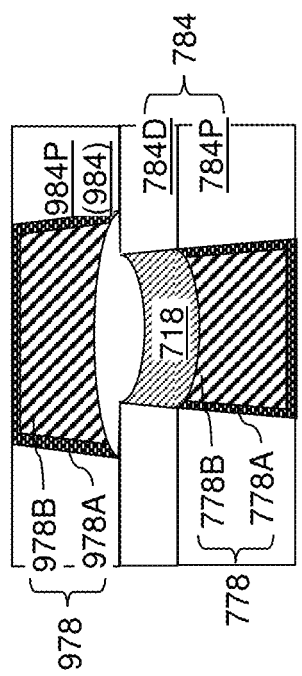

FIGS. 30A and 30B are sequential vertical cross-sectional views of an eleventh configuration of bonding pads in the fifth exemplary structure during a bonding process according to an embodiment of the present disclosure.

Referring to FIG. 30A, the eleventh configuration of the bonding pads can be derived from the configuration illustrated in FIG. 28A by omitting the processing steps for recessing the first pad base portions 978 and by omitting the processing steps for forming the first metal alloy-forming material portions 918. Each first bonding pad includes a first pad base portion 978.

Referring to FIG. 30B, the processing steps of FIG. 19 may be performed to form a bonded assembly. Each mating pair of a first bonding pad 978 and a second bonding pad (778, 718) is bonded to each other. In one embodiment, the first pad base portions 978 include copper at an atomic percentage greater than 95%, and are bonded directly to a respective one of the second metal alloy-forming material portions 718.

Figure 31A:
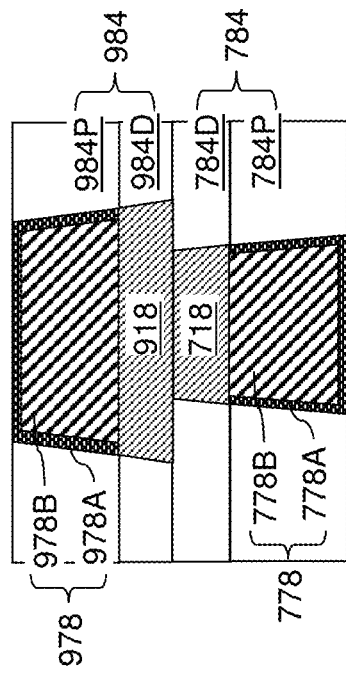
FIGS. 31A and 31B are sequential vertical cross-sectional views of a twelfth configuration of bonding pads in the fifth exemplary structure during a bonding process according to an embodiment of the present disclosure.
Figure 31B:
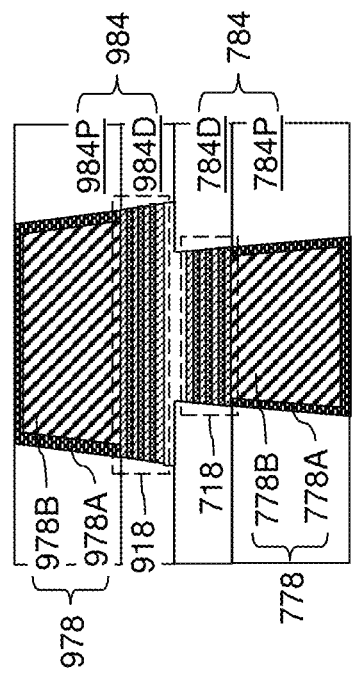

FIGS. 31A and 31B are sequential vertical cross-sectional views of a twelfth configuration of bonding pads in the fifth exemplary structure during a bonding process according to an embodiment of the present disclosure.

Referring to FIG. 31A, the twelfth configuration of the bonding pads can be derived from any of the configurations described above by employing a layer stack of at least two material layers to form first metal alloy-forming material portions 918 and/or to form second metal alloy-forming material portions 718. In one embodiment, one or both of the first metal alloy-forming material portions 918 and/or the second metal alloy-forming material portions 718 may include at least one metal layer and at least one semiconductor material layer that can interdiffuse to form a metal-semiconductor alloy material such as a metal silicide, a metal germanide, or a metal germane-silicide. In another embodiment, one or both of the first metal alloy-forming material portions 918 and/or the second metal alloy-forming material portions 718 may include at least one first transition metal layer and at least one second transition metal layer that can interdiffuse to form an intermetallic alloy material.

Referring to FIG. 31B, the processing steps of FIG. 19 may be performed to form a bonded assembly. Each mating pair of a first bonding pad (978, 918) and a second bonding pad (778, 718) is bonded to each other. In one embodiment, the first and second pad base portions 978 and 778 include copper at an atomic percentage greater than 95%, and the first metal alloy-forming material portions 918 are bonded directly to a respective one of the second metal alloy-forming material portions 718. In one embodiment, each of the first metal alloy-forming material portions 918 and/or the second metal alloy-forming material portions 718 includes a metal-semiconductor alloy material or an intermetallic alloy material.

The exemplary structure of FIG. 19 includes a bonded assembly, which includes a first semiconductor die 900 that comprises first semiconductor devices 910, and a first pad-level dielectric layer 984 and embedding first bonding pads {978 and (918 or 988)}; and a second semiconductor die 700 that comprises second semiconductor devices 710, and a second pad-level dielectric layer 784 embedding second bonding pads {778 or (778, 718)} that includes a respective second pad base portion 778. Each of the second bonding pads is bonded to a respective one of the first bonding pads. Each of the first bonding pads comprises a respective first pad base portion 978 and a respective first material portion (918 or 988) comprising a different material than the first pad base portion 978, such as a respective first metal alloy material portion 918 having a higher coefficient of thermal expansion (CTE) than the respective first pad base portion 978.

In one embodiment, the first metal alloy material portion 918 comprises copper silicide, copper germanide, or copper germanide-silicide. In another embodiment, the first metal alloy material portion 918 comprises an intermetallic copper based alloy material that includes greater than 50 atomic percent copper and less than 50 atomic percent of another metal selected from at least one of aluminum, zinc, iron or tin.

In one embodiment, the second pad base portions 778 include copper at an atomic percentage greater than 95%, and each of the second bonding pads further comprises a second metal alloy material portion 718 having a higher coefficient of thermal expansion (CTE) than the second pad base portions 778.

In one embodiment, the first metal alloy material portions 918 comprise a first metal-semiconductor alloy material; the second metal alloy material portions 718 comprise a second metal-semiconductor alloy material; and the first metal alloy material portions 918 are bonded to a respective one of the second metal alloy material portions 718.

In one embodiment, the first metal alloy material portions 918 comprise a first intermetallic alloy material; the second metal alloy material portions 718 comprise a second intermetallic alloy material; and the first metal alloy-forming material portions 918 are bonded to a respective one of the second metal alloy-forming material portions 718.

In one embodiment, the first pad-level dielectric layer 984 comprises a layer stack that includes: a proximal pad-level dielectric layer 984P laterally surrounding the first pad base portions 978; and a distal pad-level dielectric layer 984D laterally surrounding the first metal alloy material portions 918. In one embodiment, each of the first metal alloy material portions 918 comprises a convex surface that contacts a concave surface of a respective one of the first pad base portions 978. In one embodiment, each of the second bonding pads (778, 718) comprises a respective second metal alloy material portion 718 having a higher coefficient of thermal expansion (CTE) than the second pad base portions 778. In one embodiment, within each of the second bonding pads (778, 718), a concave surface of the respective second pad base portion 778 contacts a convex surface of the respective second metal alloy material portion 718. In one embodiment, each of the first metal alloy material portions 918 comprises an additional convex surface that contacts a concave surface of a respective one of the second bonding pads (778, 718).

The various configurations of the fifth exemplary structure provide a strong metal-to-metal bond with fewer or no voids than prior art bonds, while also avoiding or reducing voids or gaps between the opposing pad-level dielectric layers. By using a copper alloy with a higher coefficient of thermal expansion and/or a higher coefficient of volume expansion than pure copper at the bonding interface, the metal voids at the bonding interface are avoided or reduced, and bond strength is increased. Furthermore, the formation of protrusions in bonding pads is not required, which reduces or eliminates voids or gaps between the opposing pad-level dielectric layers.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly comprising:
   a first semiconductor die that comprises first semiconductor devices, and a first pad-level dielectric layer embedding first bonding pads; and
   a second semiconductor die that comprises second semiconductor devices, and a second pad-level dielectric layer embedding second bonding pads that includes a respective second pad base portion,
   wherein each of the first bonding pads comprises a respective first pad base portion and a respective first material portion comprising a different material than the first pad base portion, and wherein each of the second bonding pads is bonded to a respective one of the first bonding pads.

2. The bonded assembly of claim 1, wherein:
   each first pad base portion includes copper at an atomic percentage greater than 95%; and
   the first material portion comprises a first metal alloy material portion having a higher coefficient of thermal expansion (CTE) than the respective first pad base portion.

3. The bonded assembly of claim 2, wherein the first metal alloy material portion comprises copper silicide, copper germanide, or copper germanide-silicide.

4. The bonded assembly of claim 2, wherein the first metal alloy material portion comprises an intermetallic copper based alloy material that includes greater than 50 atomic percent copper and less than 50 atomic percent of another metal selected from at least one of aluminum, zinc, iron or tin.

5. The bonded assembly of claim 2, wherein:
   the second pad base portions include copper at an atomic percentage greater than 95%; and
   each of the second bonding pads further comprises a second metal alloy material portion having a higher coefficient of thermal expansion (CTE) than the second pad base portions.

6. The bonded assembly of claim 5, wherein:
   the first metal alloy material portions comprise a first metal-semiconductor alloy material;

the second metal alloy material portions comprise a second metal-semiconductor alloy material; and the first metal alloy material portions are bonded to a respective one of the second metal alloy material portions.

7. The bonded assembly of claim 5, wherein:
the first metal alloy material portions comprise a first intermetallic alloy material;
the second metal alloy material portions comprise a second intermetallic alloy material; and
the first metal alloy material portions are bonded to a respective one of the second metal alloy material portions.

8. The bonded assembly of claim 2, wherein the second pad base portions include copper at an atomic percentage greater than 95%, and are bonded directly to a respective one of the first metal alloy material portions.

9. The bonded assembly of claim 2, wherein the first pad-level dielectric layer comprises a layer stack that includes:
a proximal pad-level dielectric layer laterally surrounding the first pad base portions; and
a distal pad-level dielectric layer laterally surrounding the first metal alloy material portions.

10. The bonded assembly of claim 2, wherein each of the first metal alloy material portions comprises a convex surface that contacts a concave surface of a respective one of the first pad base portions.

11. The bonded assembly of claim 10, wherein each of the second bonding pads further comprises a respective second metal alloy material portion having a higher coefficient of thermal expansion (CTE) than the second pad base portion.

12. The bonded assembly of claim 10, wherein within each of the second bonding pads, a concave surface of the respective second pad base portion contacts a convex surface of the respective second metal alloy material portion.

13. The bonded assembly of claim 10, wherein each of the first metal alloy material portions comprises an additional convex surface that contacts a concave surface of a respective one of the second bonding pads.

14. A method of forming a bonded assembly, comprising:
providing a first semiconductor die that comprises first semiconductor devices located over a first substrate, and a first pad-level dielectric layer and embedding first bonding pads;
providing a second semiconductor die that comprises second semiconductor devices located over a second substrate, and a second pad-level dielectric layer embedding second bonding pads that include respective second pad base portions; and
forming a bonded assembly by bonding the second bonding pads to the respective first bonding pads, wherein each of the first bonding pads comprises a respective first pad base portion and a respective first metal alloy material portion having a higher coefficient of thermal expansion (CTE) than the respective first pad base portion.

15. The method of claim 14, wherein:
the first pad base portion includes copper at an atomic percentage greater than 95%; and
the first metal alloy material portions comprise copper silicide, copper germanide, or copper germanide-silicide.

16. The method of claim 15, further comprising:
depositing a semiconductor layer comprising a silicon layer, a germanium layer or a silicon-germanium layer on the first pad base portions; and
annealing the first semiconductor die and the second semiconductor die to react the semiconductor layer with the first pad base portions to form the first metal alloy material portions and to bond the second bonding pads to the respective first bonding pads.

17. The method of claim 14, wherein the first metal alloy material portions comprise an intermetallic copper-based alloy material that includes greater than 50 atomic percent copper and less than 50 atomic percent of another metal selected from at least one of aluminum, zinc, iron or tin.

18. The method of claim 14, wherein:
the first pad base portions include copper at an atomic percentage greater than 95%; and
the first metal alloy material portions comprise a first metal-semiconductor alloy material or a first intermetallic alloy material.

19. The method of claim 18, wherein:
the second pad base portions include copper at an atomic percentage greater than 95%; and
the second metal alloy material portions comprise a second metal-semiconductor alloy material or a second intermetallic alloy material that has a higher coefficient of thermal expansion (CTE) than the second pad base portions.

20. The method of claim 14, further comprising:
forming a proximal pad-level dielectric layer over the first substrate;
forming the first pad base portions in the proximal pad-level dielectric layer; and
forming the first metal alloy material portions on a respective one of the first pad base portions.

* * * * *